United States Patent
Mizumura et al.

[11] Patent Number: 5,825,035
[45] Date of Patent: Oct. 20, 1998

[54] PROCESSING METHOD AND APPARATUS USING FOCUSED ION BEAM GENERATING MEANS

[75] Inventors: Michinobu Mizumura; Yuuichi Hamamura; Junzou Azuma, all of Yokohama; Akira Shimase; Takashi Kamimura, both of Yokosuka; Fumikazu Itoh, Fujisawa; Kaoru Umemura, Musashino; Yoshimi Kawanami; Yuuichi Madokoro, both of Kokubunji, all of Japan

[73] Assignee: Hitachi, Ltd., Tokyo, Japan

[21] Appl. No.: 745,657

[22] Filed: Nov. 8, 1996

Related U.S. Application Data

[63] Continuation-in-part of Ser. No. 595,993, Feb. 9, 1996, Pat. No. 5,583,344, which is a continuation of Ser. No. 207,860, Mar. 9, 1994, Pat. No. 5,504,340.

[30] Foreign Application Priority Data

| Mar. 10, 1993 | [JP] | Japan | 5-048949 |
| Jun. 2, 1993 | [JP] | Japan | 5-131689 |
| Dec. 18, 1993 | [JP] | Japan | 5-334602 |

[51] Int. Cl.$^6$ .................................................. H01J 37/317
[52] U.S. Cl. .............................. 250/423 R; 250/492.21; 315/111.41; 315/111.81
[58] Field of Search ................................ 250/423 R, 492.21, 250/492.23, 492.3, 398; 315/111.21, 111.31, 111.41, 111.71, 111.81

[56] References Cited

U.S. PATENT DOCUMENTS

| 3,955,091 | 5/1976 | Robinson et al. | 250/423 R |
| 5,017,835 | 5/1991 | Oechsner | 250/423 R |
| 5,198,718 | 3/1993 | Davis et al. | 250/423 R |
| 5,616,921 | 4/1997 | Talbot et al. | 250/492.21 |

*Primary Examiner*—Kiet T. Nguyen
*Attorney, Agent, or Firm*—Antonelli, Terry, Stout & Kraus, LLP

[57] ABSTRACT

A processing method using a plasma ion source for generating a focused ion beam, characterized by covering, with an insulator, an inner wall of a plasma holding vessel excluding a reference electrode for applying a voltage to a plasma and an ion extraction electrode for extracting ions from the plasma, and employing means of continuously controlling the absolute value of an ion beam current in a range of from 1 to 10 $\mu$A by changing the absolute value of an ion extraction voltage applied between the reference electrode and the ion extraction electrode in a range of from 0 to 100 V; and an apparatus for carrying out the processing method. This is advantageous in stabilizing the ion beam current and in preventing the ion beam from being made dim even when the current value of the ion beam is changed.

16 Claims, 38 Drawing Sheets

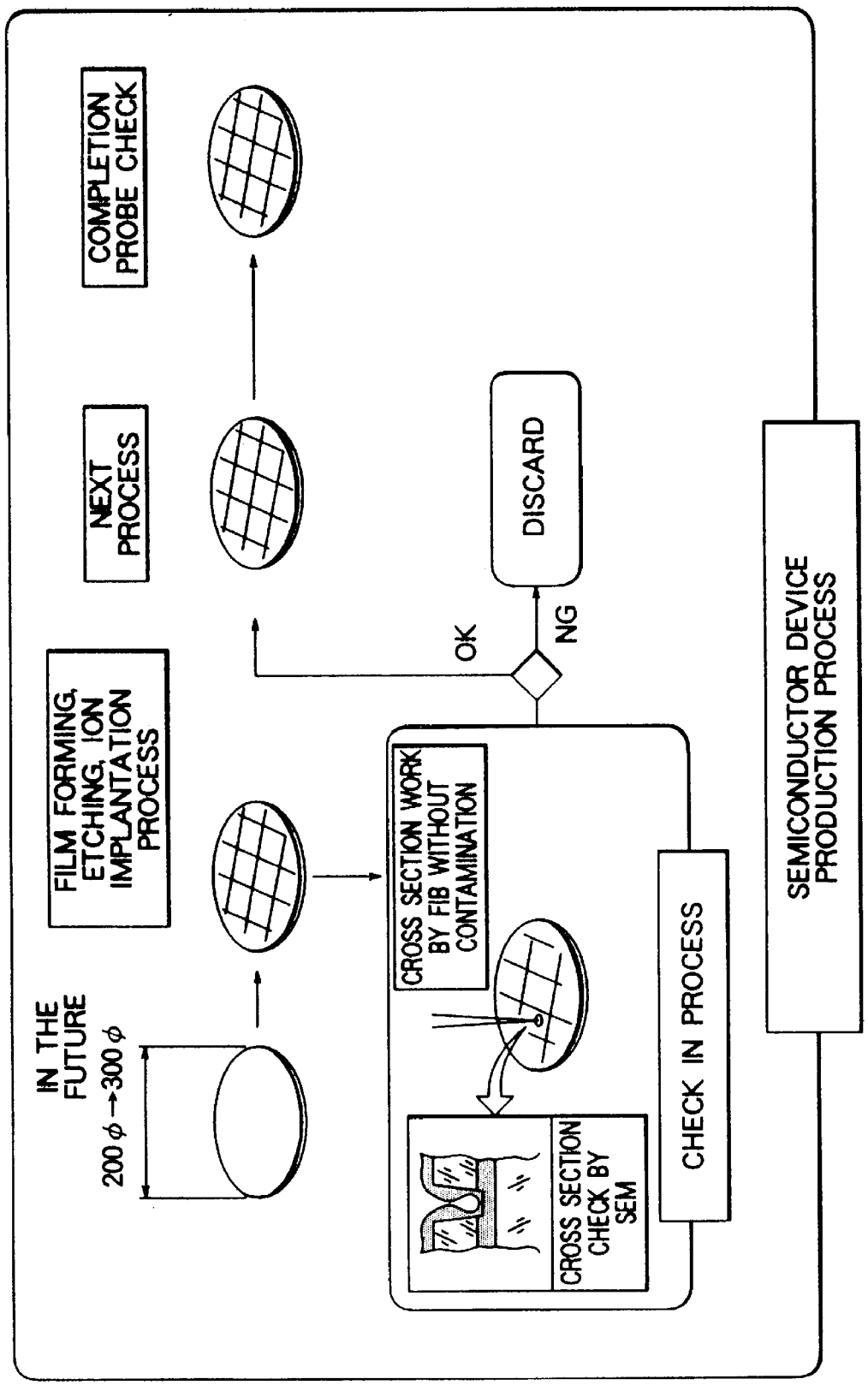

d1 < d2 < d3, d11 < d22 < d33

MOVING LOCUS OF BEAM

FIG. 48
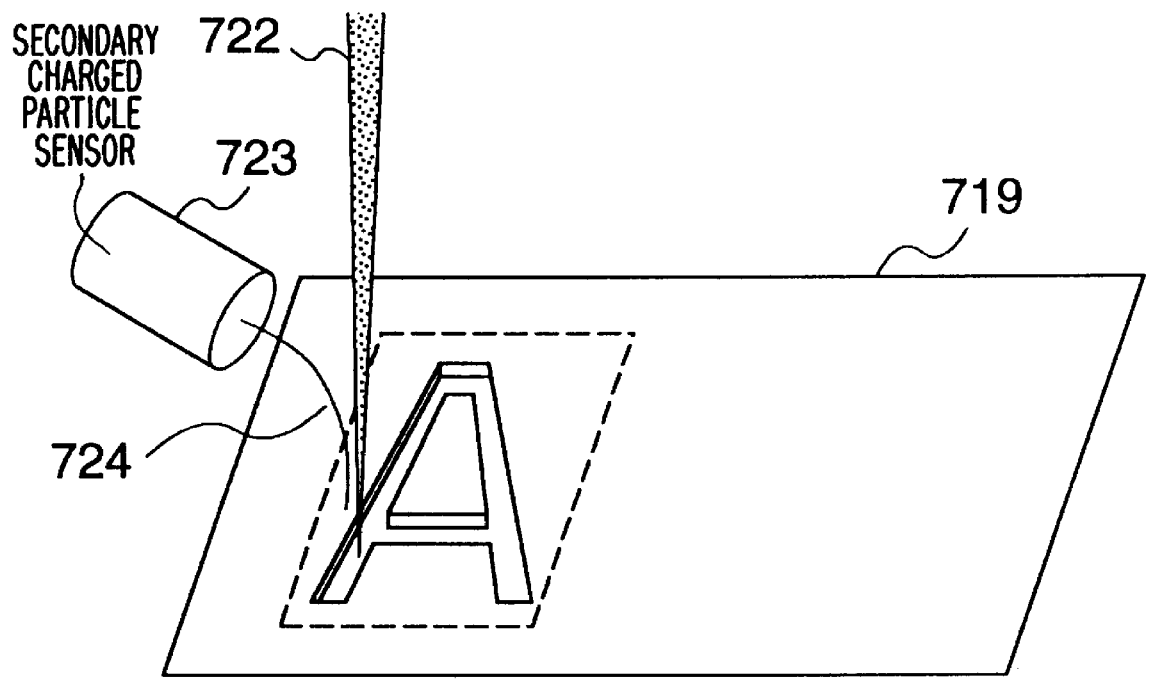
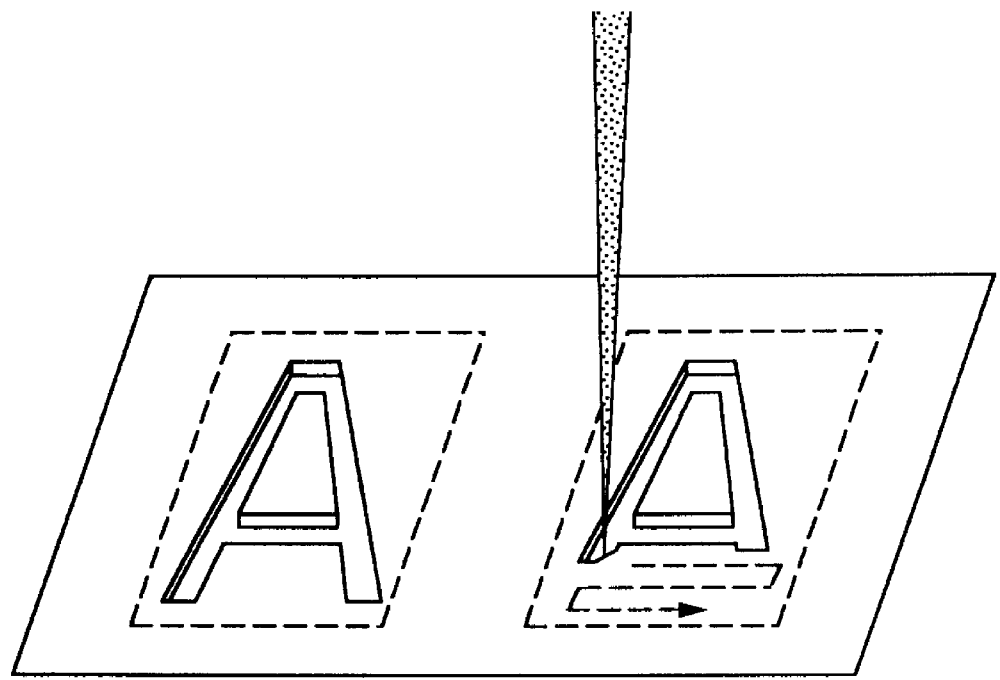

PROCESSING METHOD AND APPARATUS USING FOCUSED ION BEAM GENERATING MEANS

CROSS-REFERENCE TO RELATED APPLICATION

This application is a continuation-in-part of U.S. application Ser. No. 08/595,993, filed Feb. 9, 1996, now U.S. Pat. No. 5,504,340, which was a continuation application of an application Ser. No. 08/207,860, filed Mar. 9, 1994, now patented under U.S. Pat. No. 5,504,340, the complete disclosures of which are incorporated herein by reference.

BACKGROUND OF THE INVENTION

The present invention relates to an apparatus for irradiating a focused ion beam (FIB) onto a device such as a semiconductor large scale integration (LSI) element and thereby conducting a fine machining work thereof and/or a fine film fabrication thereon, and in particular, to a processing apparatus using ion beam generating means and a processing method of the same in which when the focused ion beam is irradiated from an ion source onto a sample such as a silicon wafer or a silicon device, the sample is not contaminated with substances emitted from the ion source.

The focused ion beam (FIB) has been adopted in various apparatuses for various purposes such as a maskless ion implantation, an ion beam lithography, a mask modification, a wiring modification in the semiconductor manufacturing field, a secondary ion mass spectrometry (SIMS) in the analysis field; and operations to prepare samples to be observed, for example, creation of observation cross sections of samples for the scanning electron microscope (SEM) and production of thin-film pieces for the transmission electron microscope (TEM). In such apparatuses utilizing focused ion beams, there has been broadly employed a liquid metal ion source. Specifically, in the apparatuses to achieve the machining work and modification above, gallium has been usually put to practices as the ion element. Furthermore, in an analyzer which analyzes sample elements by milling, there have been commonly used noble gas ions and/or oxygen ions produced from an ion source of the duoplasmatron type.

On the other hand, to increase the production yield, it is quite important to carry out the following process control operations in the semiconductor manufacturing processes. Namely, in each of the processes such as ion implantation, lithography, and etching, a check is made to determine whether or not initial specifications thereof are fully satisfied and an investigation is conducted to decide, for example, whether or not a desired form to be actually obtained is deformed, for example, due to unexpected dirts and/or dusts. Moreover, in a case where such a defect exists, a correction process to remove the defect is effected after the pertinent process. To keep the sample free of any contamination from outside of the production line, the control operations are essentially required to be accomplished in the production line. That is, so-called inline observation, modification, and/or analysis are necessary for this purpose. In the present stage of art, a surface observation is achieved in an actual fabrication line by an optical microscope or a scanning electron microscope.

The beam size from the liquid metal ion source can be reduced to an order of submicron. The source is practically used in a focused ion beam a machining apparatus to mill a semiconductor LSI chip, a mask, etc. However, metal ions irradiated onto a sample surface to be milled by physical sputtering act, although there exist exceptions of some metal elements, as impurities in general, in the subsequent semiconductor production processes and possibly exert adverse influences on the semiconductor devices. Consequently, it is impossible at present to positively use such liquid metal ion sources in the semiconductor manufacturing line.

In this situation, to clarify the problems to be solved by the present invention, description will be given respectively of □ problems in FIB application, □ problems of ion sources to produce focused ion beams, □ problems related to ion sources.

□ Problems in FIB Application

In contrast to the optical and scanning electron microscopes currently used in the semiconductor device production, there are not presently employed in the mass-production line such apparatuses utilizing a focused ion beams (FIB) as an FIB cross section machining apparatus to observe local cross sections of a device or an element, an FIB correcting and machining facility to modify process defects and logical defects of the device, and a secondary ion beam mass spectrometry (SIMS) apparatus adopting the FIB to conduct composition analyses of particular positions of the element. Namely, these apparatuses are used for a sample for a test or check taken out from the production line or a sample completely undergone the production processes.

That is, these apparatuses are used on the condition that the sample processed thereby is not returned to the production line again. This is because the conventional apparatuses using the focused ion beam contaminates the sample and/or the sample production line.

For example, when a Ga-FIB is used in the machining of cross sections of a silicon wafer or device and the SIMS analysis therefor, gallium atoms are accumulated on the silicon layer such that the piled gallium elements function as a p-type dopant (acceptor) for silicon elements. This leads to an electric deterioration of the product in a long period of time. Moreover, due to quite a low vapor pressure of gallium atoms, there appears a gallium deposition around the area of the wafer or device processed by the Ga-FIB. This exceeds a simple electric contamination, namely, a conductive layer is formed and hence there arises a significant problem of, for example, a short circuit between wirings in the device.

In addition, even when a local fine machining work is done by an Si-FIB produced from a liquid metal ion source (LMIS) adopting an Au-Si alloy, gold (Au) particles evaporated from the LMIS causes a heavy-metal contamination on the sample such as an Si wafer or device, which leads to an adverse effect in the device operation.

On the other hand, in the case of the duoplasmatron type, the plasma of a noble gas is produced so as to extract ions from the plasma into a focused ion beam. Consequently, ions irradiated onto a machining surface become gas atoms or molecules, after giving their momentum to the surface, and hence do not act as impurities any adverse influence directly in the semiconductor fabrication processes. However, due to the arc discharge to generate the plasma, a strong electric field applied onto the filament cathode and a high temperature thereof cause impurity metal ions to be mixed into the plasma. This leads to an unfavorable effect onto the semiconductor fabrication processes. In consequence, like in the case of the liquid metal ion source, the ion source of the duoplasmatron type cannot be used in the semiconductor fabrication line.

FIG. 2 shows an example of a process check of a semiconductor device employing the conventional FIB milling apparatus. In the semiconductor manufacturing processes, transistor elements and circuits are fabricated on the silicon wafer through such processes as film deposition, etching, and ion implantation. In a difficult process, for example, forming a film on a surface of deep holes or etching fine grooves, a check is necessary to confirm whether or not the process has been appropriately carried out. In this case, a wafer is obtained from the previous process line. At a position where a cross section thereof is desired to be observed for a check, a hole is milled by a FIB machine using Ga ions, thereby observing a side wall thereof by an SEM.

However, due to the Ga-FIB milling, irradiated gallium remains on the wafer and adversely influence the device as described above. In addition, when the wafer is returned to the production line, contamination is extended to various other manufacturing apparatuses of the line. There consequently exists a possibility of further contamination in wafers fabricated by such contaminated apparatuses. To avoid this problem, as shown in FIG. 2, the wafer milled by FIB for check is not returned to the production line. Namely, the wafer is discarded. However, there are about 100 to several hundreds of LSI chips on a wafer having a diameter of 200 millimeters (mm), and much value has been added on each chip at this check point. Discard of the wafer thus having such an added value is quite undesirable for economic reasons. Moreover, the wafer diameter will be possibly increased to about 300 mm in the future; consequently, this problem cannot be any longer ignorable.

Moreover, when the process check using the FIB is conducted in an off-line stage as is the case in the conventional system, a wafer is removed from the line for each FIB milling or analysis process. Since several hundred chips are manufactured in a wafer, when the wafer is resultantly discarded, the other chips not undergone the work or analysis are wasted. This is also an economic problem to be solved.

FIG. 3 shows a graph of the production yield of semiconductor devices. In the processes of manufacturing semiconductor devices, probability of occurrences of fatal defects is presented by a fatal defect density per unit area a (number of defects per cm$^2$). Experimentally, the defect density $\alpha$ decreases as the stage progresses from test production to mass production, to a value ranging from one defect to several defects. However, the value will not be reduced to 0. The number of fatal defects in a layer increases in proportion to the chip area. In other words, the yield $\beta$ of acceptable products with respect to a certain layer decreases as the chip area is increased as shown in FIG. 3. For example, when the chip area is 14 mm by 14 mm=1.96 cm$^2$, the yield $\beta$ is attained as $(1-1.96\alpha) \times 100\%$.

On the other hand, a semiconductor device consists of many layers. FIG. 4 shows a relationship of a chip yield and number of wiring layers on assumption that the yield $\beta$ is fixed for each layer. Only when each of n wiring layers is satisfactorily fabricated, an acceptable chip is obtained. The chip yield, therefore, is represented as $\beta^n$. According to technological trends of semiconductor devices, the chip area is increasing; moreover, especially in a logic LSI chip, the total number of wiring layers is now in transition from four to six. Consequently, assuming that the fatal defect density $\alpha$ is fixed, the chip yield is tend to decrease. Accordingly, to obtain a favorable chip, it will be necessary in the future to correct or to modify defects caused thereon through the process layer by layer. In the modification, the FIB process is favorably used. However, as described above, once the Ga-FIB processing step is accomplished for the modification of the layer, the wafer cannot be brought back to the manufacturing process line. Namely, heretofore, the modification during the processes has not been feasible.

In consideration of the background art described above, there have been desired a working method using the FIB and an apparatus implementing the method capable of working a sample such as a wafer or a device in an inline operation without contaminating the sample.

An ion beam machining method of manufacturing a semiconductor device has been described in the JP-A-2-90520 entitled "Ion Beam Working Method" (known example 1). According to this example, the semiconductor device includes, particularly, a silicon substrate and the ion species is at least one selected from a group including Si, C, Ge, Sn, and Sm elements. Particularly, according to an embodiment thereof, an Au-Si alloy (Au82Si18) is adopted to produce silicon ions. Moreover, germanium and samarium ions are obtained from alloys of such elements as Al and Au.

In this regard, the liquid metal ion source (LMIS) and the electrohydrodynamic Ion source (EHDIS) are substantially identical to each other, namely, these sources have an identical configuration.

☐ Problems of Ion Sources to Produce Focused Ion Beams

To work a silicon substrate or a silicon device by the FIB without causing any electric contamination thereon, it is obviously favorable to use Si and Ge ions because these ions do not have an energy level as impurity atoms in the forbidden energy band related to the silicon energy level. In addition, inert gas elements such as Ne, Ar, Kr, and Xe are also appropriate for the purpose.

According to quite a simplest method of producing a beam of silicon or germanium ions from an LMIS or EDHIS, an alloy containing silicon or germanium atoms is used as the ion material. The ion beam generating system is operated while lowering the melting point and the vapor pressure of the material. Only $Si^+$ and $Si^{2+}$ ions or only $Ge^+$ and $Ge^{2+}$ ions are gathered by an EXB mass spectrometer into a focused beam. The known silicon alloys include the Au-Si, Pt-Si, and Al-Si alloys; whereas, as for the known Ge alloys, there exist the Au-Ge, Fe-Ge, Pt-Ge, and Cu-Ge alloys.

As above, to emit silicon or germanium ions, it has been commonly known to employ an alloy in which silicon or germanium atoms are respectively mixed with Au, Cu. Fe, or Pt atoms. However, when such an alloy is adopted as the ion material, the silicon element to be worked is contaminated as above with the element (for example, Au, Cu, or Pt atoms) other than the silicon or germanium contained in the alloy. Namely, there cannot be achieved an examination free of contamination required for the inline examination. Particularly, it has been well known that the silicon semiconductor production line is essentially required to be free of heavy metal elements such as Au and Pt.

As described above, on the other hand, in the case of the ion source of the duoplasmatron type, the arc discharge is adopted to create a plasma, impurity metal ions are mixed into the plasma from the filament cathode due to the high electric field and high temperature applied to the cathode. This results in an adverse influence upon the semiconductor production line.

Resultantly, it is to be appreciated that in order to conduct the check with FIB free of contamination, it is necessary to use silicon or germanium as a simple substance or an elementary element and liquid noble elements for ion materials most suitable for the EHDIS. Alternatively, for this purpose, it is necessary to use noble elements from a plasma source not containing any impurities.

☐ Problems related to Ion Sources

Silicon as a simple substance has a melting point of 1407° C. and quite a high vapor pressure of $4 \times 10^{-4}$ (torr) at the melting point. Consequently, the temperature control and the thermal vaporization control are difficult for the LMIS. Accordingly, silicon has few chances to be used as the ion material of the LMIS. On the other hand, as for germanium in the form of a simple substance, the melting point is 947° C. and the vapor pressure is $1\times10^{-6}$ (torr) at the melting point. When compared with silicon, germanium possesses quite a low melting point and a low vapor pressure thereat and hence is promising as the ion material. However, when tungsten or wolfram (W) which has been broadly employed to form an emitter of the LMIS is used for an emitter of the si-LMIS or Ge-LMIS, tungsten is eroded in a short period of time since silicon and germanium are active substances. Resultantly, tungsten cannot function as the emitter.

In addition, refractory metals such as Ta, Mo, and Re are also eroded and dissolved in several hours when dipped into a solution of melted silicon or germanium. This leads to a problem of an extremely short life of the LMIS using such refractory metals. Moreover, a ceramic material of SiC is also attended with a problem that the ceramic completely sheds molten Si and Ge and hence cannot serve as an emitter.

Consequently, there have been few attempts to emit silicon or germanium ions from the LMIS using silicon or germanium as a simple substance. In a report of ion emission employing silicon or germanium in the form of a simple substance, the emission is conducted only quite a short period of time. There has not been reported any successful operation of such an ion sources in which emitted ions are focused into an Si-FIB or a Ge-FIB, thereby achieving a machining work of a sample. In consequence, to implement the Si-LMIS or Ge-LMIS, it is quite an important to determine a substance suitable for the emitter and the reservoir which is not eroded by the melted silicon or germanium and which guarantees to wet the emitter and the reservoir in a stable state for a long period of time.

In the known example 1, there have not been described any reason and any effect for which silicon or germanium as a single substance or an Si-Ge alloy is employed as an ion material to create ions. Neither a method of achieving a fine machining work on a semiconductor device by the FIB emitted from an ion source using silicon or germanium as a single substance nor the ion source configuration (related to emitter and reservoir materials) suitable to implement the method has been described.

Furthermore, to construct a focused ion beam (FIB) apparatus being free of impurities and using a plasma ion source, it is basically effective to generate ions from a plasma free of impurities. For this purpose, applications of a discharge mechanism not attended with impurities have been discussed. However, an identical electric field is used, in the conventional ion collecting mechanism, to extract and to accelerate ions. Namely, the ion extraction and acceleration cannot be independently controlled. In consequence, the electric field applied across the ion extracting electrode and the plasma becomes excessively high and hence possibly causes a breakdown therebetween. Furthermore, control of an ion sheath surface emitting ions is also attended with difficulty; consequently, the ions thus gathered have a weak directivity in a desired one direction, which makes it difficult to successfully develop a submicron diameter for the obtained beam.

The problems will be summarized as follows.
(1) The apparatus using Ga-FIB and the SIMS system of the prior art are attended with contamination and hence cannot be adopted in the production line of silicon semiconductor devices. As means for conducting the checks and modifications in the production line, there has not been any available check and modification apparatus which employs an ion source in place of the Ga-FIB and which is free of contamination of wafers and devices.
(2) There has been neither Si-LMIS nor Ge-LMIS adopting as an ion material silicon or germanium as an elementary material or an Si-Ge alloy, the LMIS having a long life and being capable of emitting ions with quite a high stability.
(3) For the apparatus generating a focused ion beam from noble gas ions, there has not been available a high-luminance source free of contaminating substances.
(4) There has not been any apparatus using as ion species such as Si, Ge, and noble gas ions which do not contaminate the silicon wafers and/or devices. In consequence, it is impossible to check and to modify the silicon wafers or devices without contamination thereof by such an apparatus.

Consequently, it has been long desired to devise a check or modification method removing the problem (1), to solve the problems associated with the ion sources to achieve the method, and to implement a check or modification apparatus employing the ion source in which an FIB removing the problem (4) is installed.

Moreover, as described above, the focused ion beam apparatus, which is being extensively used at present as tools for fine machining work and observation, often employs liquid gallium ion source. The operational principal of such a LMIS (Liquid Metal Ion Source) will be described with reference to FIG. 39. Gallium 726 in a liquid state at normal temperature is stored in a reservoir 727, and is supplied to an ion emitter 728 by capillary action. The gallium 726 thus supplied into the ion emitter 728 is drawn to an acute-angled apex of the ion emitter 728 by means of an intensive electric field applied between the ion emitter 728 and an extraction electrode 734. At this time, the gallium 726 is ionized into gallium ions 729 by means of the intensive electric field applied at the apex, and the gallium ions 729 are emitted therefrom.

FIG. 40 shows a relationship between an extraction voltage and an ion current. When the extraction voltage is increased to a threshold value, the ions 729 starts to be abruptly emitted from the acute-angled apex of the ion emitter 728. The extraction of the ions 729 continues even when the extraction voltage is reduced to be less than the threshold value, and it stops when the extraction voltage is further reduced to a specified voltage. For the control of the ion current value, the extraction voltage must be controlled in the order of kV. When the ion current is changed depending on the extraction voltage, a condition of a focus lens system for focussing the ion beam is changed, thereby causing an inconvenience that the ion beam becomes dim.

In this way, the focused ion beam apparatus using a LMIS has a difficulty in control of an ion beam current value, and consequently, when not used for machining work or observation, the ion beam is greatly blanked in its orbit so as not to bombard the surface of a workpiece. If such blanking is conducted during machining, there occurs such a problem as shown in FIG. 41, in which the moving locus of the beam 722 up to a blanking position 730 remains on the work surface.

In addition, although the gallium 726 must be stably supplied from the reservoir 727 to the apex of the ion emitter 728 for stable operation of the LMIS, the operation of the LMIS tends to become unstable due to oxidation of the gallium 726 on the surface of the emitter 728 or the adhesive bonding onto the emitter 728 of substances formed by back-sputtering from the extraction electrode 734 and the like due to gallium bombardment.

SUMMERY OF THE INVENTION

It is therefore an object of the present invention to provide a processing apparatus and a processing method including focused ion beam (FIB) generator means in which an FIB therefrom is irradiated onto a sample of an silicon wafer or device to conduct a fine machining work, a fine film growth, and an analysis on a particular position of the sample without causing any electric contamination and any contamination due to the beam irradiation.

To achieve the above object in accordance with the present invention, there is provided a processing method including a step of employing a focused ion beam generator means for generating ions which do not influence electric characteristics of a sample to be processed, focusing the generated ions into an ion beam, irradiating the ion beam onto the sample, and processing the sample without causing any disadvantageous change in the electric characteristics thereof.

In addition, to achieve the object of the present invention, there is provided a processing apparatus employing focused ion beam generator means according to the present invention. The apparatus further includes a plasma ion source for generating ions not influencing electric characteristics of a sample, ion beam forming means for extracting ions from the plasma created by the plasma ion source and forming an ion beam, ion beam focusing means for focusing the produced ion beam, irradiating means for irradiating the focused ion beam, and a sample chamber for installing therein the sample to be irradiated for the processing thereof.

Furthermore, to achieve the object of the present invention, there is provided a processing apparatus employing focused ion beam generator means according to the present invention. The apparatus further includes a plasma ion source for generating ions capable of being irradiated onto a sample without influencing electric characteristics of the sample, ion beam forming means having beam diameter changing means for extracting ions from the plasma created by the plasma ion source and forming an ion beam with a desired diameter, ion beam focusing means for focusing the produced ion beam, irradiating means for irradiating the focused ion beam, and a sample chamber for installing therein the sample to be irradiated for the processing thereof.

Furthermore, to achieve the object of the present invention, there is provided a processing apparatus employing focused ion beam generator means according to the present invention. The apparatus further includes an ion source for generating ions not influencing electric characteristics of a sample, ion beam forming means for extracting ions created by the ion source and forming an ion beam, ion beam focusing means for focusing the produced ion beam, irradiating means for irradiating the focused ion beam onto the sample, and a sample chamber for installing therein the sample to be irradiated for the processing thereof.

That is, according to the present invention, an ion source for generating ions not influencing electric characteristics of a sample to be processed includes a plasma ion source, a field ionization ion source, or an EHD ion source. Nitrogen, or one of the inert gasses such as neon krypton, argon, and xenon, or other elements which do not give any electrical influences when irradiated onto the semiconductor devices, are selected as ion species in order to avoid metal contamination influencing the electrical characteristics of the sample.

Particularly, in a case where the sample is a silicon wafer or a device, by using an EHD ion source employing silicon or germanium or a silicon-germanium alloy as a material which can be irradiated onto the sample without exerting influences upon the electric characteristics of the sample, a focused ion beam therefrom can be irradiated onto the sample without causing any metal contamination which adversely influences the electric characteristics of the sample.

Furthermore, in the case of the plasma ion source, a high-density plasma is produced through an electrodeless discharge. Namely, due to absence of an electrode directly related to generate the discharge, ions not containing any metal species can be produced. Consequently, it is possible to irradiate the ion beam onto the sample without causing a metal contamination adversely influencing the electric characteristics of the sample.

Moreover, as for the plasma ion source, when the radius of the aperture of the ion extracting electrode is set to be less than the thickness of the ion sheath, the plasma does not diffuse out of the acceleration electrode through the aperture. Consequently, a relatively low voltage the extraction electrode need to be applied with a relatively low voltage to obtain ions from the plasma. In short, by applying a voltage to the extraction electrode relative to a reference electrode disposed in the plasma, an electric field is efficiently applied to the plasma and ion beam having a theoretically maximum current density can be extracted. This method prevents the electrical breakdown in the proximity of the extraction electrode in the conventional method.

Furthermore, in the case of the plasma ion source, when an ion sheath control electrode is disposed on the extraction electrode to control the contour of the sheath surface, the ion emitting area and accordingly the ion current density are increased. Moreover, by emitting electrons from the focusing electron emitting source disposed between the extraction electrode and the acceleration electrode toward the extraction electron side, a space charge effect of ions which are not fully accelerated and have a relatively large charge density, is suppressed. Consequently, the ion beam is radially caught in a valley of potential configured about a central axis thereof; moreover, the current limitation of the axial direction is mitigated. Additionally, by generating a magnetic field by a magnetic coil to enclose the emitted electrons in the radial direction, the radial diffusion of the ion beam caught in the potential valley is suppressed.

In addition, the following beam diameter altering means of the plasma ion source achieves the function to produce an ion beam having a desired diameter: (1) Power supplied to the plasma generating section is changed to thereby vary the electron density of the plasma and the voltage applied to the ion extraction electrode is controlled to set the thickness of the ion sheath formed on the front surface of the extraction electrode to an appropriate value, thereby obtaining an ion beam with a desired diameter without decreasing the ion current density. (2) Using a tapered electrode as the extraction electrode to alter power inputted to the plasma generating section and to change thereby the electron density of the plasma so as to vary the shape of the ion emitting surface in the neighborhood of the extraction electrode, thereby attaining an ion beam with a desired diameter without decreasing the ion current density. (3) An extraction electrode of a movable structure having a plurality of extraction apertures or exits respectively having desired diameters is used. According to a desired ion beam diameter, one of the ion extraction apertures corresponding thereto is moved to the ion beam extracting position so as to draw an ion beam of a desired diameter without decreasing the ion current density. (4) Employing an extraction electrode including multi-extraction-hole having a sheath surface control electrode and an insulating plate, the voltage applied to the sheath surface control electrode is controlled to change the shape of the ion sheath surface so as to obtain ions only from a desired hole of the electrode without decreasing the ion current density, thereby forming an ion beam having a desired diameter. (5) Electric power supplied to the plasma generating section is altered to change the electron density of the plasma. Moreover, beneath the extraction electrode, there are disposed a tapered insulation spacer and a mesh electrode such that voltages respectively applied to the extraction and mesh electrodes are controlled to vary the plasma zone, thereby producing an ion beam with a desired diameter. (6) There is adopted a mesh extraction electrode in combination with a movable acceleration electrode. The ion passage hole is mechanically changed to obtain an ion beam having a desired diameter without reducing the ion current density.

Furthermore, by using a focused ion beam (FIB) apparatus of this type in which the beam diameter is variable, fine machining of the deep structure of the sample, fabrication of a new structure, as well as observations and analyses by signals obtained from cross sections, can be achieved at a high speed without contaminating the sample.

With provisions of the configurations above, in accordance with the present invention, the following advantages are obtained by a processing apparatus using a focused ion beam generated from such an ion source as a liquid metal ion source adopting germanium or silicon or a Si-Ge alloy as the ion material and a focused plasma ion source, a field ionization gas ion source, or an EHD ion source utilizing as the gas species a nitrogen gas and a noble gas such as neon, krypton, argon, or xenon gas:

☐ The ion beam can be irradiated onto a sample such as a silicon wafer or device without causing contamination of the sample by heavy metals and the dopant used in the-ion beam.

☐ In the primary ion beam irradiation system using the focused ion beam, parts which directly irradiated by the ion beam are particularly formed of silicon or germanium or a carbide or nitride thereof, thereby considerably reducing creation of the secondary contaminated substances when the focused ion beam is produced.

☐ To conduct as an inline operation in the silicon semiconductor process a fine machining work of a silicon wafer or device and an examination through a composition analysis of a local area thereof, there can be provided, for example, a wafer examination apparatus, a secondary ion mass spectrograph, a wiring correcting apparatus, and an apparatus to prepare samples for a transparent electron microscope.

☐ Since the silicon wafer or device itself as well as the history of manufacturing processes thereof can be examined in the silicon semiconductor process line, there can be instantaneously achieved such operations as repair of failed positions and alterations of conditions of fabrication processes. This considerably decreases the turnaround time from detection of a failed position to restoration thereof.

It is another object of the present invention to provide a method of controlling an ion beam current without any effect on a beam focusing condition in a focused ion beam processing, and a processing method using the ion beam control method.

It is a further object of the present invention to provide a method of stabilizing operation of an ion source for generating a focused ion beam.

To achieve the above objects, according to the present invention, there is provided a processing method using a plasma ion source for generating a focused ion beam, characterized by covering, with an insulator, an inner wall of a plasma holding vessel excluding a reference electrode for applying a voltage to a plasma and an ion extraction electrode for extracting ions from the plasma, and employing means of continuously controlling the absolute value of an ion beam current in a range of from 1 to 10 $\mu$A by changing the absolute value of an ion extraction voltage applied between the reference electrode and the ion extraction electrode in a range of from 0 to 100 V.

BRIEF DESCRIPTION OF THE DRAWINGS

These and other objects and advantages of the present invention will become apparent by reference to the following description and accompanying drawings wherein:

FIG. 35 is an illustrative diagram useful to explain an FIB cross section machining without contamination and an SEM observation in a semiconductor device production line according to the present invention;

FIG. 48 is a diagram showing a copy-machining method in the focused ion beam machining work using the ion beam current control means of the present invention.

DESCRIPTION OF THE PREFERRED EMBODIMENTS

Referring now the drawings, description will be given of embodiments according to the present invent ion.

EMBODIMENT 1

In conjunction with the first embodiment of the present invention, a plasma ion source as an ion beam source to produce a focused ion beam (FIB) will be described by reference to FIGS. 1 to 27.

Figure 1:
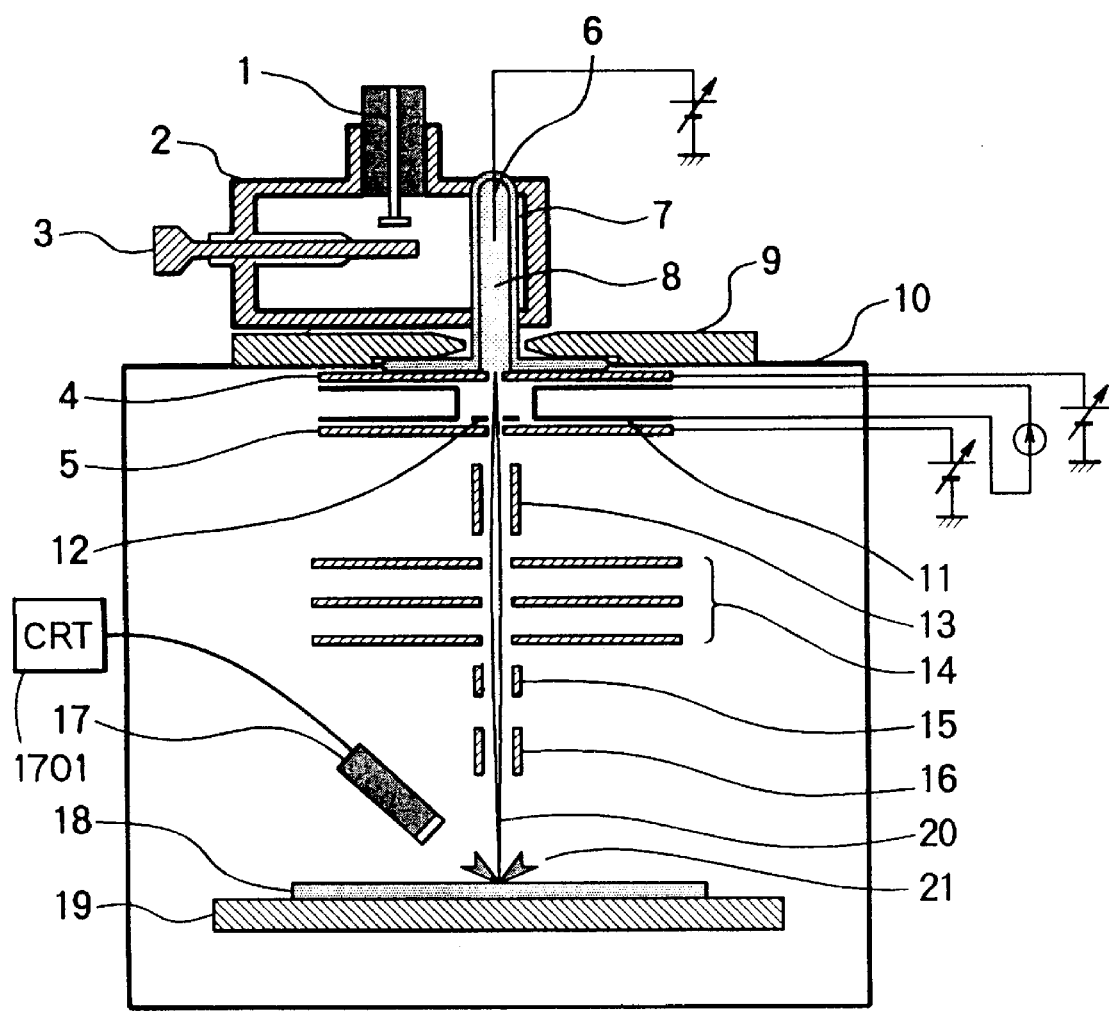
FIG. 1 is a cross-sectional view showing a processing apparatus using a focused ion beam from a microwave discharge plasma produced by a reentrant cylindrical cavity resonator in a first embodiment according to the present invention.
Figure 2:
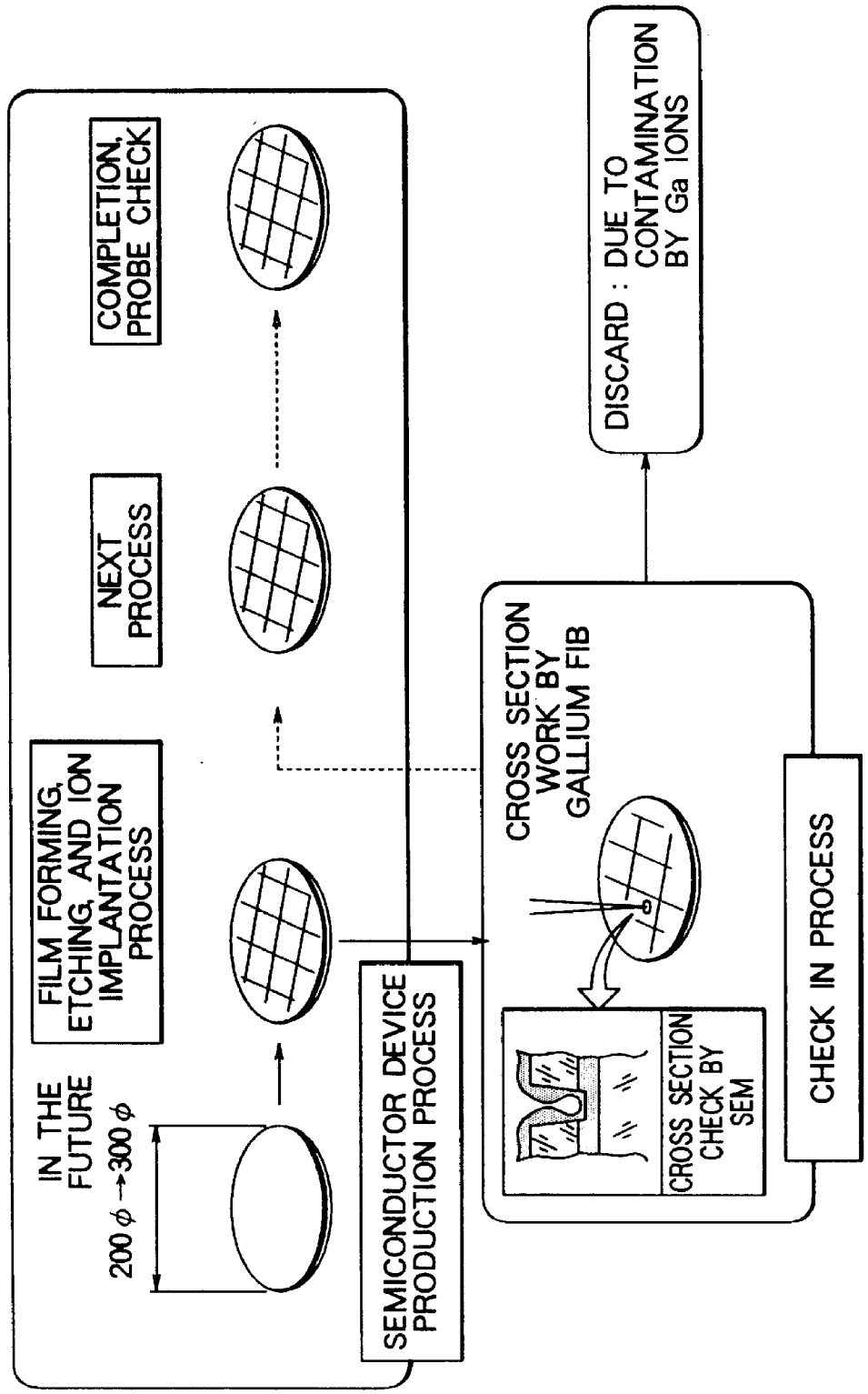
FIG. 2 is a schematic diagram useful to explain a method of machining a cross section and a method of observing by an SEM a semiconductor device by use of the conventional Ga-FIB.
Figure 3:
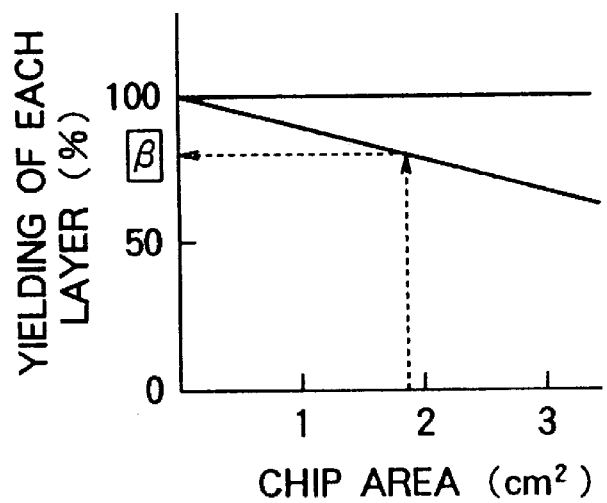
FIG. 3 is a graph showing relationships between chip areas and yield of chip layers.
Figure 4:
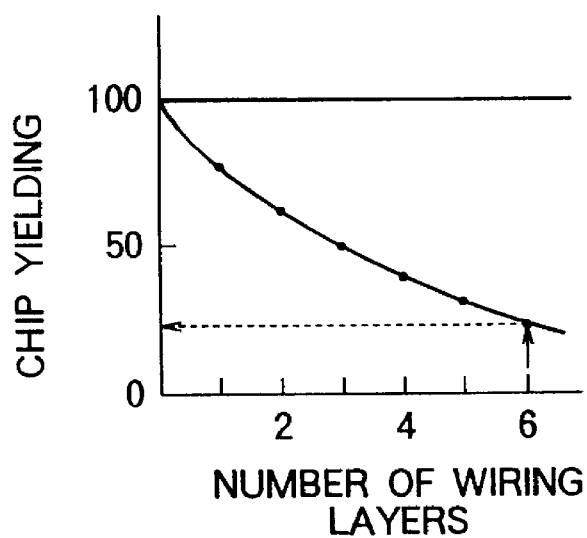
FIG. 4 is a graph showing relationships between the number of wiring layers and chip yield.

FIG. 1 is the construction diagram of a machining apparatus adopting a focused ion beam from an ion source of a microwave discharge plasma prepared by a reentrant cylindrical cavity resonator of the quarter wavelength resonance type. In FIG. 1, the machining apparatus includes a microwave incident coaxial cable 1, a reentrant cylindrical cavity resonator of the quarter wavelength resonance type 2, a wavelength adjusting screw 3, an extraction electrode 4, an acceleration electrode 5, a reference electrode 6, a silica or quartz glass tube 7, a generated plasma 8, a magnetic field generator 9, a machine working vacuum chamber 10, a magnetic coil 11, a source of electrons to be focused 12, a blanking electrode 13, a three-plate electrode lens 14, a stigmator electrode 15, a deflector electrode 16, a secondary particle detector 17, a workpiece 18, a stage 19, a focused ion beam 20, and secondary particles 21.

First, referring to FIG. 1, description will be given of operation of the plasma ion source according to the present invention.

Through the coaxial cable 1, a 2.45 GHZ microwave enters the resonator 2. In the resonator 2, there is installed the quartz glass tube 7 filled with a inert gas. Incidentally, by adjusting the screw 3, the microwave incident power supplied to the resonator 2 is set to a maximum value. In this situation, the noble gas is ionized, that is, the plasma 8 is generated. The plasma is subjected to a magnetic field of a magnetic flux density of 875 Gauss generated by the magnetic field generator 9 in the vicinity of an extraction hole, thereby leading the plasma to an electron cyclotron resonance (ECR). Since a microwave exceeding the cutoff frequency of the plasma is incident thereto, there is locally created a high-density plasma of the density ranging from about $10^{12}/cm^3$ to about $10^{13}/cm^3$.

Ions in the plasma 8 are drawn from the extraction exit disposed in the extraction electrode applied with a potential negative with respect to that of the reference electrode 6 arranged in the plasma 8 and then are fed into a space between the extraction electrode 4 and the acceleration electrode 5. The attained ions are accelerated by the acceleration electrode 5 toward the workpiece 18 in the vacuum chamber 10. Resultantly, there is formed the focused ion beam 20.

In this regard, for the machining work, the ions are required to have energy of several tens of kilo electron volt (keV). The ions immediately after the extraction hole has energy of only several tens of electron volt. Assume that each ion has the mass mi, the velocity vi, elementary electric charge q and the acceleration voltage is set to V. According to the following equation, $$\tfrac{1}{2} m i v i^2 = qV \tag{1}$$

the ions immediately after the drawing exit have a velocity which is only about 3% of the velocity necessary for the machining. Assume that the charge density in the neighborhood of the extraction exit is Q1, the charge density after the ion acceleration is Q2, the ion velocity in the vicinity of the extraction exit is vi1, the ion velocity after acceleration is vi2, the beam cross-sectional area in the vicinity of the extraction exit is S1, and the beam cross-sectional area after acceleration is S2. Under the above conditions, $$Q1 S1 = \tfrac{vi2}{vi1} Q2 S2 \tag{2}$$

holds, namely, the electric charge per unitary length is inversely proportional to the velocity.

In consequence, the electric charge of the ions just after the extraction exit is greater than that of the accelerated ions. Consequently, the ions repulse each other due to electric charge thereof and the ion beam is accordingly expanded in accordance with an increase in the ion velocity. To prevent the influence, electrons inversely charged with respect to the ions are emitted from the electron emission source 12 and a magnetic field is produced by the magnetic coil 11 to collect the electrons by a force prepared by an interaction between the electric field and the magnetic field, thereby compensating or cancelling the repellent force between the ions. The focused ion beam 20 passing the acceleration electrode 5 is fed through the blanking electrode 13. The electrode 13 has two electrode plates such that with an electric field generated therebetween, the orbit of the focused ion beam 20 is altered, thereby preventing the beam 20 from colliding against the workpiece 18. Namely, the blanking electrode 13 serves a function to turn the beam 20 on and off.

When the blanking electrode 13 is not in operation, the focused ion beam 20 enters the three-plate electrode lens 14. Conducting a voltage control of three electrode plates of the lens 14, there are obtained a beam diameter and a beam current density for the beam 20 to machine the workpiece 18. Next, the beam 20 enters the stigmator electrode 15 so as to compensate astigmatism due to asymmetric factors of the three-plate electrode lens 14. The focused ion beam 20 having energy for the fine machining is then irradiated onto the workpiece 18. However, a satisfactory machining precision cannot be attained only by moving the stage 19. In consequence, a fine control of the orbit of the beam 20 is accomplished by the electric field in the deflector electrode 16 so as to carry out the machining at an arbitrary point of the workpiece 18.

Next, description will be given of an ion extraction mechanism of the plasma ion source according to the present invention in comparison with a conventional plasma ion source.

Heretofore, the operation to extract ions from a plasma has been conducted through an ion extraction hole disposed in a wall brought into contact with the plasma such that ions from the plasma are drawn through the hole. Since the plasma is brought into contact with the wall (made of a conductive, nonconductive, or other substance) having the extraction hole, due to the mass discrepancy between the electron and the ion, there appears an area called a sheath in which the charge neutrality condition inherently characteristic to the plasma is not satisfied.

Moreover, the ion is heavier than the electron in most cases; consequently, to keep a balance between an electric current due to ions and one caused by electrons, there are gathered an excessive number of ions in the proximity of the wall. This resultantly forms an ion sheath. When the gaseous plasma has a gas pressure of several pascals to several tens of pascals, the plasma can be assumed as a collisionless plasma in which particles do not collide against each other in the sheath. In this case, according to the sheath generation theory written in the "Plasma Diagnostic Techniques" (Academic Press, New York, 1965), there can be estimated the maximum value of the extractable ion current density.

The potential in the ion sheath is lower than the plasma space potential, and a sheath is defined as a zone from the wall to a position where the potential is lower than the plasma potential by about a half of the electron temperature Te. In this situation, the ion saturation current density Ji from the plasma is expressed as follows.

$$Ji = 0.61 \, Neq \sqrt{\frac{kTe}{mi}} \tag{3}$$

Figure 5:
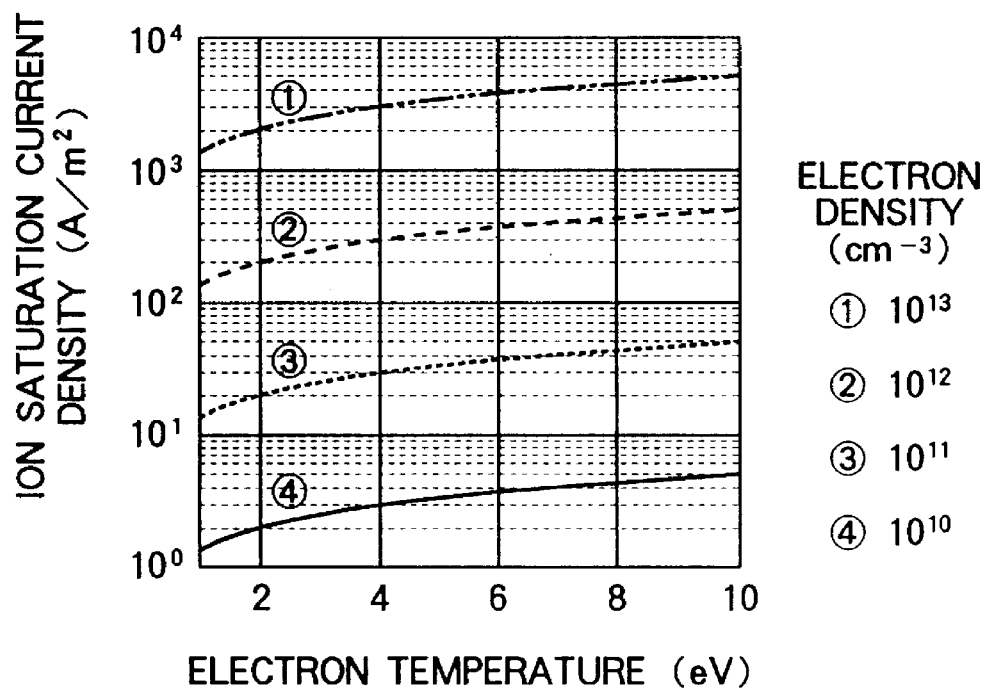
FIG. 5 is a graph showing dependence of the ion saturation current density of a collisionless plasma on the electron density and temperature.

In the equation, Ne and k stand for the electron density of the plasma and Boltzmann constant, respectively. Consequently, using an argon gas as an example, the maximum value of the ion saturation current density Ji with respect to the electron density Ne of the plasma can be calculated according to the equation (3). Results of the calculation are shown in FIG. 5.

In this connection, recently, the focused ion beam to be applied to a fine machining of semiconductors, an SIM observation, and the like are required to have performance of about one nanoampere (nA) for a beam diameter of about 0.1 micrometer ($\mu$m), namely, a current density of about 105 A/m². In consequence, even when the beam diameter is reduced to 1/10 of the original value by the ion optical lens function of the 3-plate electrode lens 14, at least 103 A/m² is required as the ion current density from the ion source. Consequently, to attain the current density 103 A/m² in the production processes of FIG. 2, when the electron temperature is several electron volts, there is necessitated a plasma having an electron density of about 1013/cm³.

On the other hand, the Debye length $\lambda$d for which the plasma in an ionized state containing ions and electrons is assumed to be neutral is represented as follows.

$$\lambda d = \sqrt{\frac{\epsilon_0 kT_e}{q^2 N_e}} \tag{4}$$

In this equation, $\epsilon 0$ indicates permittivity of the vacuum. According to calculated results of the Debye length with the electron density set as a parameter (FIG. 6), when the electron density is 1013/cm³, the Debye length is obtained as several micrometers.

Furthermore, when the initial velocity of the ion can be ignored, the ion saturation current density Ji is expressed as follows according to the rules of 3/2 power of Langmuir-Child.

$$Ji = \frac{4\epsilon_0}{9} \sqrt{\frac{2q}{m_i}} \frac{(V_0 - V_p)^{\frac{3}{2}}}{\alpha^2} \tag{5}$$

In the equation, Vp, V0, and $\alpha$ stand for the electrode potential, the sheath edge potential (sheath generating condition; less than the plasma potential by a half of the electron temperature Te), and the sheath thickness, respectively. Consequently, obtaining the sheath thickness $\alpha$ from the equations (3) and (5) with the electron temperature set as a parameter, it is to be appreciated that ion sheaths of thicknesses shown in FIG. 7 according to the potential difference between the plate electrode and the sheath edge are formed on the front surface of the plate electrode.

Figure 7:
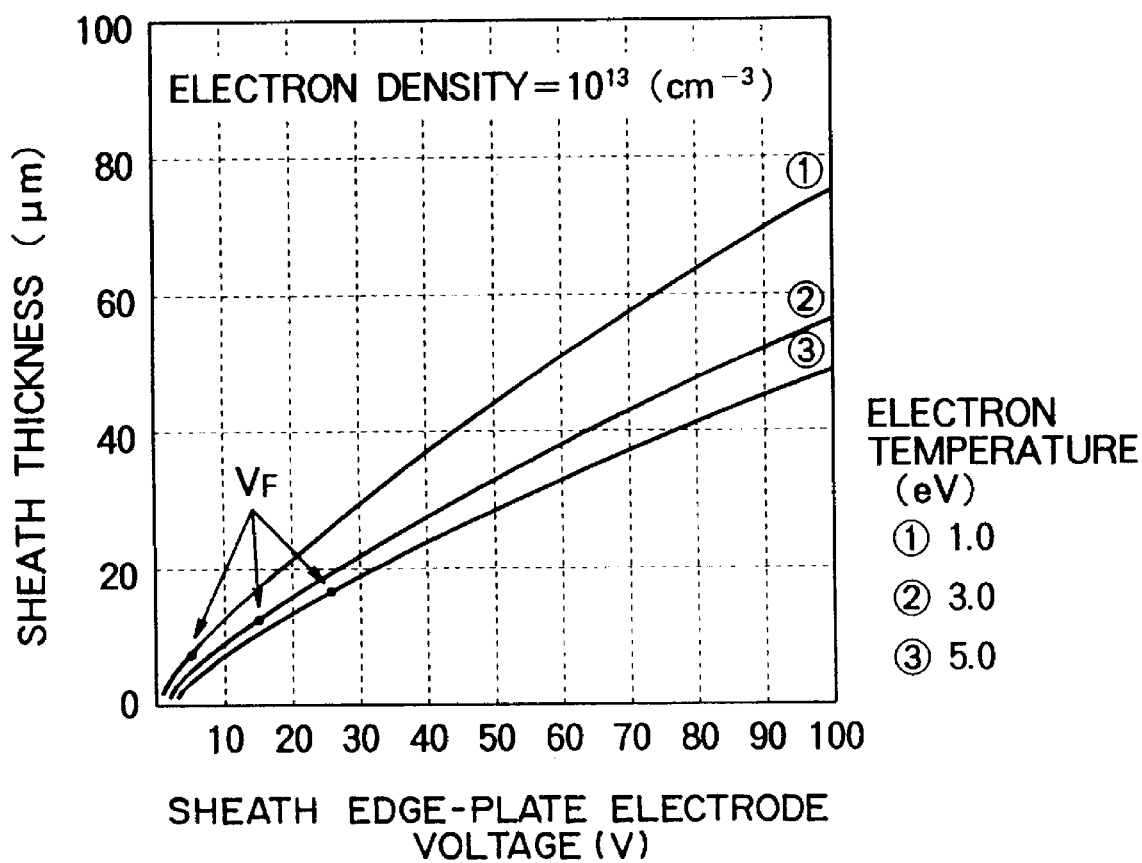
FIG. 7 is a graph showing dependence of the ion sheath thickness associated with a collisionless plasma on the voltage between the sheath edge and the planar electrode.

In FIG. 7, VF indicates a floating potential between the sheath edge and the electrode in the absence of the current flowing from the plasma to the electrode. Consequently, when the electrode is free of the voltage, there always appears on the front surface of the electrode an ion sheath having a thickness of about ten micrometers which is several times the Debye length.

Figure 8:
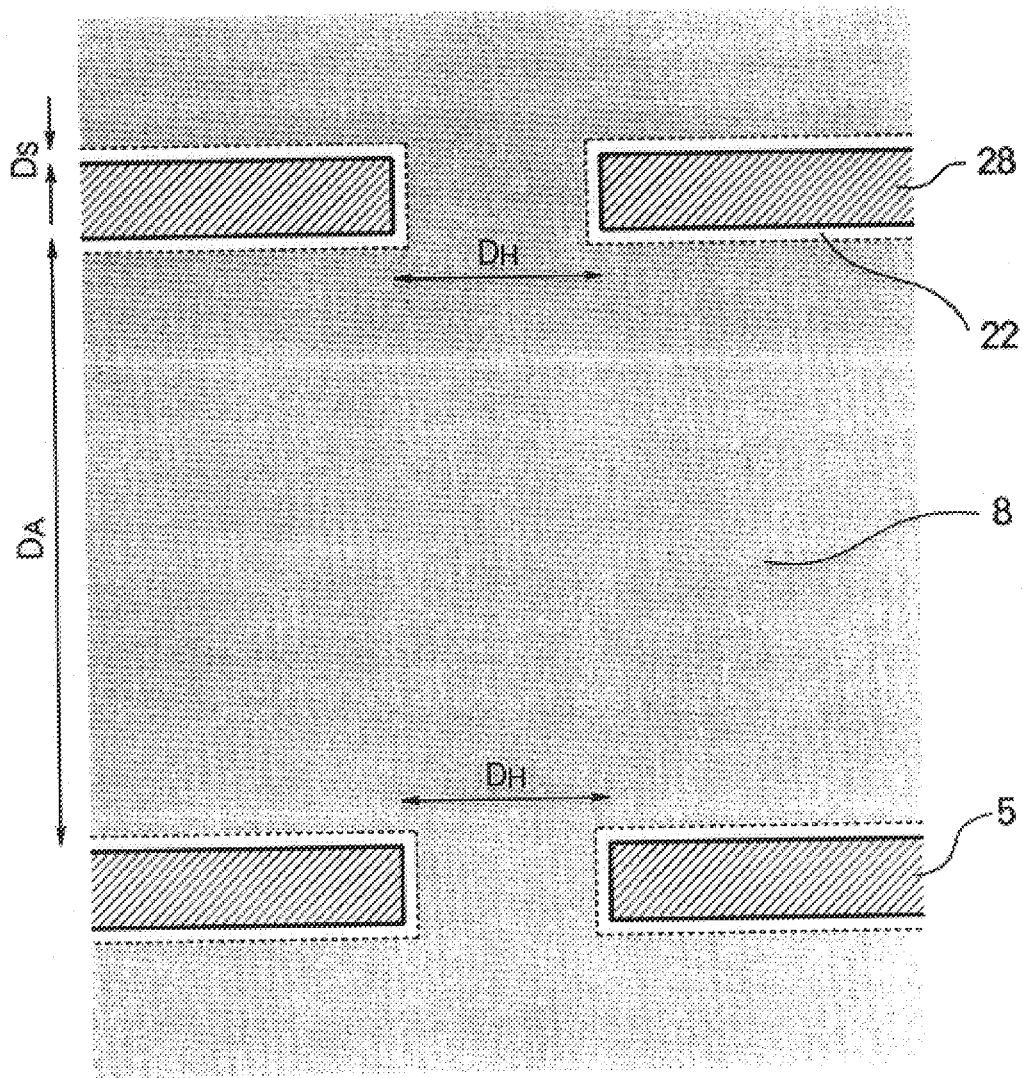
FIG. 8 is a diagram showing the construction of an ion extraction electrode in a focused ion beam machining apparatus using a plasma of the conventional technology.
Figure 9:
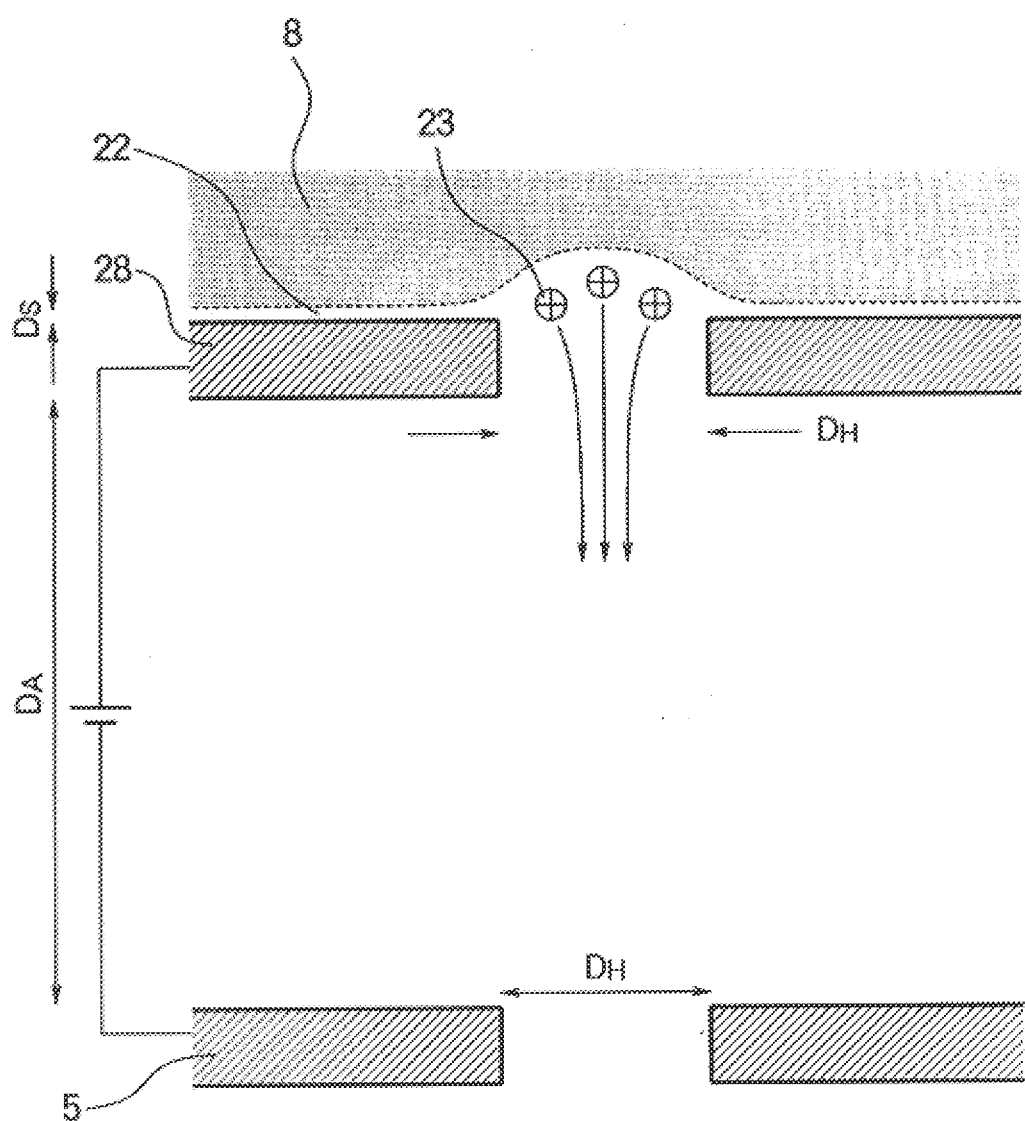
FIG. 9 is a diagram showing the principle of the ion extraction mechanism in a focused ion beam machining apparatus using a plasma of the conventional technology.

Conventionally, in a machining apparatus using a focused ion beam created from a plasma ion source, the ion drawing mechanism is constructed as shown in FIG. 8 in which a drawing voltage is applied to the acceleration electrode 5 on the basis of the conventional extraction electrode 28 having an extraction hole. When the voltage is absent between the extraction electrode 28 and the acceleration electrode 5, the thickness Ds of the ion sheath 22 is smaller than the ½ diameter DH of the extraction hole and hence the zone of the plasma 8 expands beyond the extraction exit and reaches the acceleration electrode 5. In this state, it is impossible to extract only the ions. Consequently, in FIG. 9, a high voltage is required to be applied therebetween, the ion sheath 22 is grown in the neighborhood of the acceleration electrode 5 so as to prevent the plasma 8 from extending to the acceleration region through the extraction hole of the conventional extraction electrode 28.

Figure 6:
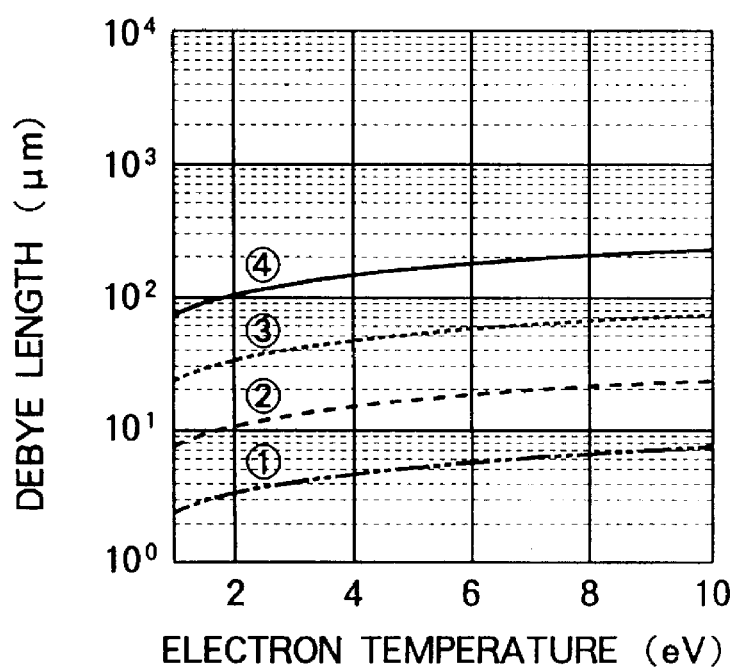
FIG. 6 is a graph showing dependence of the debye length of a collisionless plasma on the electron density and temperature.

For example, in the extraction mechanism of the machining apparatus using the focused ion beam from the plasma ion source of the prior art, there are employed a relatively low-density plasma having the electron temperature of about one electron volt and the electron density of about 1011/cm³ and the Debye length is about 25 micrometers according to from FIG. 6. The sheath thickness Ds at the floating potential VF is several times the Debye length, namely, about 100 micrometers. Assume that the extraction hole diameter DH is 1.5 mm and the voltage applied across the conventional extraction electrode 28 and the acceleration electrode 5 is 10 kV. Under a pressure of 10 mPa or less, there exists the following relationship between the inter-electrode insulation distance dg (cm) and the breakdown voltage Vb (V).

$$Vb = 6 \times 104 \sqrt{dg} \tag{6}$$

In consequence, the distance between the extraction electrode 28 and the acceleration electrode 5 is obtained as 4 mm.

However, since the breakdown voltage of the ion sheath 22 is less than that of the empty space according to the equation (6), there occurs the breakdown between the plasma and the electrode and hence ions cannot be satisfactorily extracted.

Figure 10:
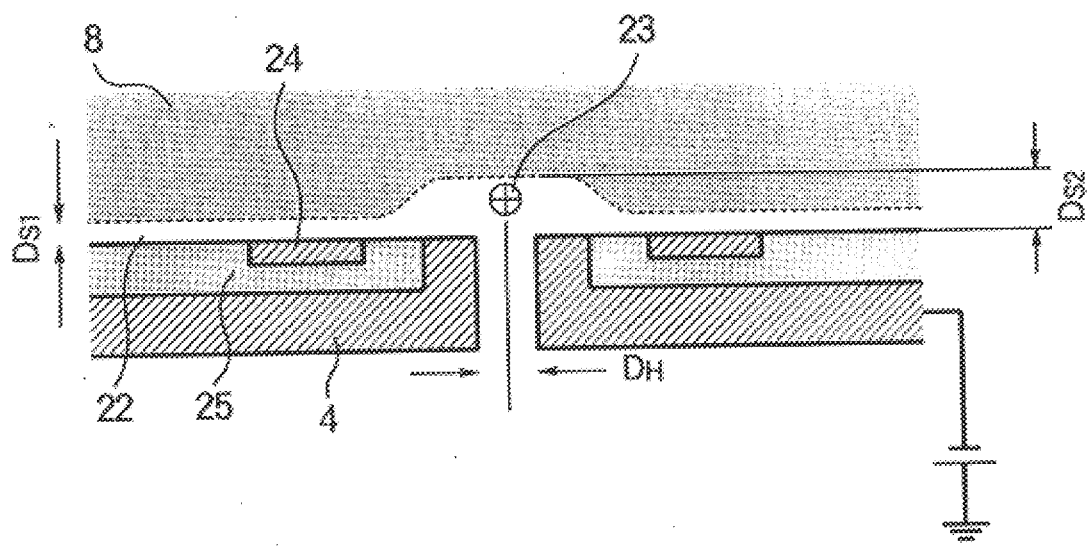
FIG. 10 is a diagram showing the principle of the ion extraction mechanism of the first embodiment according to the present invention.

To overcome this difficulty, according to the present invention, there is not employed the conventional extraction mechanism in which the electric field to extract ions is identical to that to accelerate the ions. Namely, as shown in FIG. 10, the ion sheath thickness DS1 of the floating potential is kept in any operational situation to be at least a half of the hole diameter DH. Under this condition, even in the absence of the voltage applied to the extraction electrode 4, the plasma 8 does not extend to the acceleration region beyond the extraction electrode 4. Moreover, a voltage is directly applied to the reference electrode 6 of FIG. 1 which has an area greater than that of the extraction electrode 4 and which is in contact with the plasma 8. Accordingly, even with a low voltage of several tens of volts, it is possible to extract ions through the ion sheath 22 with the sheath thickness DS2 up to the saturation current value.

In consequence, according to the present invention, to obtain the beam diameter of 0.1 micrometer for the focused ion beam to conduct the fine machining, the beam diameter is reduced to 1/10 of the original value through the 3-plate electrode 14. Consequently, there is adopted the extraction electrode 4 having an extraction hole with a diameter of one micrometer. In this connection, for the plasma having the density $10^{13}/cm^3$, the ion sheath thickness DS1 is about ten micrometers, satisfying $DS1 \geq \frac{1}{2}DH$. Furthermore, even when the extraction voltage is altered, since the ion emission surface is kept to be parallel to the extraction electrode surface, the ion current density is fixed. However, the ions are accelerated in a direction vertical to the extraction electrode surface. In consequence, at a point of time immediate after passage of ions through the extraction hole, there is obtained an ion beam which is more satisfactorily focused when compared with the conventional ion beam and which is free of expanded beam components. That is, the electric field to extract the ions and the acceleration electric field effective after the extraction of the ions can be controlled independently of each other. Consequently, the high electric field is not directly applied to the sheath and hence the ions can be extracted to the maximum extent without causing the breakdown. Incidentally, any voltage is not applied to the ion sheath control electrode 24 on the insulating substance 25.

Figure 11:
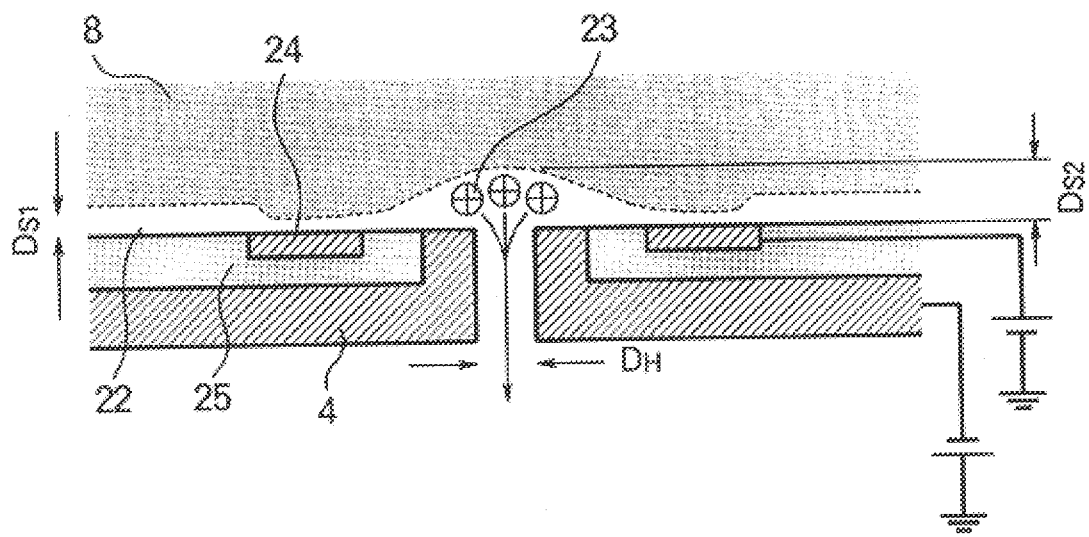
FIG. 11 is a diagram showing the principle of the ion extraction mechanism using an ion sheath control electrode in the first embodiment according to the present invention.

On the other hand, as shown in FIG. 11, it is possible to control the shape of the sheath surface on the front surface of the ion sheath control electrode 24 by applying a voltage from an external power supply to the extraction electrode 4 and the ion sheath control electrode 24 electrically insulated by the insulator 25 or by using a filament material for the ion sheath control electrode 24 so as to heat the electrode 24 by an electric current or by an infrared laser for a thermal electron emission therefrom. For example, there may be formed an ion emitting surface having a contour of a depression to increase the ion emitting area as compared with a flat emission area so as to increase the ion current density. Alternatively, a finer adjustment may be conducted for the parallelism between the sheath surface and the extraction electrode of FIG. 11 to improve the directivity of ions thus emitted.

Moreover, the ion sheath control electrode 24 is applicable also to the conventional ion extraction mechanism (FIG. 9) to control the shape of the ion emitting surface or plane. In this regard, by changing the polarity of the voltage applied to the electrodes 4 and 24 with respect to the plasma, there may be conducted an operation similar to that of an electron gun.

In addition, thanks to the extraction mechanism above, since the extraction and acceleration electric fields can be controlled independently of each other, there is necessitated a mechanism to accelerate ions emitted from the extraction hole to a velocity necessary for an objective fine machining. In this connection, description will be given of the ion acceleration mechanism according to the present invention by reference to FIGS. 12 to 14.

Ions emitted from the extraction hole with a high directivity or highly oriented to a desired direction are accelerated by the acceleration electric field between the extraction electrode 4 and the acceleration electrode 5. However, the low-speed ions in the periphery of the extraction hole have a high electric charge as described above, there hence appears a space charge effect due to the Coulomb force caused by the same type of electric charge. The space charge effect primarily results in the following actions.
(1) Diffusion of the ion beam in the radial direction.
(2) Limitation of current due to axial limitation of space charge.

These actions directly relate to characteristics of the ion beam. In consequence, to increase the focusing efficiency in the ion optical system including the components 14 to 16 effective after the acceleration in FIG. 1 and to thereby attain a focused ion beam necessary for the fine machining work, the space charge effect is required to be suppressed.

Figure 12:
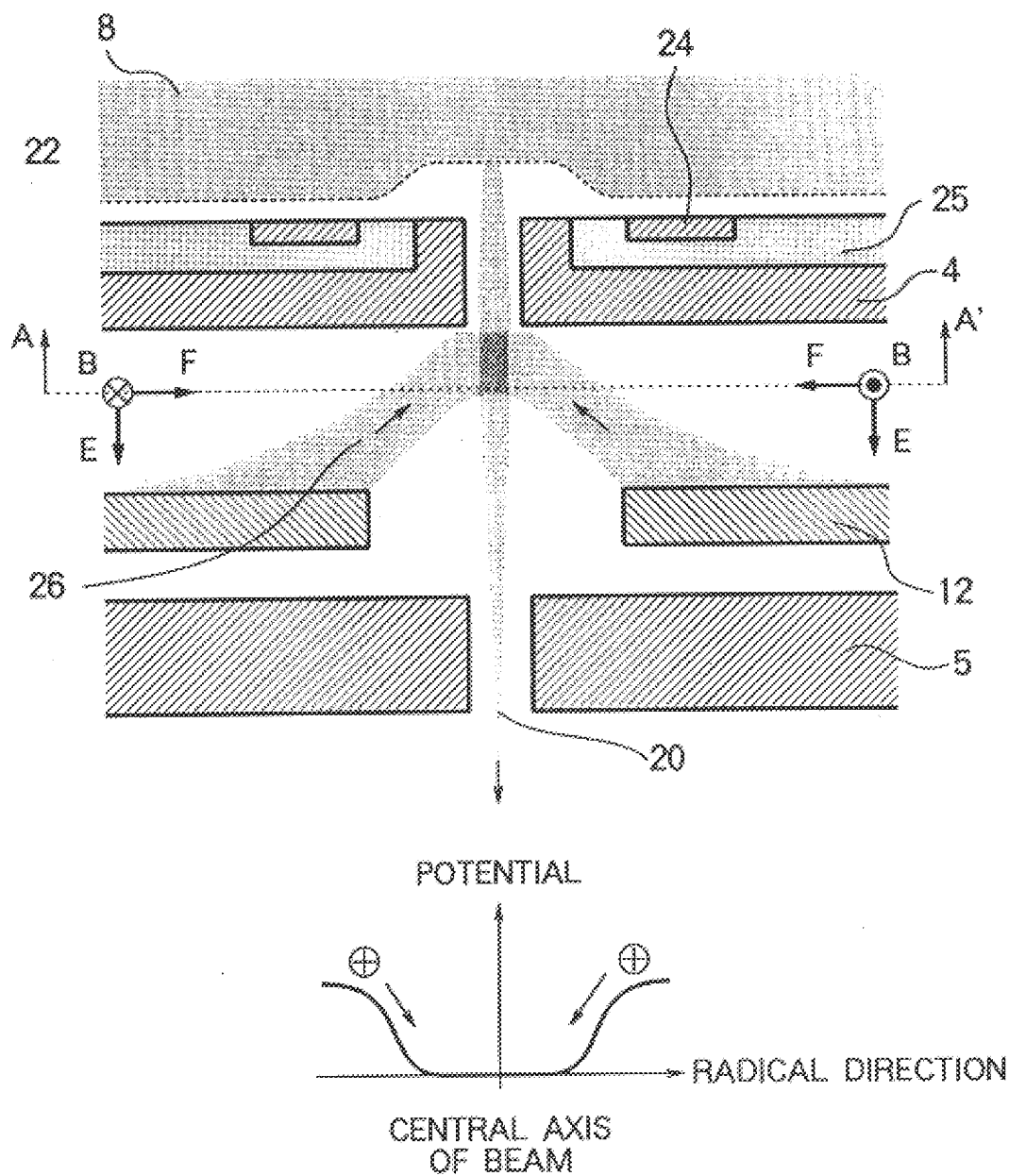
FIG. 12 is a diagram showing the principle of the electron beam/field focusing mechanism using the focused ion beam in the first embodiment according to the present invention.

Conventionally, to minimize the space charge effect, charged particles are employed to cancel space charges. For example, in the case of an ion beam, an electron beam 26 is irradiated from a focusing electron emission source 12 onto a focused ion beam 20 as shown in FIG. 12. Assume that the space potential is $\phi$, the charge density of the focused ion beam 20 is $\rho i$, and the charge density of the electron beam 26 is $\rho e$. The Poisson's equation is then expressed as follows.

$$2\phi = -\frac{(\rho i - \rho e)}{\epsilon 0} \quad (7)$$

When the charge density of the electron beam 26 $\rho e$ is larger than the charge density of the focused ion beam 20 $\rho i$, there virtually appears an electric charge only due to electrons. Consequently, a potential valley is formed about the center axis of the beam. Ions are caught in the potential valley and hence the diffusion thereof is suppressed. Furthermore, the space charge limitation in the axial direction according to the rule of 3/2 power of Langmuir-Child can be mitigated through cancellation of the space charge. In this regard, in the diagram of FIG. 12, the horizontal length is multiplied by 50 as compared with the vertical length.

Figure 13:
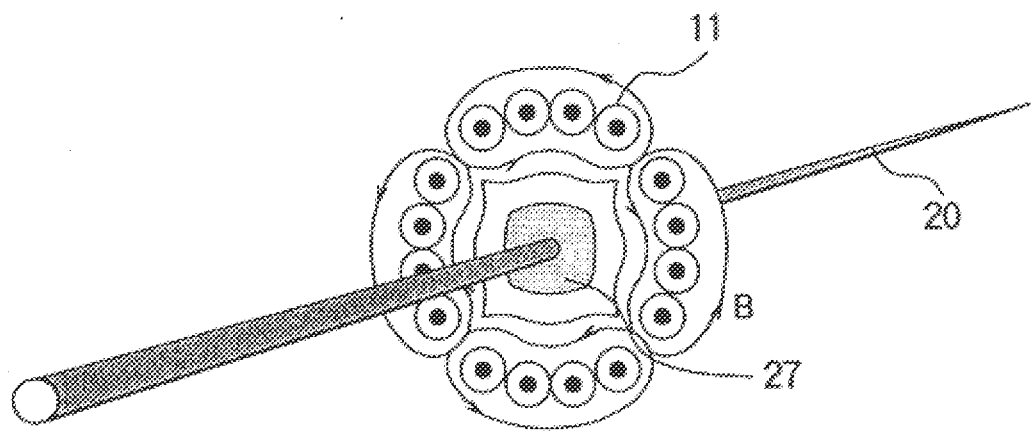
FIG. 13 is a cross-sectional view of the electron beam/ field focusing mechanism along a line A—A' of FIG. 12.

However, since the diameter of the potential valley cannot be controlled by the space charge canceling method, there is not attained a satisfactory ion beam focusing effect. On the other hand, according to the present invention, the charge density $\rho e$ of the electron beam 26 from the electron emission source 12 is set to be larger than the charge density $\rho i$ of the focused ion beam 20 to form a potential valley in the radial direction as shown in FIG. 12. Moreover, using the excitation coil 11 shown in FIG. 1, there is produced in the acceleration zone a magnetic field to confine the electron beam 26 as shown in FIG. 12. FIG. 13 shows a cross-sectional view along a line A—A' of FIG. 12. The magnetic coil 11 includes four windings. In each winding, an electric current flows in a direction from the rear side to the front side of the sheet of drawing, thereby generating a magnetic field having a flux density B.

Figure 14:
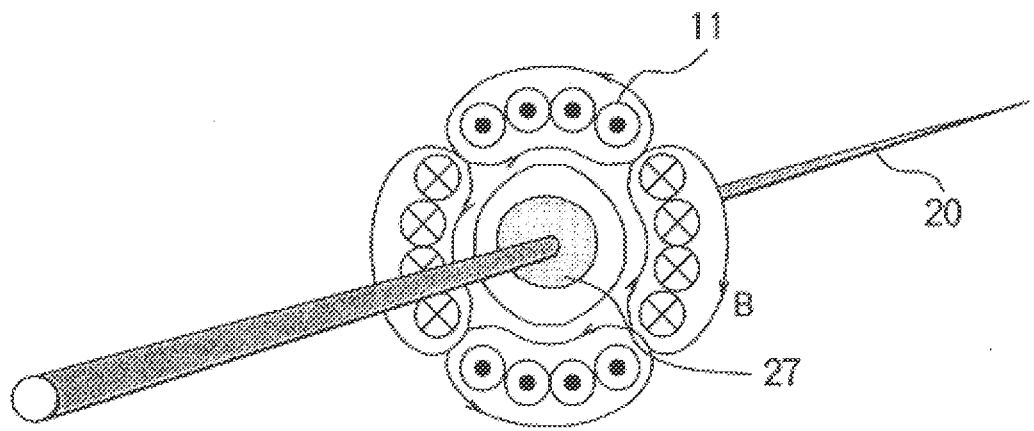
FIG. 14 is a cross-sectional view of the electron beam/ field focusing mechanism along a line A—A' when a two-pole magnetic field is used in FIG. 12.

The magnetic field imparts electrons a force F due to E×B as shown in FIG. 12 and confines the electron beam in an electron beam focusing zone 27 of FIG. 13. As a result, the focusing area 27, namely, the zone of the potential valley is controlled according to the strength of the magnetic field, thereby controlling the beam diameter of the focused ion beam 20 and the space charge limitation in the axial direction. In addition, when an electric current is supplied through the windings on the left and right of the magnetic coil 11 in a direction from the front side to the rear side of the sheet of drawing as shown in FIG. 14, the contour of the electron beam focusing zone 27 is altered so as to control also the shape of the focusing zone of the focused ion beam 20.

As above, in the plasma ion source of the first embodiment according to the present invention, when the radius of the ion extracting hole of the extraction electrode is smaller than the thickness of the ion sheath, the ions are prevented from diffusing from the extraction hole toward the accelerator side. Consequently, only a relatively low voltage is required to be applied to the extraction electrode to extract ions from the plasma. That is, by applying a voltage to an extraction electrode relative to the reference electrode disposed in the plasma, an electric field is efficiently applied to the plasma so that the theoretically maximum quantity of ions can be drawn with a low voltage, namely, several tens of volt. This consequently removes the problem of the conventional apparatus, namely, the breakdown in the proximity of the extraction electrode of the plasma ion source.

In addition, an ion sheath control electrode is disposed on the extraction electrode to control the shape of the sheath surface so as to enlarge the ion emission area, thereby increasing the ion current density.

Furthermore, between the extraction and acceleration electrodes, there is arranged a focusing electron emission source to emit electrons toward the extraction electrode side. This suppresses the space charge effect on ions which have a high electric charge and which have not been sufficiently accelerated in the proximity of the extraction hole. Accordingly, the ion beam can be radially caught by the potential valley formed about the central axis thereof and the axial current limitation can be mitigated. Moreover, by generating a magnetic field to confine the emitted electrons in the radial direction, the ion beam caught in the potential valley can be prevented from being diffused in the radial direction. With these provisions, it is possible to draw an ion beam having a high current density from the plasma ion source.

As above, there is obtained the configuration of the focused ion beam machining apparatus using the plasma ion source according to the present invention. Namely, the configuration of the apparatus includes a high-density microwave plasma generating mechanism including the components 1, 2, 3, 7, 8, and 9 of FIG. 1; an ion extraction mechanism including the element 6 of FIG. 1 and the elements 4, 24, and 25 of FIG. 10; an electron beam and magnetic field focusing mechanism including the component 11 of FIG. 1 and the components 4, 5 and 12 of FIG. 12; and an ion optical system including the elements 14 to 16 of FIG. 1. According to the configuration above, it is possible to produce a focused ion beam free of metal ions, the beam having a beam diameter of about 0.1 micrometer and a current density of about 105 A/m2 which are respectively about 1/10 time and about 100 times those of the ion beam employed in the machining apparatus using the conventional plasma ion source. Resultantly, a fine machining work can be conducted on the workpiece without causing contamination by impurity substances.

In addition, according to the embodiment, the workpiece 18 is subjected to the machine work according to a physical impact of the focused ion beam 20. Moreover, the secondary particles 21 emitted from the surface of the workpiece 18 are sensed as electric signals by the secondary particle sensor 17. To obtain an image of secondary particles, a luminance modulation is carried out on the bright point scanning the CRT screen at a timing synchronized with the scanning operation of the focused ion beam 20. Using the secondary particle image thus displayed, the fine machining of the object 18 can be achieved while observing the machining state thereof.

In this connection, the plasma generating mechanism of the plasma generator section has been described only by way of example. The present invention is not restricted by the plasma generating mechanism. Namely, any plasma generating mechanism capable of creating a high-density plasma through an electrodeless discharge can be applicable.

As described above, the FIB machining apparatus using the plasma ion source of the first embodiment according to the present invention is capable of creating a focused ion beam having a beam diameter of about 0.1 micrometer and a current density of about 105 A/m2 to conduct a fine working of a wafer or device transported through the semiconductor production line. On the other hand, such a wafer or device in the production line has a multi-layer structure. To examine or to check the manufacturing history thereof, it is necessary to bore a hole therein from a surface up to a lower layer.

In this case, until the layer to be checked or modified is reached, the deep hole is required to be produced with a large cross section having a diameter or an edge which is several times to several hundred times the diameter of the ion beam. However, with the ion beam having a beam diameter of about 0.1 micrometer and a current density of about 105 A/m2, it takes a long period of time to dispose a deep hole with a large area in the wafer or device. Consequently, there is necessitated a bold ion beam of the same current density having a diameter which is several times to several ten times the beam diameter 0.1 micrometer. For this purpose, the FIB machining apparatus using the focused ion beam according to the present invention also has a function to produce a high-density ion beam having a large diameter without decreasing the current density, the diameter being several times to several ten times the beam diameter 0.1 micrometer.

Furthermore, the ion beam machining apparatus utilizing the plasma ion source is not limited to the FIB machining apparatus. It is to be appreciated that the ion beam machining apparatus is easily applicable to a silicon wafer examining apparatus, a secondary ion mass spectrometer, a surface foreign matter checking system, an FIB assist deposition, and the like.

Referring now to FIGS. 15 to 27, description will be given of the mechanism for generating the large-diameter high-density ion beam according to the present invention. In the following description, the same reference numerals are assigned to the same constituent components as those described in conjunction with the plasma ion source above.

Figure 15:
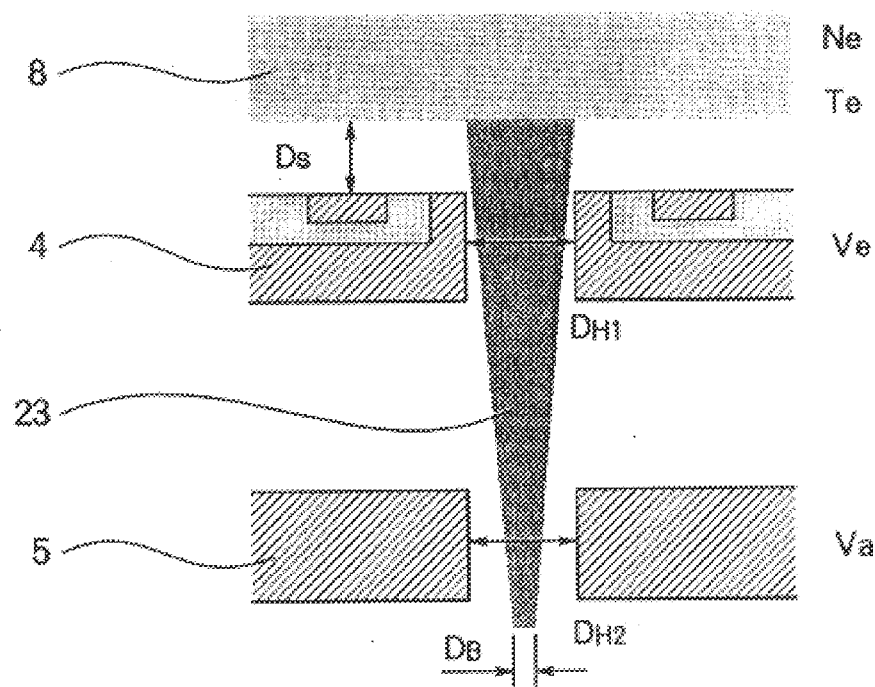
FIG. 15 is diagram showing the principle of the ion extraction in a fine machining work in the first embodiment according to the present invention.

FIG. 15 shows the extraction electrode 4 and the acceleration electrode 5 apart therefrom by a distance decided according to the equation (6) of the breakdown between electrodes (FIG. 10). In this situation, the plasma state is represented by an electron density Ne and an electron temperature Te, whereas the extraction electrode 4 and the acceleration electrode 5 respectively have potential values Ve and Va relative to the ground potential. As shown in FIG. 5, the current density of the ion current attainable from the plasma is determined by the electron density Ne and the electron temperature Te. When there is developed a potential discrepancy equal to or more than the potential difference Vf between the potential of the extraction electrode 4 and the plasma space potential Vp generated by the ion sheath on the front surface of the extraction electrode 4, there can be obtained a constant ion current density in any case. However, if the condition Ds (sheath thickness)$\geq \frac{1}{2}$DH1 (extraction hole diameter) is not held, the plasma will be expanded between the extraction electrode 4 and the acceleration electrode 5. Namely, a simple increase in the extraction hole diameter does not lead to production of a high-density ion beam described above.

On the other hand, as described in pages 123 to 129 of the "Electron and Ion Beam Handbook", Nippon Gakujutsu Shinkokai (132nd Committee, Japan Society for the Promotion of Science)" published from Nikkan Kogyo Shimbun, when there exists of a cylindrical hole such as the extraction hole, the track of ions is changed due to an electric field in the proximity of the hole and hence the focal distance of the beam is changed, thereby effecting a function like a lens (ion lens effect).

Figure 27:
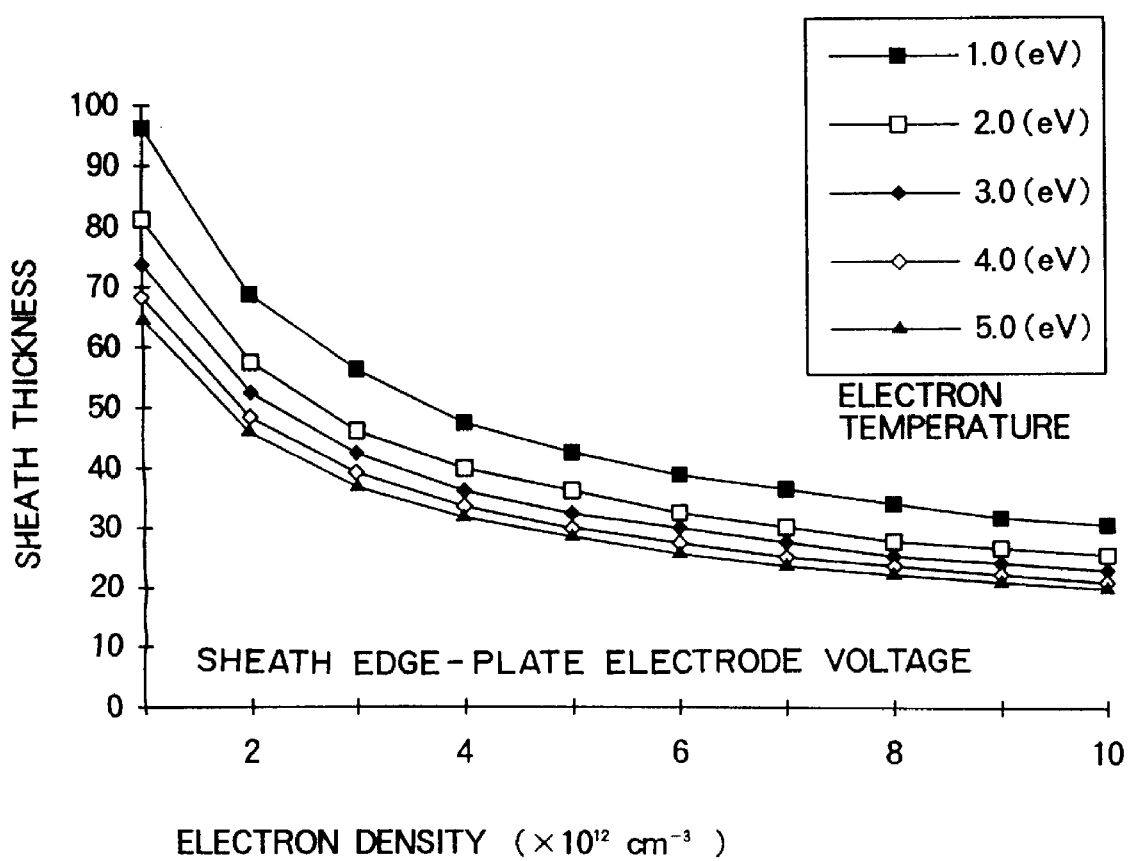
FIG. 27 is a graph showing dependence of the ion sheath thickness related to a collisionless plasma on the electron density of the plasma.

Consequently, to alter the beam diameter without changing the extraction hole diameter, the acceleration voltage Va is adjusted to use the ion lens effect in the neighborhood of the extraction hole. However, the beam is defocused in this method and hence the current density is lowered. To remove this problem, there may be considered a method in which the power of the microwave source is increased for a higher plasma density to obtain a higher electron density Ne so as to keep the constant current density under the above condition. However, as shown in FIG. 27, in association with an increase in the electron density, the sheath thickness is reduced and hence the condition Ds (sheath thickness) ≧½DH1 (extraction hole diameter) cannot be satisfied.

Figure 16:
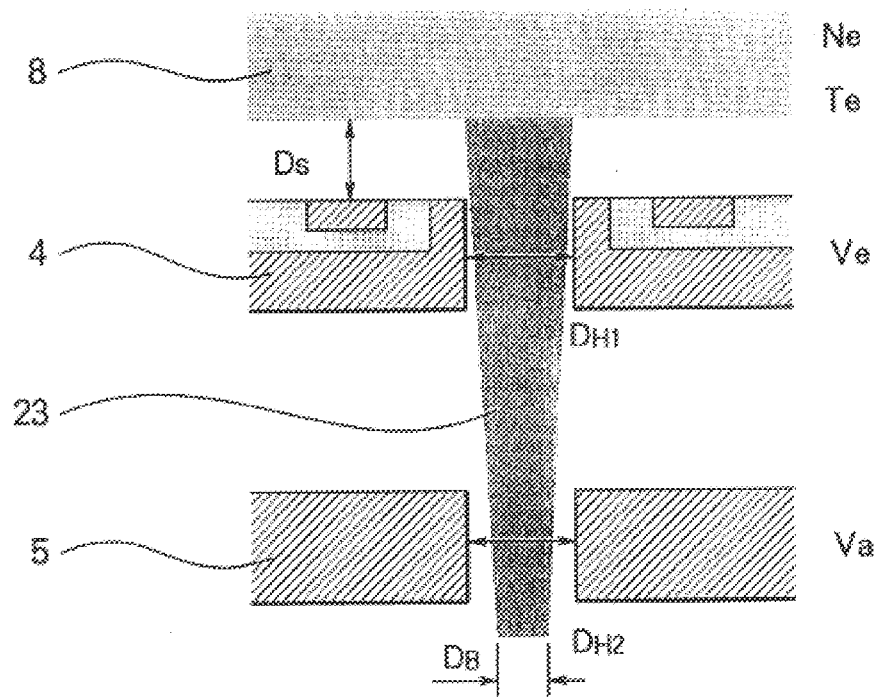
FIG. 16 is diagram showing the principle of the ion extraction in a coarse machining work (to produce a deep hole with a large area) in the first embodiment according to the present invention.

On the other hand, as shown in FIG. 16, even in a case where the electron density is set to a greater value, when the potential discrepancy, namely, the voltage between the sheath edge and the plate electrode is varied, the sheath thickness is also changed. Applying a voltage which is equal to or more than the voltage between the sheath edge and the plate electrode and which satisfies the condition Ds≧½DH1, there can be extracted the plasma without causing the expansion thereof between the extraction electrode 4 and the acceleration electrode 5. Namely, by adjusting the acceleration voltage Va and by utilizing the ion lens effect in the vicinity of the extraction hole, the beam is defocused so as to thereby attain a bold ion beam having a diameter not exceeding the diameter DH2 of the ion passage hole of the acceleration electrode 5. However, according to the method of altering the ion beam diameter without changing the electrode configuration described above, the change in the beam diameter causes the acceleration voltage Va to be altered.

To cope with the problem, in the method of creating a large-diameter high-density ion beam according to the present invention, the electrode configuration is required to be varied to alter the ion beam diameter without changing the acceleration voltage Va. Namely, in place of the extraction electrode 4, there is adopted a tapered extraction electrode 204 including a tapered extraction hole as shown in FIGS. 17 and 18.

Figure 17:
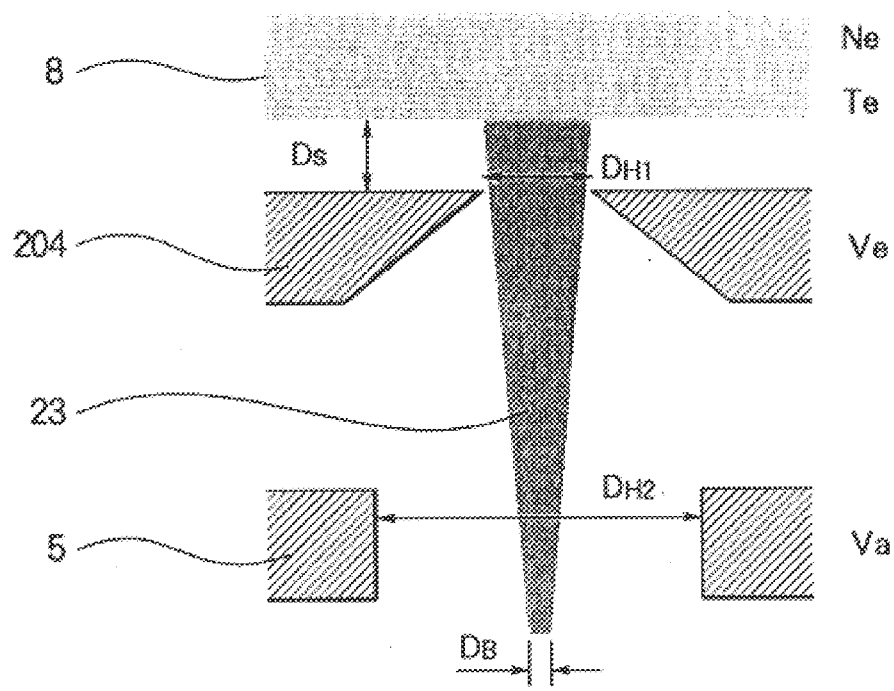
FIG. 17 is diagram showing the principle of the ion extraction in a fine machining work using a tapered extraction electrode in the first embodiment according to the present invention.
Figure 18:
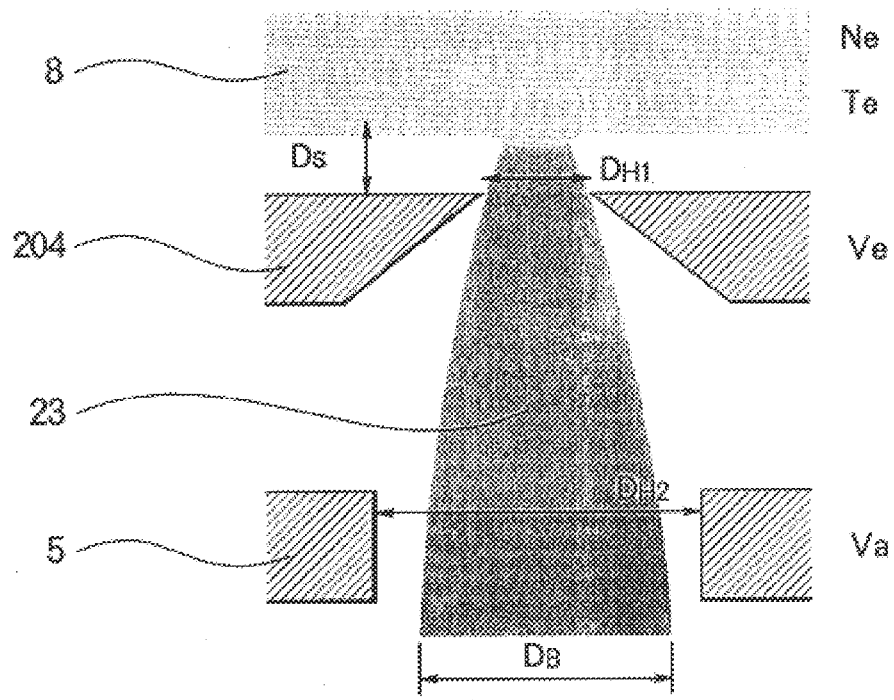
FIG. 18 is diagram showing the principle of the ion extraction in a coarse machining work (to produce a deep hole with a large area) using a tapered extraction electrode in the first embodiment according to the present invention.

FIG. 17 shows a case in which the ion beam diameter is set to a small value of an ordinary fine machining, whereas FIG. 18 presents a state of a case where the electron density Ne is increased with a fixed voltage across the sheath edge and the plate electrode of FIG. 17. In FIG. 18, the sheath thickness is reduced as compared with that of FIG. 17 and hence the condition Ds (sheath thickness)≧½DH1 (extraction hole diameter) is not satisfied. However, when the electron density is increased such that the plasma is not completely expanded between the tapered extraction electrode 204 and the acceleration electrode 5, the ion emission surface or plane is projected toward the ion extracting direction in the peripheral of the extraction hole. Since ions are emitted vertical to the ion emission plane, the beam can be defocused without utilizing the ion lens effect in the proximity of the tapered extraction hole. In this regard, the tapered extraction hole achieves an advantageous effect of preventing the ions emitted from the ion emission plane from being annihilated on side walls of the configuration.

As a result, only by changing the electron density Ne of the plasma, it is possible to produce a high-density ion beam having a large diameter.

Figure 19:
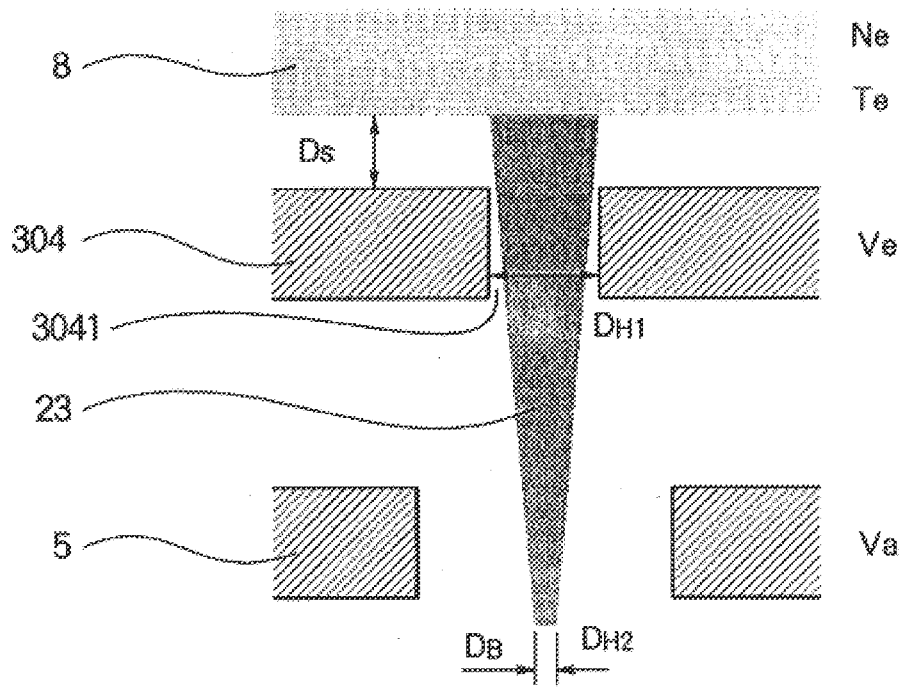
FIG. 19 is diagram showing the principle of the ion extraction in a fine machining work using a movable extraction electrode in the first embodiment according to the present invention.
Figure 20:
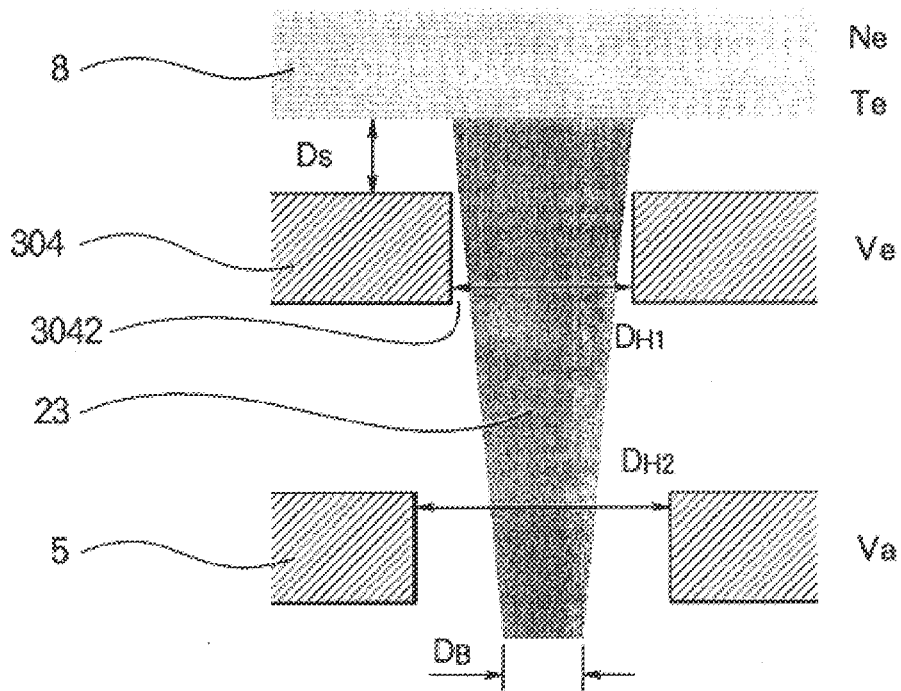
FIG. 20 is diagram showing the principle of the ion extraction in a coarse machining work (to produce a deep hole with a large area) using a movable extraction electrode in the first embodiment according to the present invention.

FIGS. 19 and 20 show a method of altering the ion beam diameter without varying the plasma state, namely, the electron density Ne, the electron temperature Te, and the acceleration potential Va. In the electron configuration, a mobile extraction electrode 304 is adopted in place of the extraction electrode 4. Namely, the electrode 304 has several extraction holes respectively having different diameters. The electrode 304 is horizontally moved when necessary to align on the ion beam axis an extraction hole which has been retracted to a position apart from the plasma and which has a diameter necessary for a desired machining.

After an extraction hole 3041 for the small diameter beam of FIG. 19 is moved from the operative position, an extraction hole 3042 for the large diameter beam of FIG. 20 is placed to match the ion beam axis. To satisfy the condition Ds (sheath thickness)≧2DH1 (extraction hole diameter), the voltage between the sheath edge and the plate electrode is adjusted according to the graph of FIG. 7. Resultantly, without changing the plasma state, namely, the electron density Ne, the electron temperature Te, and the acceleration potential Va, the ion beam diameter can be altered.

In addition, description will be given of another method of varying the ion beam diameter without changing the parameters representing the plasma state, namely, the electron density Ne, the electron temperature Te, and the acceleration potential Va. In the electron configuration, a multi-hole extraction electrode 406 is employed in place of the extraction electrode 4. In the electrode 406, sheath surface control electrodes 404 and 404' and insulating plates 405 and 405' are arranged on extraction holes 4061, 4061' and 4061" in a central position of the multi-hole extraction electrode 406 as shown in FIGS. 21 and 22.

Figure 21:
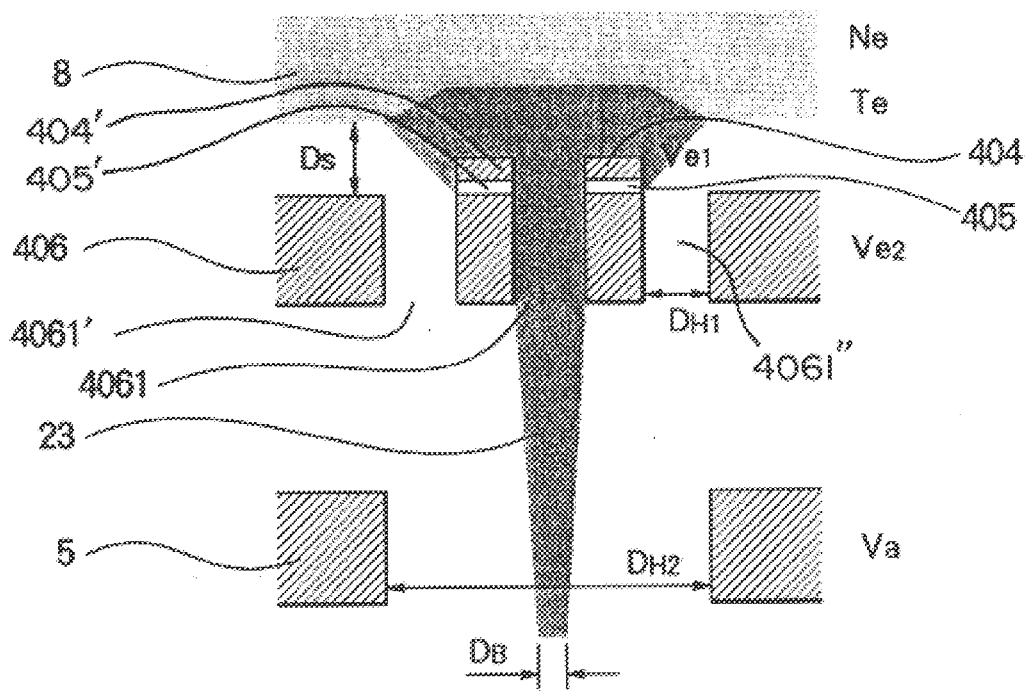
FIG. 21 is diagram showing the principle of the ion extraction in a fine machining work using a multi-hole extraction electrode in the first embodiment according to the present invention.

As shown in FIG. 21, when producing a beam having a small diameter, a voltage is applied to the control electrode 404 to satisfy the condition Ds (sheath thickness)≧2DH1 (extraction hole diameter). Moreover, a voltage not exceeding that of the control electrode 404 is similarly applied to the extraction electrode 406 to satisfy the condition Ds≧2DH1. In this situation, to keep the sheath thickness, the ion emission surface is formed into a contour matching the shape of the control electrode 404. Consequently, by controlling the voltage of the control electrode 404, ions are concentrated onto the central extraction hole 4061 of the extraction electrode 406. Namely, ions are not drawn from the peripheral extraction hole 406'. In consequence, there is attained an ion beam of a small diameter from the central extraction hole 4061.

Figure 22:
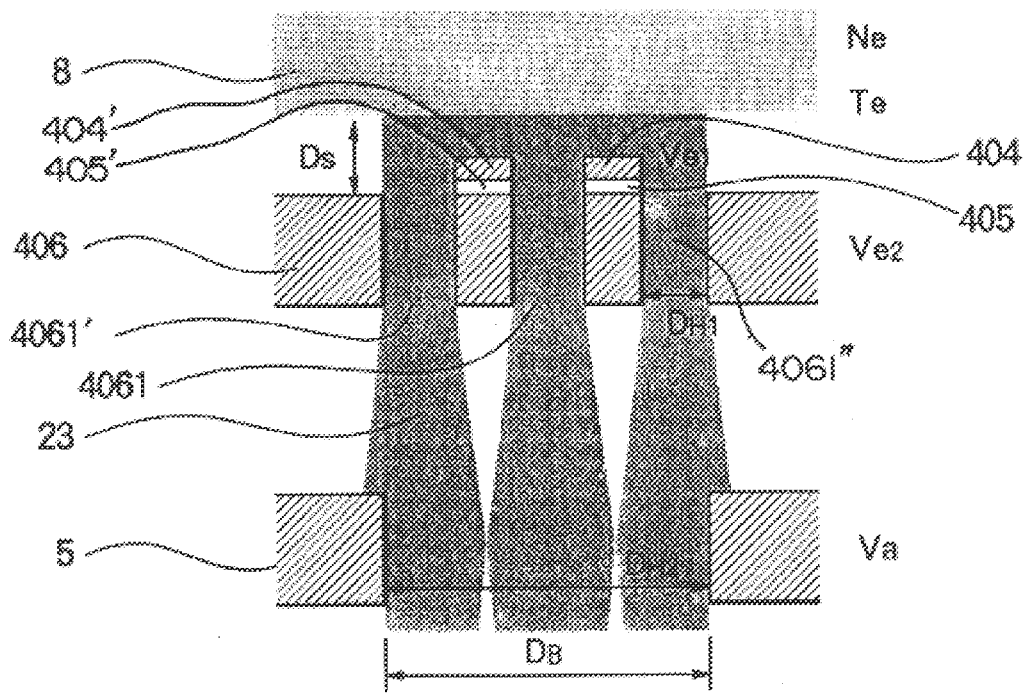
FIG. 22 is diagram showing the principle of the ion extraction in a coarse machining work (to produce a deep hole with a large area) using a multi-hole extraction electrode in the first embodiment according to the present invention.

On the other hand, as shown in FIG. 22, the voltage applied to the control electrode 404 is adjusted while keeping the condition Ds≧2DH1 to reduce the voltage between the sheath edge and the plate electrode until the ion emission surface becomes parallel to the extraction electrode 406. As a result, ions of a fixed current density are uniformly drawn from the overall regions of the extraction holes 4061 and 4061' of the extraction electrode 406. Adjusting the acceleration voltage to develop the ion lens effect in the proximity of the extraction holes 4061 and 4061' so as to defocus the respective beams, there is produced a high-density ion beam with a diameter equal to the passage diameter DH2 (=beam diameter DB) disposed in the acceleration electrode 5.

Next, referring to FIGS. 23 and 24, description will be given of another method of changing the ion beam diameter by altering, like in the case of the tapered extraction electrode 204, the electron density Ne as a parameter representing the plasma. In the electron constitution, there are included a mesh electrode 505 disposed below the extraction electrode 4 with a tapered insulation spacer 506 therebetween and the acceleration electrode 5 below the mesh electrode 505.

Figure 23:
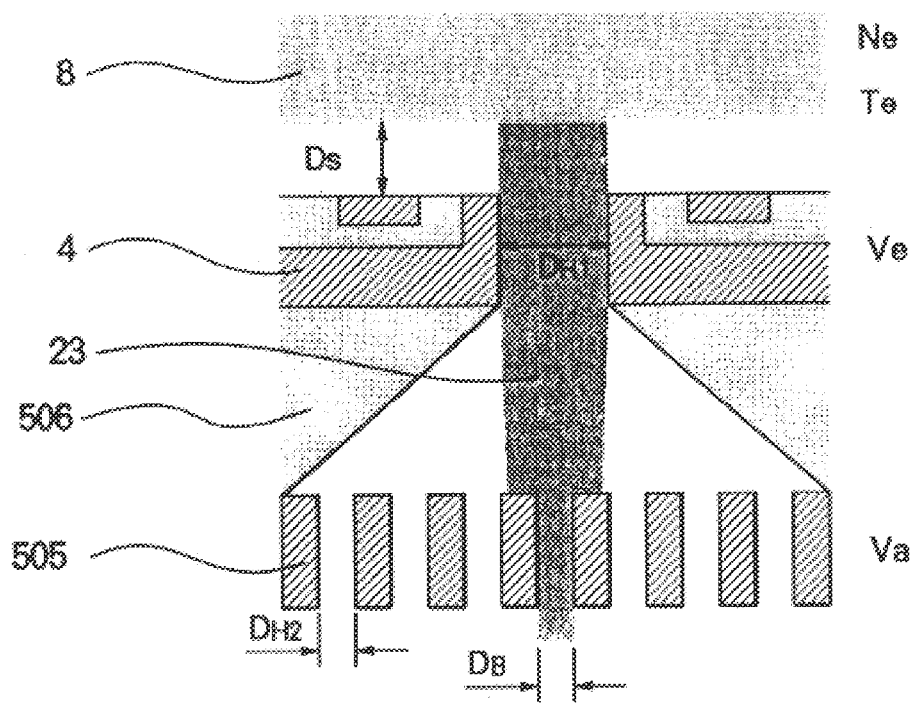
FIG. 23 is diagram showing the principle of the ion extraction in a fine machining work using a tapered insulation spacer and a mesh electrode in the first embodiment according to the present invention.

As shown in FIG. 23, when creating an ion beam with a small diameter, ions are extracted under the condition of Ds≧½DH1. The ions are accelerated by the acceleration voltage applied to the mesh electrode 505 to be passed through a passage thereof having a diameter DH2 smaller than the extraction diameter DH1, thereby obtaining an ion beam of a small diameter. In this connection, when the small-diameter beam is desired to be generated, a secondary acceleration voltage is applied to the acceleration electrode 5 arranged beneath the mesh electrode 505.

Figure 24:
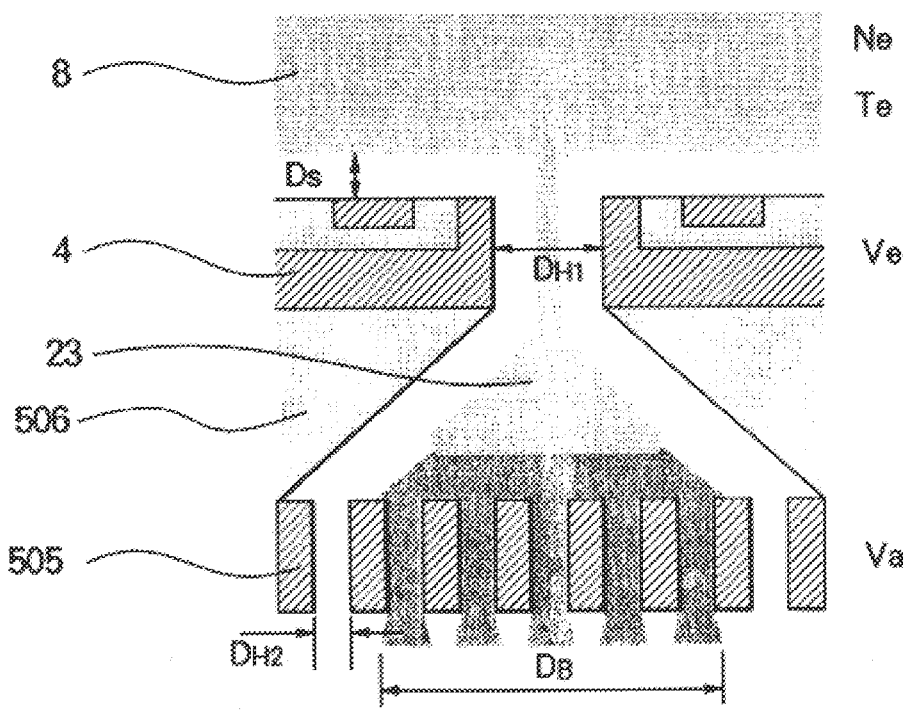
FIG. 24 is diagram showing the principle of the ion extraction in a coarse machining work (to produce a deep hole with a large area) using a tapered insulation spacer and a mesh electrode in the first embodiment according to the present invention.

On the other hand, in the configuration of FIG. 24, the electron density Ne is increased to obtain the condition of Ds (sheath thickness)$\geq \frac{1}{2}$DH1 (extraction hole diameter) so as to vary the plasma state in which the plasma is expanded between the extraction electrode 4 and the mesh electrode 505. The plasma expanded in the space along the tapered edge spacer 506 is brought into contact with the mesh electrode 505. Consequently, the mesh electrode serves the function of an extraction electrode. In this operation, a voltage satisfying the condition Ds$\geq \frac{1}{2}$DH1 is applied to the mesh electrode 505 functioning as an extraction electrode; whereas, the extraction electrode 4 is kept unloaded with any voltage, namely, the electrode 4 is used as a floating potential electrode.

Resultantly, ions are drawn from an extraction hole of the mesh electrode 505 brought into contact with the expanded plasma. When the electron density is further increased, the thickness of the sheath produced on the side walls of the tapered insulation spacer 506 and on the front surface of the mesh electrode 505 is decreased. Namely, the number of extraction holes brought into contact with the plasma is increased and hence a larger number of ion beams are extracted. In this situation, a voltage is applied to the acceleration electrode 5 below the mesh electrode 505 to accelerate the ion beams drawn from the mesh electrode 505. Moreover, the ion beams from the extraction holes may be defocused by use of the ion lens effect in the vicinity of the extraction holes to produce a high-density bold ion beam having a large diameter.

Figure 25:
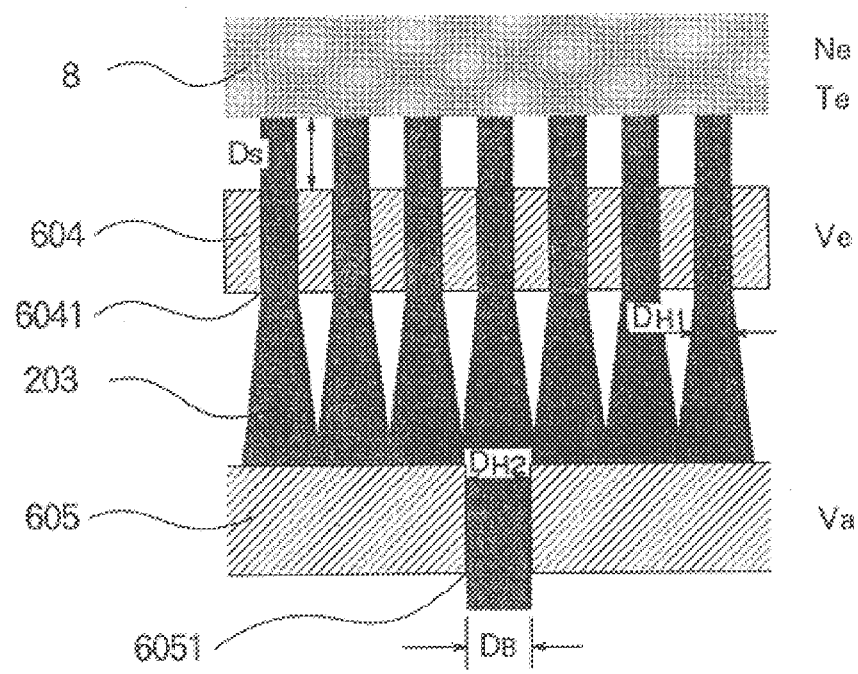
FIG. 25 is diagram showing the principle of the ion extraction in a fine machining work using a mesh extraction electrode and a movable acceleration electrode in the first embodiment according to the present invention.
Figure 26:
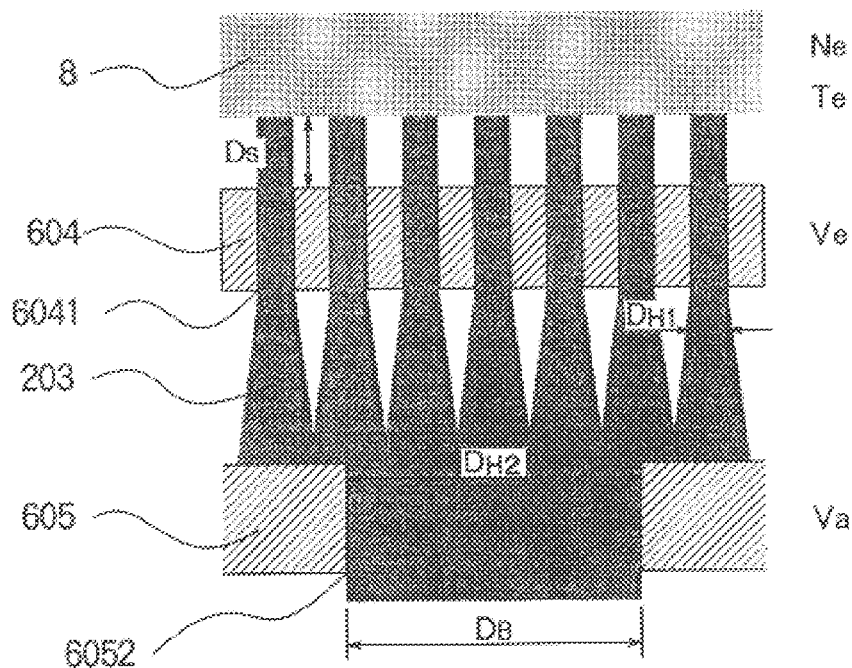
FIG. 26 is diagram showing the principle of the ion extraction in a coarse machining work (to produce a deep hole with a large area) using a mesh extraction electrode and a movable acceleration electrode in the first embodiment according to the present invention.

Furthermore, FIGS. 25, and 26 show a method of varying the ion beam diameter without changing the extraction voltage and the acceleration voltage as parameters representing the plasma state. The electrode configuration includes a mesh extraction electrode 640 and a mobile acceleration electrode 605, and the acceleration electrode 5 therebelow. As shown in FIG. 25, the electron density Ne and the voltage between the sheath edge and the plate electrode are set to values satisfying the condition Ds$\geq \frac{1}{2}$DH1 so as to draw ions from extraction holes 6041 of the mesh extraction electrode 604. Ion beams from the extraction holes are uniformly accelerated by the mobile acceleration electrode 605. However, when generating an ion beam with a small diameter, only an extraction hole having beam diameter DB is opened for the small-diameter beam. Namely, ions not allowed to pass therethrough are annihilated on the surface of the acceleration electrode 605. In this connection, the ion beam from the acceleration electrode 605 is subjected to a secondary acceleration by the acceleration electrode 5 therebelow (not shown; FIG. 22).

On the other hand, in the configuration of FIG. 26, the passage hole 6052 of a large diameter retracted to a position apart from the plasma in the fine machining operation of FIG. 25 is mechanically moved in the horizontal direction to be set to the ion beam axis. As a result, ion beams not passing through the mobile acceleration electrode 605 in the state of FIG. 25 are allowed to pass therethrough such that the ion beams are thereafter subjected to the secondary acceleration by the acceleration electrode 5 therebelow (not shown; FIG. 22), thereby attaining a high-density ion beam having a large diameter. Incidentally, in either cases of FIGS. 25 and 26, ion beams are defocused according to the ion lens effect in the neighborhood of the extraction holes 6041.

As above, in the machining of a deep hole with a large area, thanks to the FIB apparatus including the mechanism for producing a high-density ion beam with a large diameter, the observation of a cross section and the modification of wirings can be conducted in a short period of time for semiconductor wafers and/or devices in the semiconductor production line.

In addition, the FIB processing apparatus employing the plasma ion source according to the present invention is free of contamination of samples due to metal ions and is hence applicable to a silicon wafer examining facility, a secondary ion mass spectrometer, a surface foreign matter checking system, an FIB assist deposition, etc. Also, due to the apparatus, LSI devices and masks can be corrected or modified in the semiconductor production line, leading to improvement of the product yield. Moreover, in a field of the evaluation measurement of an ion micro analyzer or the like, an SIM image of the sample to be examined can be observed without causing contamination of the sample due to metal ions. The apparatus is easily applicable to an analyzer such as a secondary ion mass spectrometer.

EMBODIMENT 2

In conjunction with the second embodiment, there will be described an FIB apparatus employing a germanium EHD ion source (Ge-EHD ion source) in which germanium as an elementary material is adopted to produce a focused ion beam.

Figure 28:
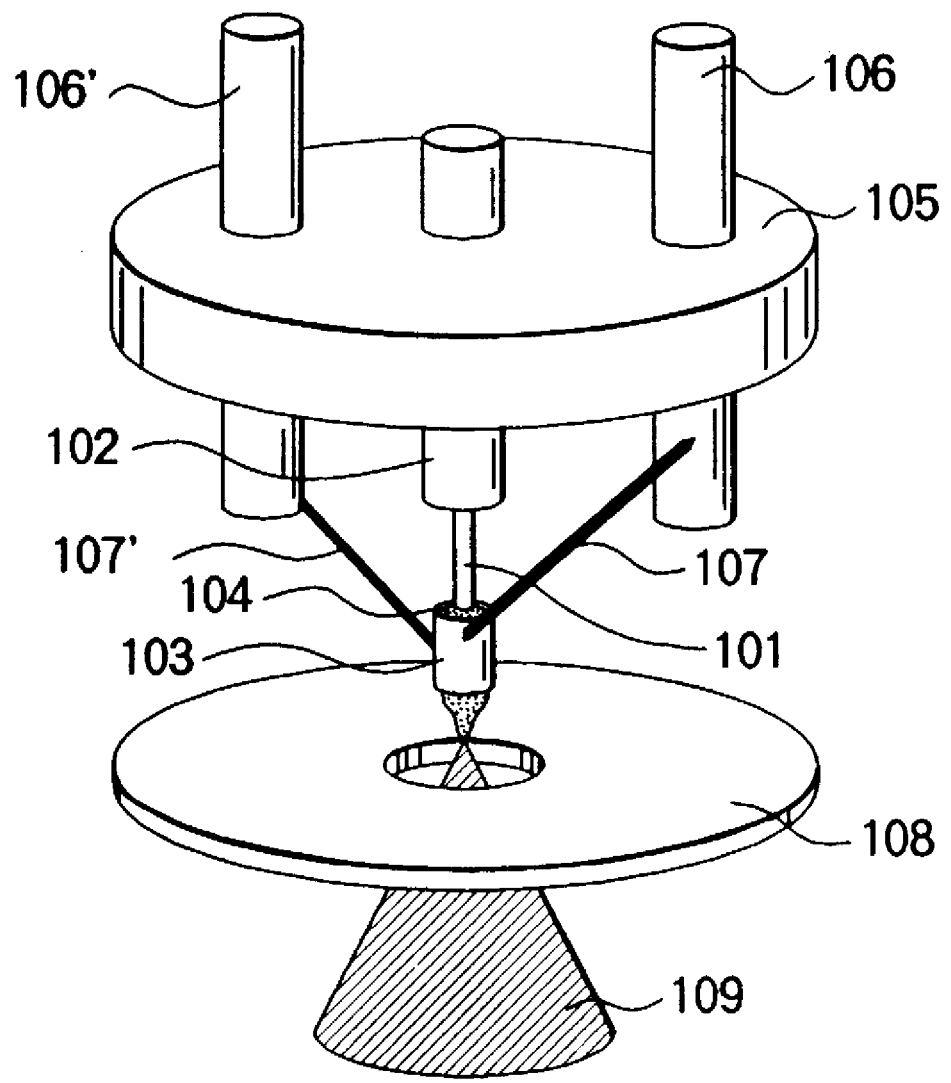
FIG. 28 is an illustrative configuration diagram for explaining the germanium liquid metal ion source.
Figure 29:
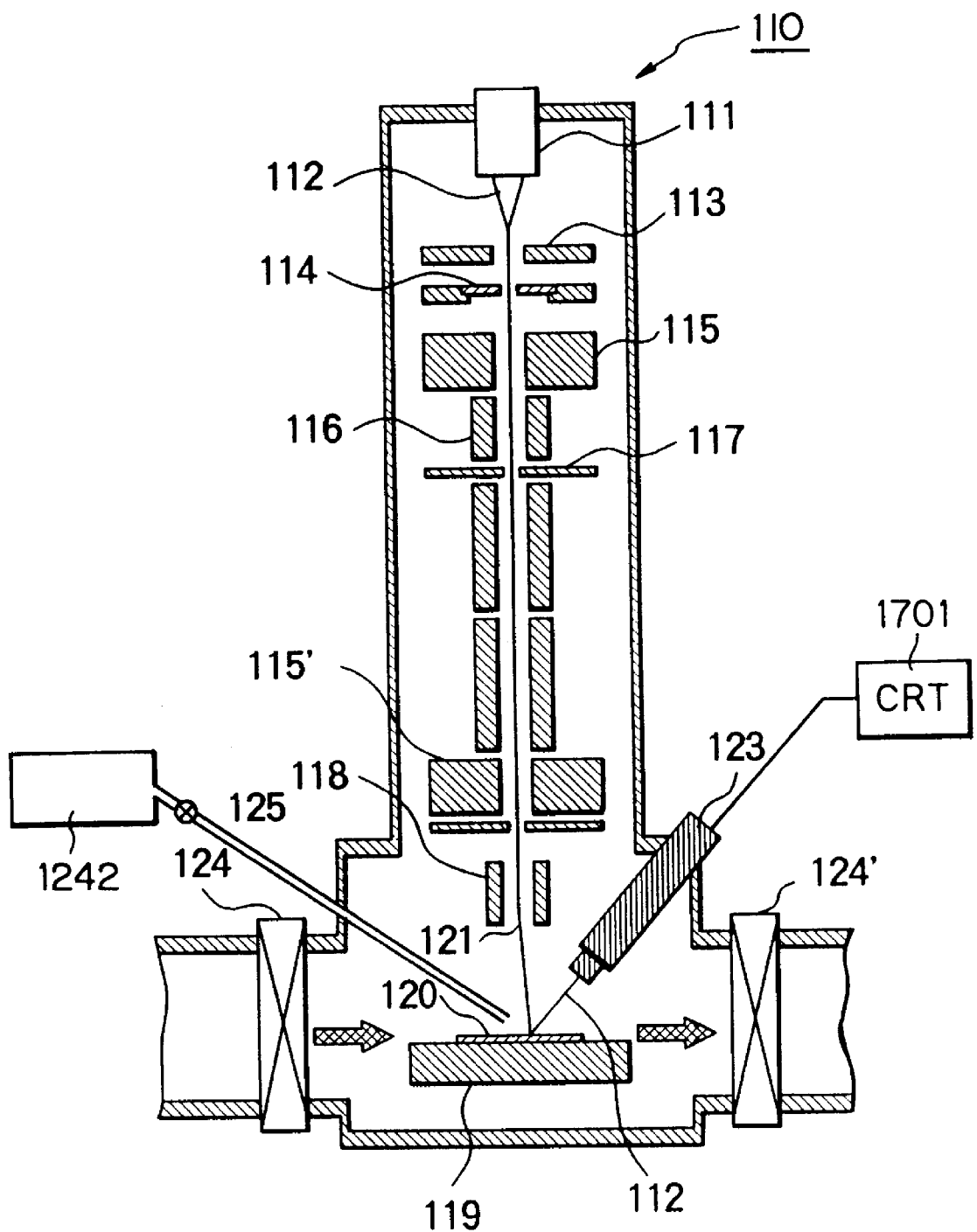
FIG. 29 is a schematic configuration diagram for explaining a silicon wafer examining apparatus including a germanium liquid metal ion source in a second embodiment according to the present invention.

First, FIG. 28 shows the overall construction of the Ge-EHD ion source according to the present invention. In FIG. 29, a reference numeral 101 indicates a needle electrode (also called an emitter), a numeral 103 denotes a storage (reservoir), numerals 107 and 107' stand for conductors (filaments), a numeral 108 designates an extraction electrode.

The emitter 101 is fixedly attached onto an emitter supporting terminal 102 to pass through the reservoir 103. In the reservoir 103, there is stored an ion material (germanium as an elementary material in this embodiment) 104. With a current supplied through current conducting terminals 106 and 106' fixed onto an insulating base plate 105, the filaments 107 and 107' and the reservoir 103 are heated such that germanium 104 is melted in the reservoir 103 to reach an apex of the emitter 101. Under this condition, when a high voltage (of which a power supply and the like are not shown) negative with respect to the potential of the emitter 101 is applied to the extraction electrode 108, the melted germanium 104 is emitted as ions 109 from the apex of the emitter 101.

The emitter 101 is specifically configured in a needle-like form. The shaft diameter thereof is about 0.25 mm, a radius of the end point thereof is about 50* and a radius of curvature at the end point is about two micrometers. The reservoir 103 has an overall contour of a cylinder. The inner diameter of the reservoir 103 is about 0.7 mm, the outer diameter thereof is about 1.0 mm, and the height is about two millimeters. The emitter 101 and the reservoir 103 are made of a carbide of tungsten or wolfram (WC), not wolfram (W) which has been commonly employed for this purpose. Moreover, the filaments 107 and 107' each having a diameter of about 0.1 mm is also made of a carbide of wolfram (WC), whereas the base plate 105 is manufactured with an alumina ceramic.

The operation temperature (reservoir temperature) of the configuration is set to from 950° C. to 970° C. to expectedly obtain a long-life operation. At an operation temperature equal to or more than 1000° C., the ion material is excessively vaporized. Namely, this operational condition is undesirable for the following reasons. The life of the system is possibly minimized; moreover, the ion material is fixed onto the isolator substance to cause a breakdown. Conversely, at an operation temperature equal to or less than 950° C., germanium is solidified on the end portion of the emitter 101, which also disables the stable ion emission.

The ion source has the following advantages.

☐ Thanks to adoption of germanium as an elementary element for the ion material, neither heavy metals nor dopant element ions are contained in the ion beam, thereby preventing contamination of surfaces of the sample by heavy metals and dopant elements.

☐ Utilization of a carbide of tungsten as the substance to fabricate the emitter and the reservoir, the reaction thereof with the melted germanium is suppressed to elongate the life thereof, which resultantly increases the interval of time for the replacement of the ion source.

Referring now to FIG. 29, description will be given of an example in which an embodiment of the FIB apparatus including the Ge-EHD ion source is applied to a silicon wafer examining facility in accordance with the present invention.

In an FIB apparatus 110 having the maximum acceleration voltage 30 kV, there is installed a Ge-EHD ion source 111 according to the present invention. In the configuration, a reference numeral 112 indicates an emitter of the Ge-EHD ion source and a numeral 113 stands for an extraction electrode. This system includes an FIB optical system including a beam limiting aperture 114 for restricting expansion or diffusion of ions emitted from the ion source 111, focusing lenses 115 and 115', an EXB mass separator (Wien filter) 116 in which an electric field and a magnetic field are superimposed onto each other, an aperture 117, and a deflector 118. Onto a sample 120 on a sample stage 119, a Ge-FIB 121 is irradiated such that secondary electrons 122 emitted from the irradiated position are caught by a secondary electron detector 123 so as to synchronize the deflection of the Ge-FIB 121 with the scanning of the CRT (not shown), thereby displaying on the CRT a secondary electron image of the scanning region of the Ge-FIB 121.

An aspect of the second embodiment according to the present invention resides in that the beam limiting aperture 114 and the aperture 117 are made of silicon plates for the following reasons. Germanium ions emitted from the ion source 111 is irradiated onto components of the ion optical system, particularly, the aperture 114 and the aperture 117 such that secondary particles and ions therefrom arrive as contamination substances at the sample. To overcome this difficulty, molybdenum and tungsten which have been usually adopted for the aperture or the like in the conventional system are not utilized. Namely, there are used silicon plates in this embodiment. In addition to silicon plates, a carbon plate as well as a plate of a carbide of silicon have also developed the similar advantageous effect.

Using a germanium ion beam focused by the FIB irradiation system of the above structure, there is obtained a secondary electron image. According to the resolution of the image, it has been determined that the beam has a diameter of about 70 nanometers.

In addition, thanks to the above configuration, it is possible to arbitrarily extract as a sample a wafer being conveyed through the production line. The sample is installed in or removed from a sample chamber 125 separately arranged by valves 124 and 124' in the system. Consequently, the sample 120 can be checked or modified in the production line and hence there is obtained an advantage of reduction of the turnaround time from the check to the correction of process conditions.

Next, description will be given of an example of the sample check by the silicon wafer examining apparatus.

Assume that the sample check is conducted to confirm whether or not each insulation layer between multiple wiring layers is formed with a predetermined thickness. For an appropriate operation of a multilayer wiring configuration, it is essential that an insulation layer between wiring layers has a preset film thickness and a predetermined breakdown voltage. However, in a device employed for the sample check, the formation of the insulation layer has not a satisfactory reproducibility. For example, the thickness thereof is less than the preset value in a few samples, which leads to a leakage current between the wirings and hence deteriorates the production yield.

Figure 30:
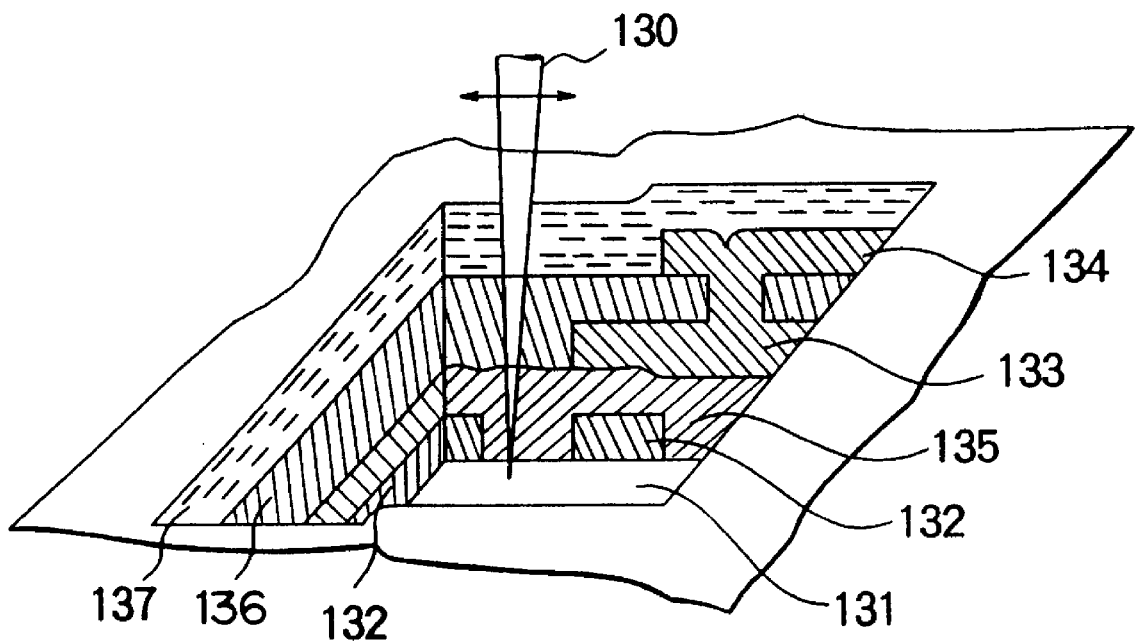
FIG. 30 is a diagram for explaining an advantage of the silicon wafer examining apparatus according to the present invention in which an appearance of a square hole produced on a wafer by a germanium focused ion beam is shown.

To observe a cross section of the device in this situation, there is randomly extracted a silicon wafer from the production line such that the Ge-FIB is irradiated onto a particular position of a predetermined sample device of the wafer so as to form a cross section for the observation. FIG. 30 shows in a three-dimensional fashion an appearance of the operation to irradiate FIB onto a zone of a surface of the silicon wafer. Through the scanning operation using a Ge-FIB 130, there is produced a rectangular hole 131 having an edge of about five micrometers and a depth of about five micrometers. For a cross section (side wall) of the three-layer wiring structure, there is produced a secondary electron image thereof by the FIB irradiation, thereby observing and examining the cross section. In FIG. 30, the configuration includes a first layer wiring 132, a second layer wiring 133, a third layer wiring 134, a first inter-layer insulation film 135, a second inter-layer insulation film 136, and a surface protection layer 137. It can be observed from this constitution that the first layer wiring 132 is isolated from the second layer wiring 133 and the second layer wiring 133 is vertically connected to the third layer wiring 134. Paying attention to the second layer wiring 133 and the insulation layer 135 between the first layer wiring 132 and the second layer wiring 133, the pertinent portion is magnified for observation as shown in FIG. 31.

Figure 31:
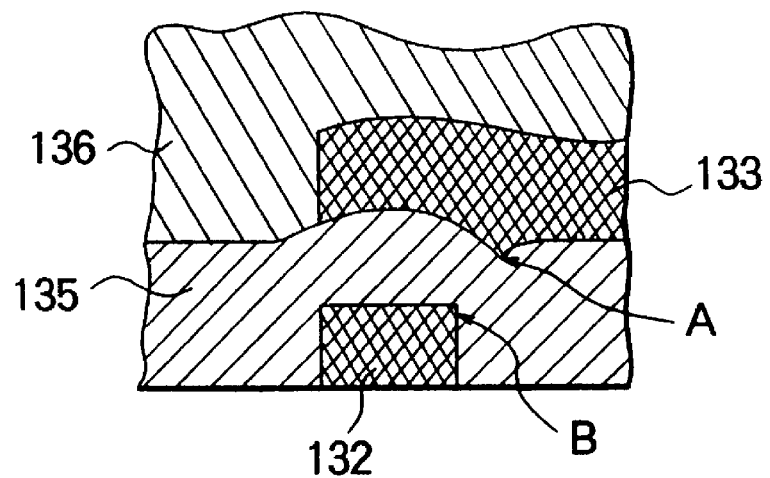
FIG. 31 is a magnified cross-sectional view for explaining causes of a breakdown between wirings detected by the silicon wafer examining apparatus according to the present invention.

As can be seen from FIG. 31, the insulation layer has an uneven upper surface and hence it is possible to observe that a portion (point A) of the second layer wiring 133 is in the vicinity of a point B of the first layer wiring 132. Consequently, it is recognized that the breakdown voltage is lowered in the region between the points A and B. For the wafer, there are selected ten positions for the devices check. As a result of the sample check, the same tendency is obtained for all devices. Consequently, conditions of the flattening process of the first inter-layer insulation film 135 are modified so as to conduct the same sample check thereafter. As a result of the check, the predetermined dimensions and breakdown voltage are appropriately obtained at all check points. The wafers and a lot thereof are assumed to be acceptable and hence are subjected to the subsequent process. According to the check method above, failed items can be detected before the items are sent to the next process in the multi-layer wiring production, which hence considerably contributes to improvement of yield of the final products.

The apparatus described above leads to the following advantages. ① Adopting the Ge-EHD ion source as an ion source of the first ion beam irradiation system, heavy metals and dopant element ions are prevented from being emitted from the ion source. ② Parts of the ion optical system, particularly, the beam limiting aperture and the aperture are formed with silicon plates. Consequently, it is possible to prevent secondary particles of heavy metals and the like due to the ion beam irradiation so as to avoid contamination by impurities.

③ In the configuration, the sample wafer can be arbitrarily obtained from the production line. The sample may be installed in and removed from the sample chamber. This allows the sample check to be achieved in the production line and saves the turnaround time.

According to the embodiment, the Ge-FIB is used as the primary ion beam. However, for the primary ion beam, there may be adopted an Si-FIB or a mixed beam of silicon and germanium obtained by using a silicon-germanium alloy as the ion material. Moreover, the sample check has been described as the observation of a cross section of the multi-layer wiring zone in conjunction with the embodiment. However, the present invention is not restricted by the sample check. There may be naturally achieved, for example, fabrication of a contact hole for an electronic beam probing as well as modification of a short-circuited portion of the surface wiring by removing a portion thereof.

In addition, according to the embodiment, a silicon wafer is used as the sample and hence there is employed a Ge-EHD ion source; moreover, the aperture of the ion beam irradiation system for passage of the Ge-FIB is made of a silicon plate. However, when the sample is a material other than a silicon wafer, the ion source and the aperture material will be altered. For example, when an arsenide of gallium (GaAs) is selected as the sample, there may be used a Ga-EHD ion source and the aperture of the ion beam irradiation system may be formed with an antimony (Sb) plate.

Furthermore, the ion beam processing apparatus utilizing the ion source is not limitatively applied to the silicon wafer check facility. It is to be appreciated that the apparatus is easily applied to, for example, a secondary ion mass spectrometer, a surface foreign matter investigation system, and an FIB assist deposition.

THIRD EMBODIMENT

By reference to FIG. 32, description will now be given of the third embodiment according to the present invention in conjunction with an FIB apparatus including an argon gas field ionization ion source (Ar-FIS) in which ions are obtained through a field ionization of an argon gas.

Figure 32:
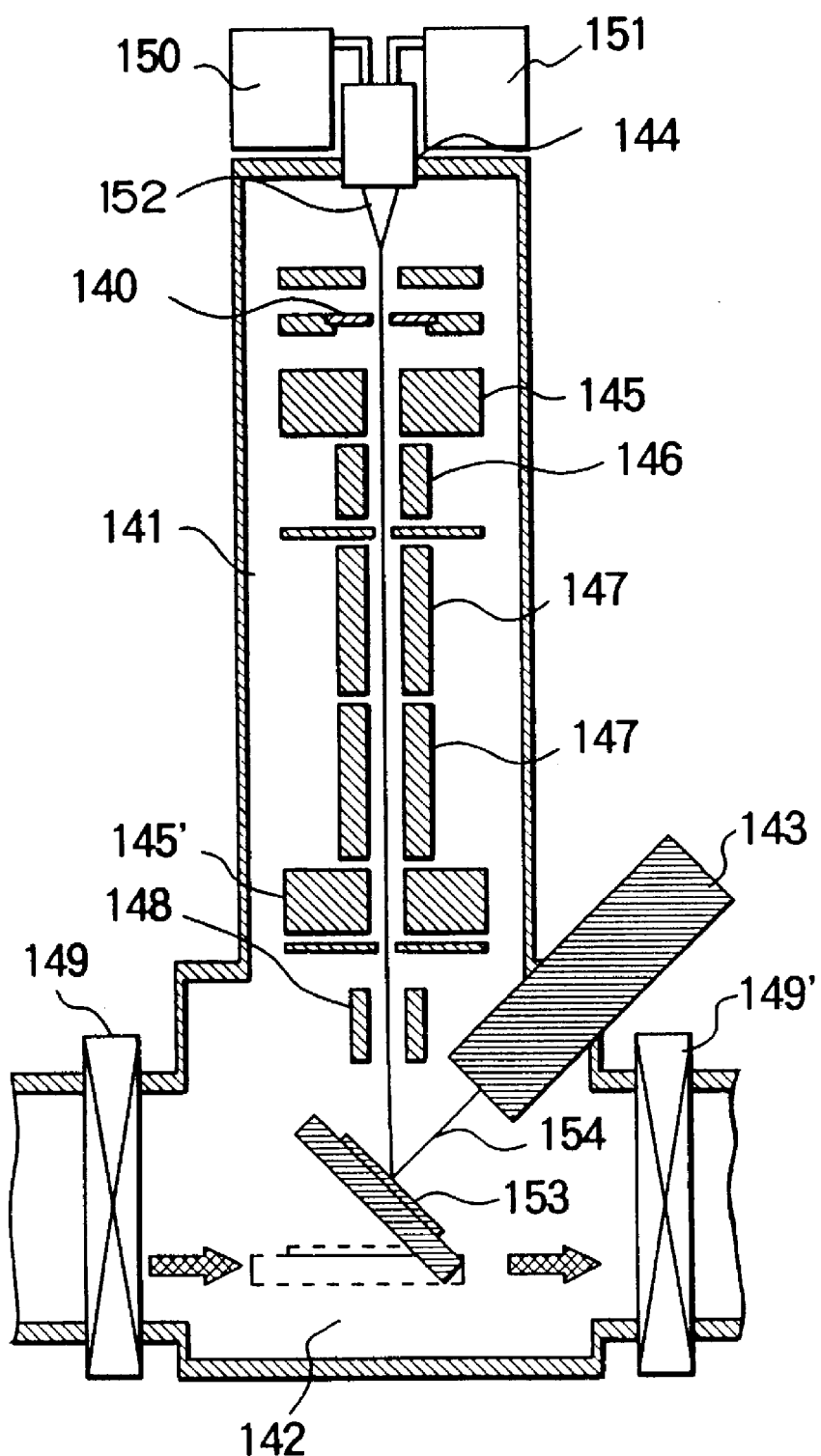
FIG. 32 is a schematic construction diagram useful to explain an inline secondary ion mass spectrograph using an ion source of an argon field ionization gas in a third embodiment according to the present invention.

FIG. 32 shows an example in which the FIB irradiation system 141 including the Ar-FIS ion source of the present invention is installed in a secondary ion mass spectrometer (SIMS) 140. The SIMS 140 basically includes a primary ion beam irradiation system 141 including the FIB optical system of the prior art, a sample chamber 142, and a secondary ion analyzer 143.

In the configuration, a reference numeral 141 indicates an ion beam irradiation system including an Ar-FIS 144, focusing lenses 145 and 145', an EXB mass spectrometer 146, an aligner 147, a deflector 148, a gas container 150 filled with the argon gas, and a cooler 151 to cool an emitter 152. An aspect of the structure is the ion generating section including the Ar-FIS 144.

Argon ions produced through the field ionization from the ion source 144 and focused by the focus lenses 145 and 145' into a high-density ion beam having quite a small diameter are irradiated onto a sample 153. Resultantly, secondary ions 154 are emitted from the irradiated position to be subjected to a mass spectrometry in the secondary ion analyzer 143, thereby achieving a composition analysis in the proximity of the surface of the sample.

The SIMS including the conventional FIB irradiation system uses gallium as the primary ion beam species, which consequently leads to problems as follows. When a sample once analyzed is restored to the semiconductor production line again, there occurs contamination of the production line. Moreover, during the sample analysis (by irradiating the ion beam onto the sample), drops of gallium are accumulated in the analyzer and hence reliability of the analysis results is lowered.

However, with adoption of the SIMS including the Ar-FIB according to the present invention, the analyzed sample can be restored to the production line without causing a metal contamination of the sample surface by gallium or the like. In addition, during the sample analysis, the analysis data is free of influences from the primary ion beam.. Consequently, the SIMS is applicable as a reliable analyzer to the semiconductor manufacturing line. Also, the analysis sensitivity of the focused ion beam according to the present invention is substantially identical to that of the Ga-FIB.

As above, in the SIMS to which the FIB processing apparatus utilizing the Ar-FIS as its ion source is applied, a wafer transported through the semiconductor production line can be arbitrarily extracted as sample. The sample may be installed in and removed from the sample chamber. This consequently leads to advantages that the sample can be checked in the production line and the turnaround time is minimized.

Furthermore, the ion beam processing apparatus adopting the ion source is not limitatively applied to the SIMS. It is to be appreciated that the apparatus is easily applied to, for example, a silicon wafer examining facility, a surface foreign matter investigating apparatus, and an FIB assist deposition.

FOURTH EMBODIMENT

In the fourth embodiment according to the present invention, there is implemented a focused ion beam apparatus utilizing an electrohydrodynamic xenon ion source (Xe-EHD ion source).

Figure 33A:
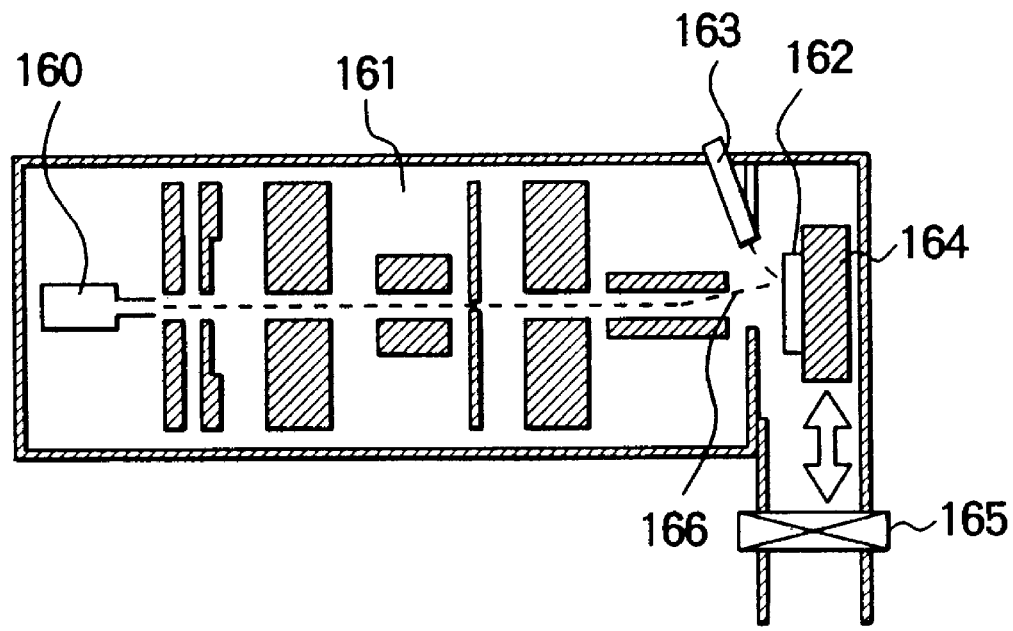
FIG. 33A is an illustrative cross-sectional view for explaining a surface foreign matter remover employing a xenon EHD ion source in a fourth embodiment according to the present invention.
Figure 33B:
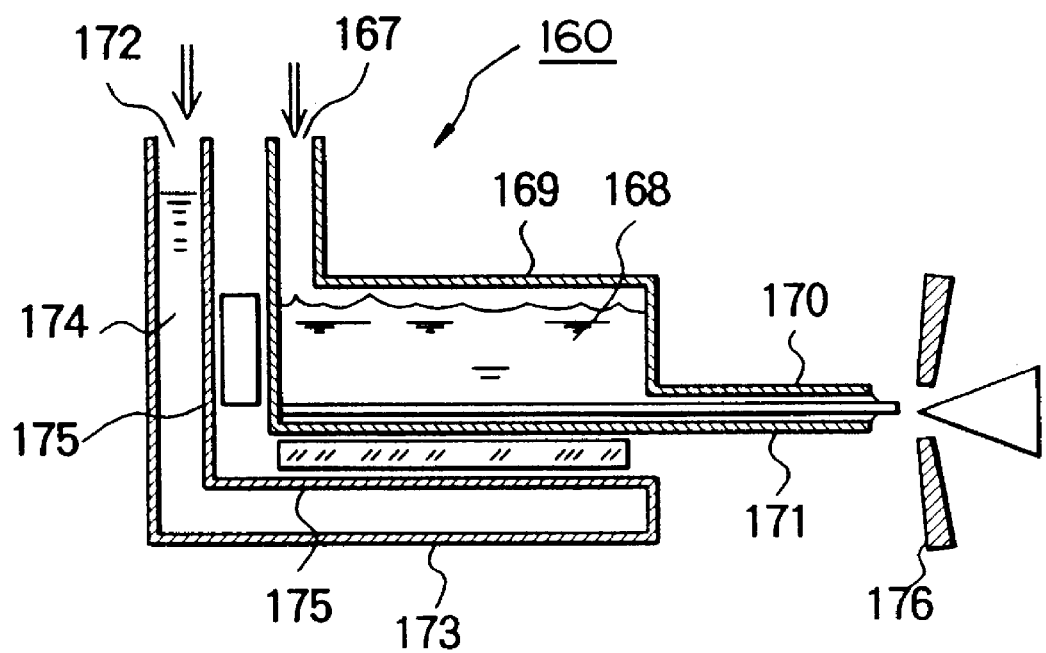
FIG. 33B is a schematic cross-sectional view useful to explain the a xenon EHD ion source of FIG. 33A.

FIG. 33B schematically shows a cross section of the ion source according to the present invention. In this configuration, an ion source 160 is an EHD ion source in which a liquid of xenon 168 supplied from a feeding hole 167 is stored in a reservoir 169 such that a portion thereof reaches through a capillary 170 an end edge of the reservoir 169. Through the capillary 170, there is disposed an emitter 171 to concentrate an electric field. The liquid xenon 168 in the reservoir 169 is cooled as follows. A fluid of nitrogen 174 is supplied from a feeding tube 172 into a cooling bath 173 coupled with the reservoir 169 by a sapphire plate 175 having a high thermal conductivity, thereby keeping the reservoir 169 at an appropriate low temperature. The liquid xenon 168 in the vicinity of the emitter is ionized in the EHD mode in a high electric field formed by an extraction electrode 176 at the apex of the emitter 171. The resultant xenon ions are focused through the FIB irradiation system 161 into a focused ion beam.

Subsequently, description will be given of a foreign matter remover to remove foreign matters from quite a small surface area by an FIB apparatus including the Xe-EHD ion source according to the present invention.

In the recent development of the semiconductor production, the cleaning technology is remarkably advanced. However, it cannot be expected to completely remove dust and dirt and hence the remaining dust and dirt may possibly be mixed into device materials, leading to a failed device. Particularly, when such a mixture of dirt and dust takes place in an insulation layer or in a region between wiring layers, a fatal error occurs in the device operation. Moreover, in a case of a device which is produced as a single item through its particular production line and which is hence quite expensive, for example, an ultra-large scale integration (ULSI) device to be used in a super computer, failures such as a short circuit between wirings due to dirt and dust are required to be prevented. In consequence, it has been desired to provide a modification or correction apparatus capable of detecting such a failure at an early stage and coping with the failure at the position where the failure is detected.

The foreign matter removing system including the FIB apparatus using the Xe-EHD ion source according to the embodiment is operated after each of the etching, film forming, and other processes. Small foreign matters fixed onto a surface of a wafer is first detected by an apparatus to detect foreign matters on a wafer surface. The foreign matters are then removed by the removing apparatus. Particularly, to remove foreign matters which cannot be satisfactorily removed according to the prior art, the Xe-FIB is irradiated onto a pertinent area related thereto. As a result of the sputtering etch process in the particular area, the foreign matters such as dirt and dust are removed.

FIG. 33A schematically shows a cross section of the foreign matter remover viewed from a position thereabove. The remover includes an ion source 160, an FIB irradiation system 161, a sample 162, and a secondary electron detector 163. In the device production line, there can be achieved installation and removal of a sample stage 164 via a valve 165. An Xe-FIB 166 focused by the beam irradiation system 161 is emitted onto the sample 162.

Next, description will be given of a sample check operation in which an Si-ULSI device of a super computer is used as the sample.

Figure 34A:
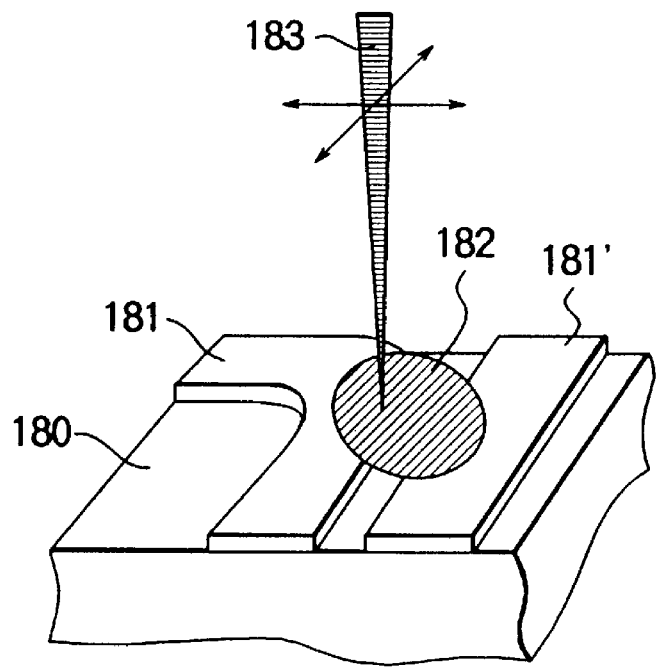
FIG. 34A is a diagram schematically showing a foreign matter fixed onto a device surface to explain advantages of the surface foreign matter remover of the fourth embodiment according to the present invention.
Figure 34B:
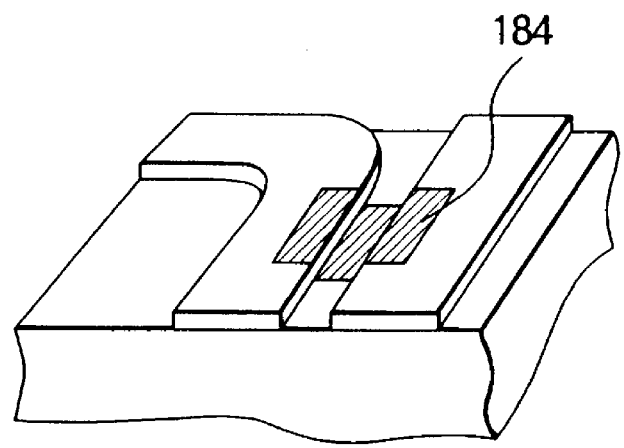
FIG. 34B is a diagram illustratively showing an appearance of the device surface of FIG. 34A after removal of the foreign matter by a focused xenon ion beam to explain advantages of the surface foreign matter remover of the fourth embodiment according to the present invention.

FIG. 34A shows a magnified portion of a surface of the wafer 180 in which a foreign matter 182 is fixed onto wiring regions 181 and 181'. In this case, since the foreign matter 182 is conductive, a short circuit occurs between the wirings 181 and 181'.

To remove a foreign matter, the sample surface is investigated by the surface foreign matter investigator (not shown). When the foreign matter is detected, information of an accurate position thereof is memorized to be fed to the foreign matter remover of the embodiment. Through an automatic control of the sample stage 164, the foreign matter can be moved to a position matching the ion beam irradiation. Next, the Xe-FIB is irradiated with a lower current onto an area which is slightly larger the foreign matter and which encloses the foreign matter so as to observe a sample surface image produced by secondary electrons emitted as a result of the beam irradiation, thereby confirming the foreign matter 182. The foreign matter 182 in this case has a global shape with a diameter of about one micrometer. Increasing the current of the Xe-FIB 183, the area including the foreign matter 182 is scanned by the Xe-FIB 183. After the irradiation is conducted about ten minutes, although there remains a trace of irradiation 184 on the sample surface, the foreign matter 182 can be completely removed therefrom so as to recover the failed portion of the short circuit between the wirings 181 and 181', thereby restoring an appropriate breakdown voltage therebetween.

Since the Xe-FIB is produced from xenon which forms a noble gas, there is obtained a remarkable advantage that the FIB irradiation can be accomplished without causing contamination on the surface of the sample.

The ion beam processing apparatus adopting the plasma ion source is not limited to the foreign matter removing facility. Namely, the apparatus is also applicable to removal of a thin oxide film fabricated on a surface, observation of a sample by a scanning electron microscope, and observation a sample surface with a clear contrast by use of the FIB. In addition, the apparatus can be easily applied to an FIB machining facility, a silicon wafer investigator, a secondary ion mass spectrometer, an FIB assist deposition, etc.

FIFTH EMBODIMENT

In the fifth embodiment, there is utilized an ion source having basically the same configuration as that of the Ge-LMIS of the second embodiment. However, the difference resides in that silicon in the form of an elementary material is adopted as the ion species. Namely, according to the embodiment, an Si-LMIS is used as the ion source. A liquid of silicon has quite a high activity and hence quite rapidly reacts with tungsten conventionally utilizes as the emitter material. This leads to a problem that the emitter is broken and the ion emission is stopped in a short period of time. In contrast thereto, a carbide of tungsten is adopted to fabricate the emitter and the reservoir so as to minimize the reactions thereof with the melted silicon, thereby realizing a long operation life of at least 500 hours in a cumulative total.

Next, description will be given of an example of application of the Si-LMIS ion source of the embodiment to a fine film forming apparatus using a focused ion beam, namely, to an FIB assisted deposition (FIBAD).

In this embodiment, an Si-FIB is created from the LMIS in which silicon as an elementary material is used for the ion material. Combining the Si-FIB with an organic metal gas to collide the resultant gas against an area including the FIB irradiation position, which leads to reactions between the FIB and the gas to resultantly fabricate tungsten or wolfrum (W) wiring regions.

According to a well known example of the FIBAD, to debug or examine wirings of a semiconductor device almost completely fabricated as a final product, there is accumulated a wiring of tungsten by use of a gas of hexacarbonyl tungsten (W(CO)6) and a Ga-FIB. Namely, there is carried out modification of wirings. For example, for a device under process of the production in which a portion thereof has a failure due to a circuit design error or the like and hence which cannot achieve a desired operation, wirings are required to be changed for modification thereof. According to the debug scheme employed before the FIBAD becomes feasible, a new photo mask is additionally prepared to conduct the same processes to produce the device. Consequently, at least one month is required to achieve another debug of the device and hence quite a long period of time and a great cost are necessary to obtain a desired final product. On the other hand, with provision of the FIBAD, only the failed position is modified and hence the modification is finished in a short period of time. This remarkably saves the time and cost.

However, the FIBAD has heretofore been attended with a fatal problem, namely, a short life of the modified Si device for the following reasons. In the debug stage, to manufacture a new wiring region, the organic metal gas and the Ga-FIB are adopted to accumulate metal atoms on the device surface. In this operation, gallium atoms are fixed onto the device surface and function as acceptors with respect to silicon atoms. This consequently causes an electric deterioration of the device in a short period of time.

Namely, the problem is associated with species of the primary ion beam.

To overcome the disadvantage, the Si-LMIS described in conjunction with the second embodiment is utilized in place of the conventional Ga-LMIS. This leads to an advantage that silicon used in the Si-LMIS is identical to the material of the substrate and hence the electric contamination do not occur. Conventionally, silicon ions were emitted from LMIS as the following. Using an Au-Si alloy, silicon ions can be attained at a low melting point. However, according to this method, gold (Au) atoms contained in the ion material are dispersed due to a thermal vaporization and the like to cause a heavy metal contamination in the silicon device fabrication process.

Accordingly, silicon as a simple substance is utilized to produce silicon ions in this embodiment. There has been a problem that the melted silicon is quite active and reacts quite rapidly with tungsten as the conventional emitter material such that the emitter is resultantly broken and the ion emission is terminated in a short period of time. However, in this embodiment, the emitter and the reservoir are manufactured with a carbide of tungsten to suppress reactions thereof with the liquid of silicon, which leads to a long operation period not less than 500 hours in an accumulated total.

Actually, there has been fabricated wirings of tungsten by the Si-FIB so as to debug the silicon device. When compared with the conventional Ga-FIB, the accumulation efficiency of tungsten is substantially the same in this embodiment. Furthermore, as for the life of the device modified by the Si-FIB, the modified device continues normal operations more than three years after its modification. This indicates that the life of the modified device is at least about three times that of the device modified by the conventional Ga-FIB. In short, the FIB species does not function as the dopant and hence the device is free of the electric contamination.

Thanks to the apparatus of the embodiment, the machining work can be achieved without heavy metal contamination, and the FIB species does not act as a dopant. Consequently, the device modification which has been carried out in a place outside the production line can be conducted in the production line. This leads to minimize the period of time necessitated for the completion of device development and increases the life of the modified device.

Although the description has been given of modification of a device undergone a patterning in a process near the end of production line, the operation of the embodiment is similarly applicable to a silicon wafer.

Furthermore, as for the Si-LMIS, substantially the same advantageous effect is obtained when silicon carbide or silicon nitride are adopted to fabricate the emitter and the reservoir.

Description has been given of a focused ion beam apparatus using an ion source which does not contain as ion species any materials contaminating the sample as well as of a facility employing the focused ion beam apparatus. However, it is to be appreciated that the facility using the beam apparatus is not restricted by the embodiment.

As such an example, description will be given of a method of examining and modifying a semiconductor device by a focused ion beam apparatus having an ion source free of contamination of the semiconductor as described in conjunction with the first to fifth embodiments.

FIG. 35 schematically shows a method of investigating and correcting a wafer at an intermediate point of a semiconductor production line. Specifically, a cross section to be checked in a sample wafer is produced by an FIB machining apparatus free of contamination. The cross section is observed and investigated by a scanning electron microscope (SEM). If the result is acceptable, the wafer is returned to the subsequent process such that the obtained product is subjected to a probe check. When the cross section check results in rejection, the wafer is discarded. According to this method, of many chips being manufactured on the wafer, only one chip is lost according to the examination. Namely, the other chips can be subjected to the subsequent processes. Moreover, since the wafer is discarded at the moment when the cross section check results in not good, the subsequent process steps and materials, which are necessary if the chip is normal, can be saved.

Figure 36:
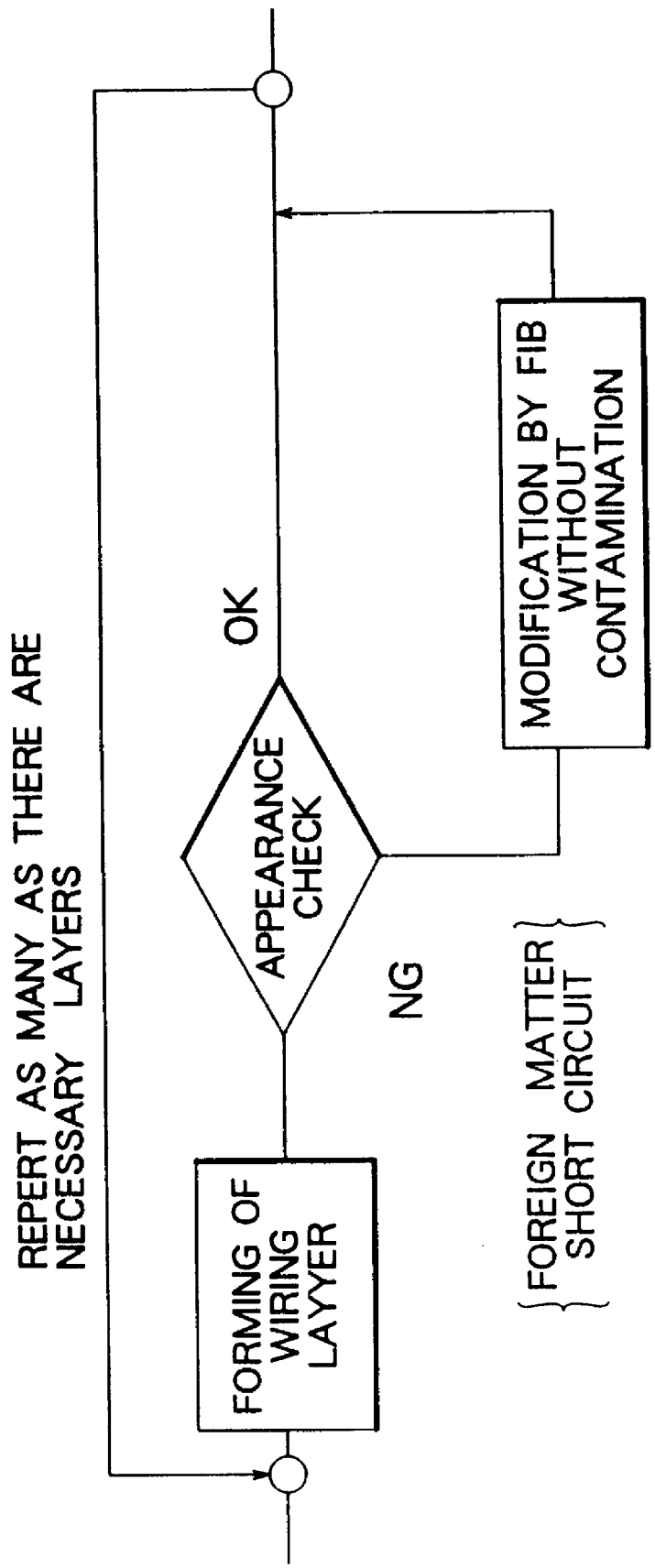
FIG. 36 is a schematic diagram for explaining a defect modification method in a wiring process by the FIB machining work without contamination according to the present invention.
Figure 37:
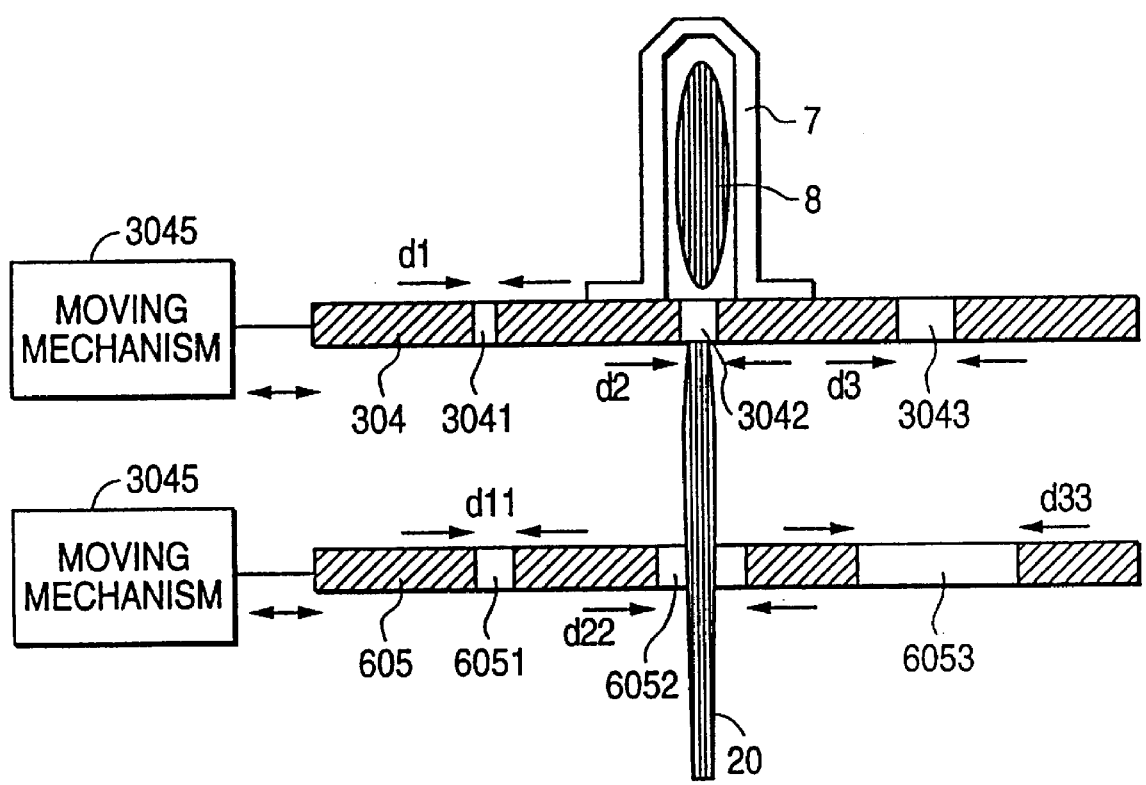
FIG. 37 is a schematic diagram showing an extraction electrode and an acceleration electrode having a plurality of openings respectively having different diameters which are moved by moving mechanisms.

FIG. 36 shows a flow of a process of fabricating wiring layers in a semiconductor having multiple wiring layers. Each time a wiring layer is created, an appearance check is conducted to detect foreign matters or defects of short circuits. If such an undesirable item is detected, a machining work by the contamination-free FIB will be conducted to modify the pertinent portion of the layer so as to return the corrected piece to the subsequent wiring process. The operation above is repeatedly accomplished as many times as there are wiring layers. Thanks to the examination above, as already sown in FIGS. 3 and 4, even when the area as well as the number of wiring layers are increased in a chip, a high chip yield can be guaranteed.

The following advantages are obtained according to the above processing apparatus employing a focused ion beam from such an ion source of the present invention as a liquid metal ion source in which germanium or silicon or an alloy thereof is used to produce ions or a focused plasma ion source, a field ionization gas ion source, or an EHD ion source which uses a noble gas species, particularly, neon, crypton, argon, xenon, or nitrogen to produce ions.

☐ The ion beam can be irradiated onto a sample of a silicon wafer, a silicon device, or the like with neither causing contamination of heavy metals due to ion beam species nor contamination of a sample containing alkali substances by a dopant or the like.

☐ In the primary ion beam irradiation system of the apparatus adopting the focused ion beam, the parts to be subjected to a direct irradiation of the ion beam are particularly formed with silicon or germanium in the form of an elementary material or a carbide or nitride thereof, thereby remarkably minimizing occurrence of the secondary contamination in the ion beam production.

☐ To enable such inline operations in the silicon semiconductor process as a fine machining work of a silicon wafer or device and sample checks such as a composition analysis of a local area thereof, there are provided a wafer examiner system, a secondary ion mass spectrometer, a wiring modifying facility, and an apparatus to prepare a sample for a transparent electron microscope.

☐ Histories of a silicon wafer or device itself as well as those related to production processes thereof can be examined in the silicon semiconductor process line. Consequently, modifications of failed positions and alteration of the conditions of production processes can be immediately carried out, thereby considerably reducing the turnaround time between a detection of a failure and a restoration thereof.

The first to fifth embodiments have been described only as examples in accordance with the present invention. The primary purpose of the present invention is to provide a focused ion beam apparatus suppressing contamination of a sample by the primary ion beam species and an apparatus for and a method of machining, examining, and/or modifying a sample in which there is adopted the focused ion beam apparatus. It is to be appreciated that the number and the arrangement of optical parts of focusing lens, deflectors, etc. can be modified and changed in consideration of the beam focusing degree, the increase in the sample current, and the like.

Furthermore, the combination between the kind of the ion source and the primary ion beam irradiation system is not limited by those described in conjunction with the embodiments. Namely, any other combination is applicable only if there are developed a satisfactory machining efficiency and a desired analysis sensibility.

In the embodiments, a silicon LSI element has been described as a sample. However, the present invention is not restricted by the embodiments and is applicable to other electronic circuit devices and modules.

That is, the above embodiments have been described only to clarify the technological contents of the present invention.

EMBODIMENT 6

Figure 41:
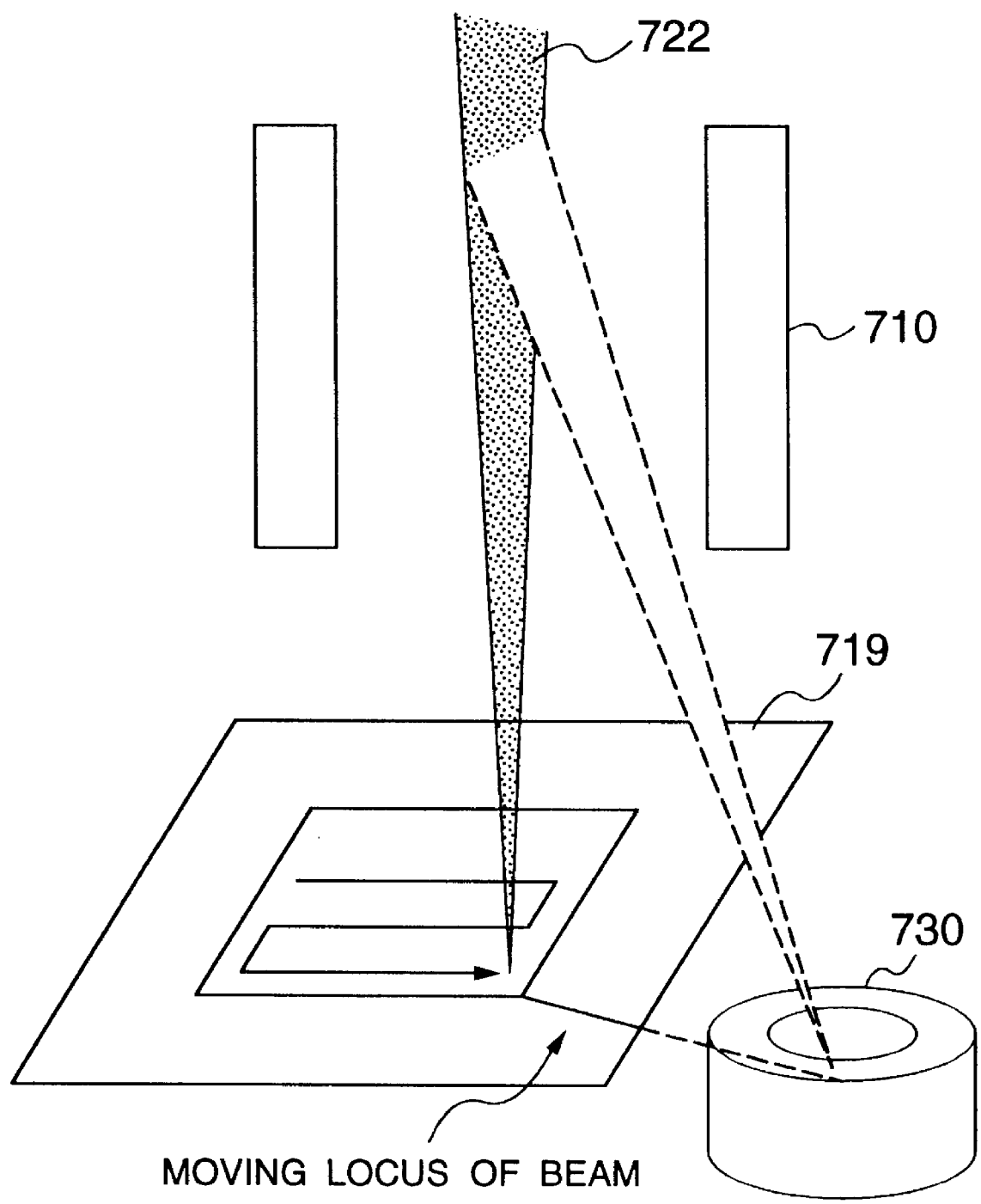
FIG. 41 is a diagram illustrating a moving locus of the blanked beam in the focused ion beam machining work using the conventional liquid metal ion source.

In conjunction of the sixth embodiment of the present invention, a focused ion beam machining apparatus using ion beam current control means of the present invention will be described with reference to FIGS. 38 and 41.

Figure 38:
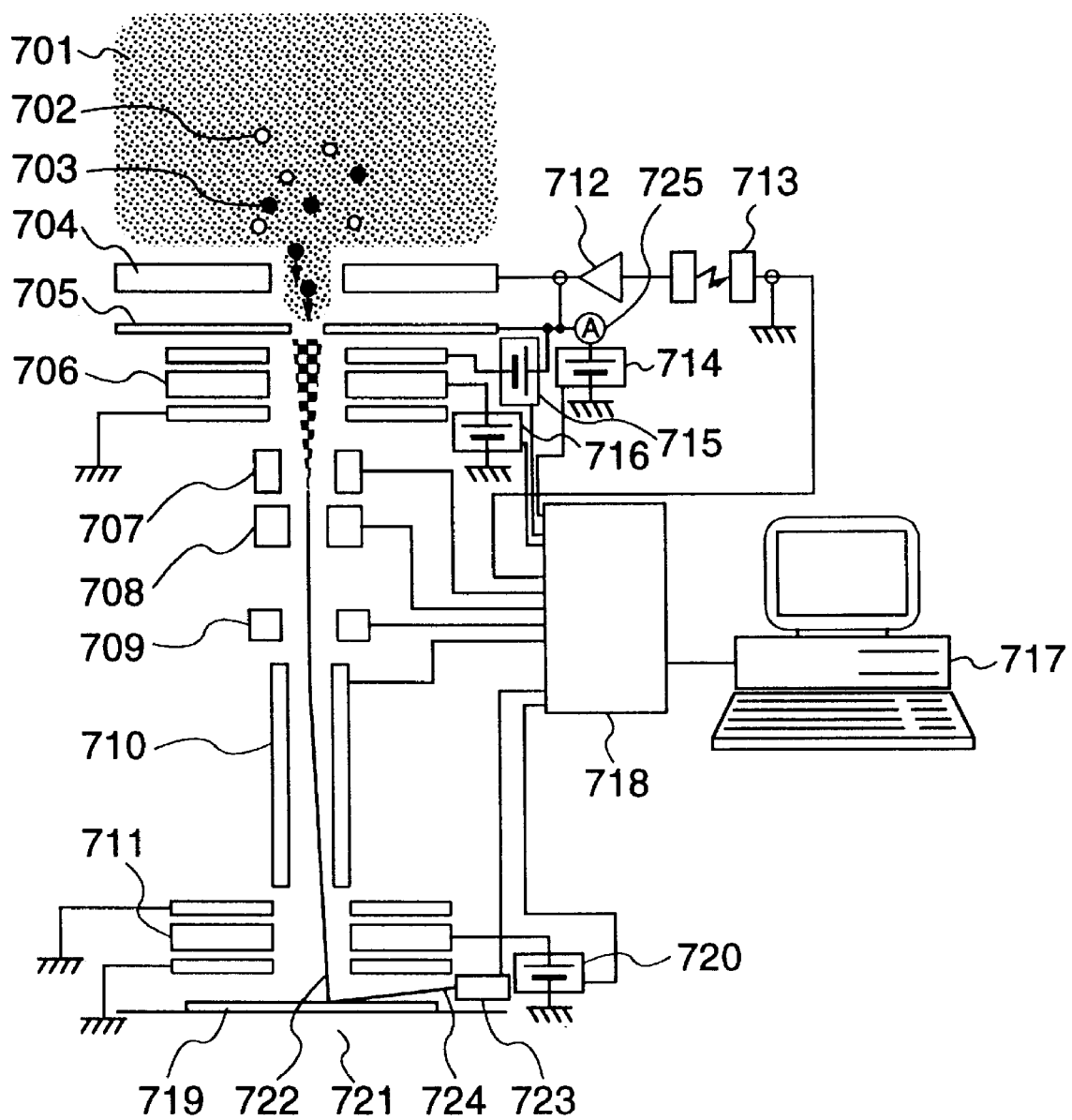
FIG. 38 is a diagram typically showing a method of controlling an ion beam current in a focused ion beam processing apparatus using ion beam current control means in the sixth embodiment of the present invention.
Figure 39:
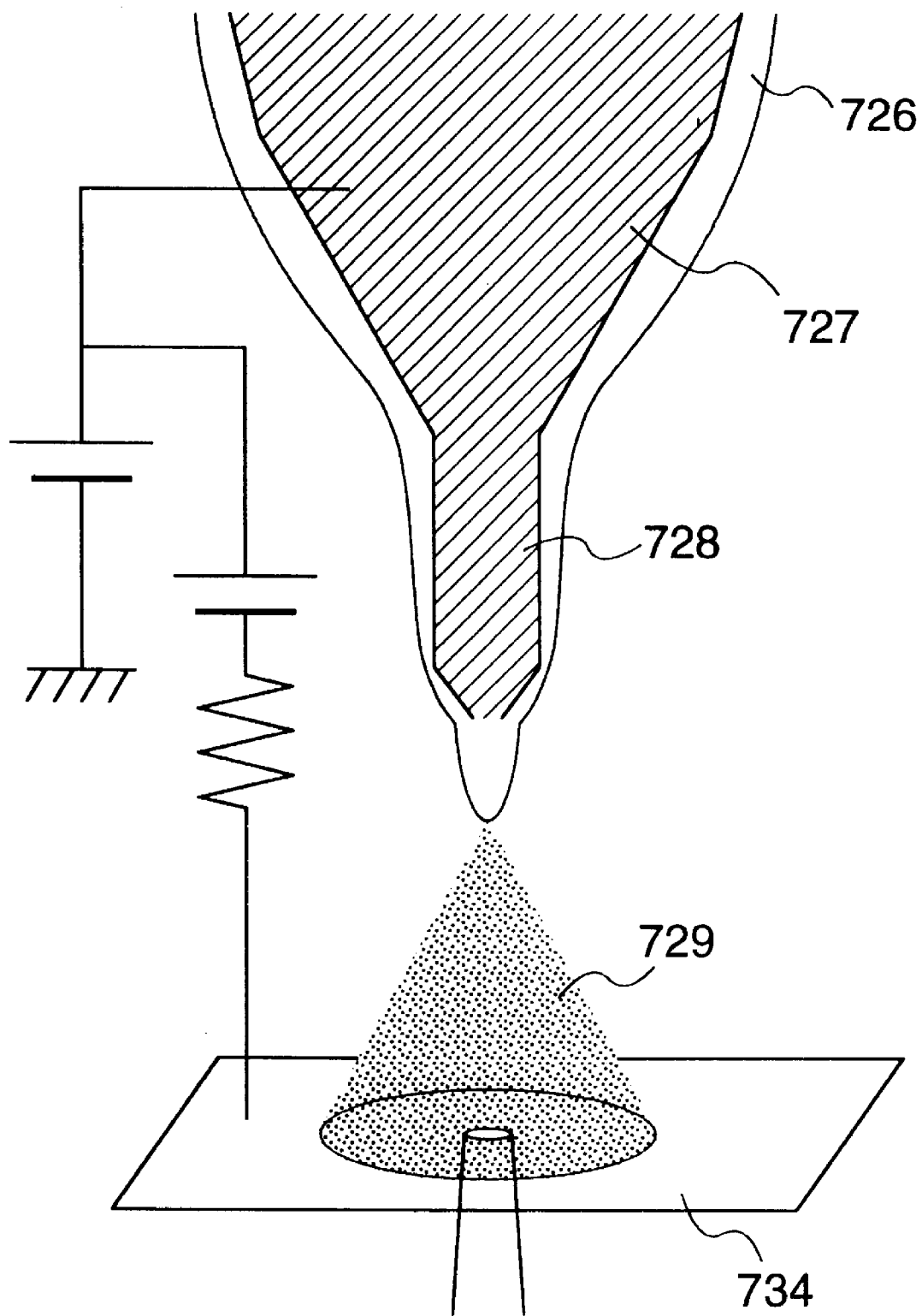
FIG. 39 is a diagram typically showing a conventional liquid metal ion source.
Figure 40:
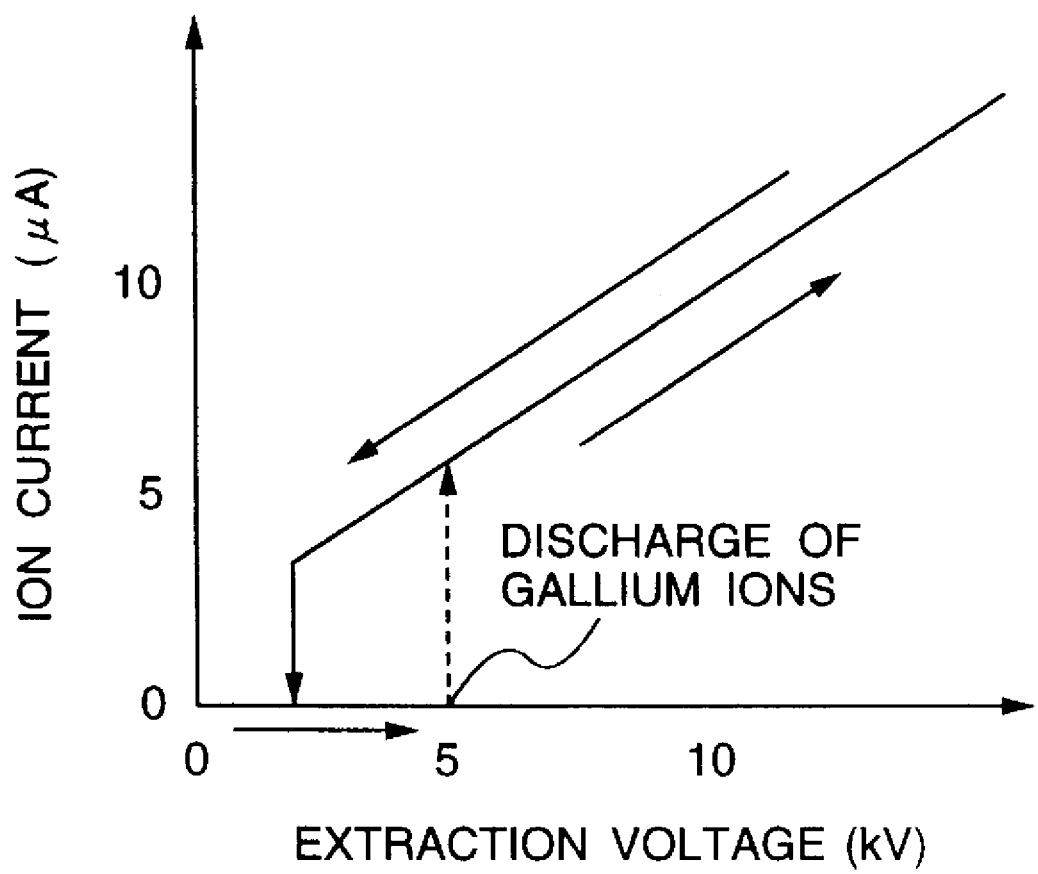
FIG. 40 is a graph showing a relationship between an extraction voltage and an ion current for the conventional liquid metal ion source.

FIG. 38 typically shows a method of controlling an ion beam current in a focused ion beam machining apparatus using a plasma ion source. In this figure, reference numeral 701 indicates a plasma; 702 is electrons; 703 is ions; 704 is a reference electrode; and 705 is an ion extraction electrode. With respect to an ion optical system, reference numeral 706 indicates a focus lens; 707 is an aligner/stigmator; 708 is a blanker; 709 is a Faraday cup; 710 is a deflector; and 711 is an objective lens. Reference numeral 719 indicates a workpiece, and 721 is a stage. With respect to power supplies and a controller of the ion optical system, reference numeral 714 indicates an acceleration electrode; 715 is a first focus lens power supply; 716 is a second focus lens power supply; 718 is a controller for controlling and measuring the aligner/stigmator, blanker, Faraday cup, and deflector; 720 is an objective lens power supply; and 717 is a beam control computer. With respect to control of an ion beam current, reference numeral 712 indicates an amplifier, and 713 is an isolation circuit.

First, referring to FIG. 38, description will be given of operation of the ion beam current control means of the present invention. An inert or reactive gas is enclosed at a specified pressure in an evacuated vessel made of an insulator or it is introduced into the vessel by means of a vacuum pump until the specified pressure. The gas is converted into the plasma 710 by the external power supply. Gas molecules in the plasma 701 are ionized into the electrons 702 and the ions 703. Here, the beam control computer 717 operates the acceleration electrode 714, first focus lens power supply 715, second focus lens power supply 716, controller 718, and objective lens power supply 720 to extract ions from the plasma 701 through apertures opening both in the reference electrode 704 and the ion extraction electrode 705. The ions thus extracted pass through the focus lens 706, aligner/stigmator 707, blanker 708, Faraday cup 709 and deflector 710, and are focused as an ion beam 722 on the surface of the workpiece 719.

After being focused on the surface of the workpiece 719, the ion beam 722 is blanked by the blanker 708 to a stand-by position, and the stage 721 is moved to such a position as to allow the focused ion beam 722 to be irradiated at a target portion to be machined on the surface of the workpiece 719. In order to obtain more precise coordinates of the target portion, secondary charged particles 724 emitted from the surface of the workpiece 719 by scanning of the focused ion beam 722 on the surface of the workpiece 719 by means of the deflector 710 are sensed by a secondary charged particle sensor 723, to thus observe a secondary charge particle image on the surface of the workpiece 719.

The operator determines the coordinates of the target portion to be machined through the observation of the secondary charged particle image, and allows the focused ion beam 722 to scan on the target portion at a specified scanning speed for a scanning time corresponding to an amount to be machined.

After the scanning, in accordance with the conventional method, the orbit of the focused ion beam 722 is altered by the blanker 708 to a position where the ion beam 722 does not bombard the workpiece 719, thus completing the machining work.

Figure 42:
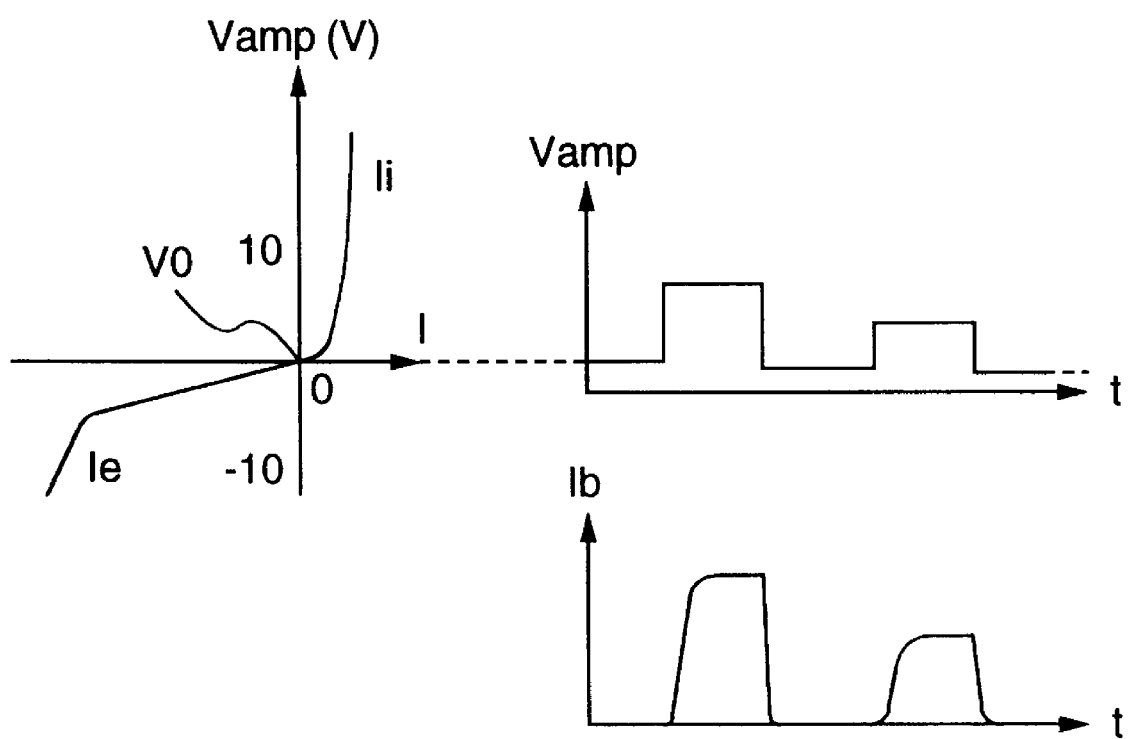
FIG. 42 is a diagram illustrating the method of controlling an ion beam current according to the present invention.

On the other hand, according to the present invention, the altering operation of the orbit of the ion beam by the blanker 708 is not required after the scanning because the ion beam current can be controlled on the basis of the principal shown in FIG. 42. Concretely, according to the present invention, the focused ion beam current is set at zero after the scanning, thus completing the machining work. This enables any unnecessary working mark caused by blanking not to remain on the surface of the workpiece 710.

Referring now to FIGS. 38 and 42, description will be given of the control principal of an ion beam current. The plasma 701 shown in FIG. 38 has a potential of the total of a voltage Vex applied to the reference electrode 704 by the acceleration power supply 714 and an output voltage Vamp of the amplifier 712, that is, it has a potential of (Vex+Vamp). Besides, a current extracted from the plasma 701 is determined in accordance with an I-Vamp characteristic shown in FIG. 42. Namely, the extraction current becomes zero at Vamp=V0; in the case of Vamp<V0, the electrons 702 in the plasma 701 are extracted because the extraction electrode 705 has a potential higher than the plasma 701 does and consequently an electron beam current Ie flows; and in the case of Vamp>V0, the ions 703 in the plasma 701 are extracted because the ion extraction electrode 705 has a potential lower than the plasma 701 does and consequently an ion beam current Ii flows. A voltage required for altering the electron beam current into the ion beam current is in the order of 10–30 V, which is dependent on the plasma state. Accordingly, although a voltage in the order of kV is not required for control of the ion beam current in the conventional method, only a voltage being as small as 10 to 30 V is required for control of the ion beam current in the present invention. This is effective to prevent the beam from being made dim.

EMBODIMENT 7

The ion beam current control means of the present invention can change an ion beam current value during focused ion beam machining work, thereby enabling machining works shown in FIGS. 44 to 48. Such machining works will be described below.

Figure 43:
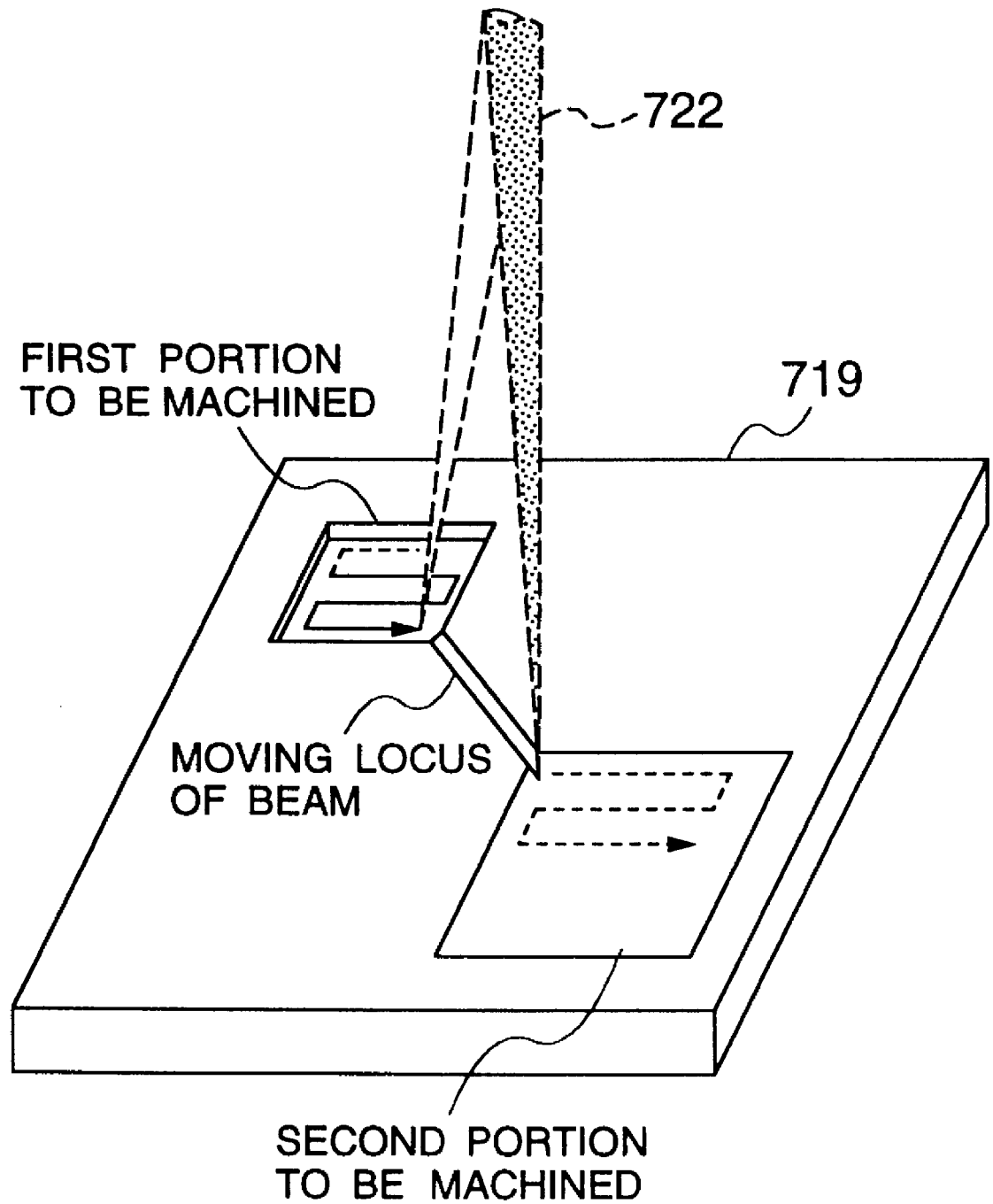
FIG. 43 is a diagram illustrating a method of continuously machining a plurality of portions in the focused ion beam machining work using the conventional liquid metal ion source.
Figure 44:
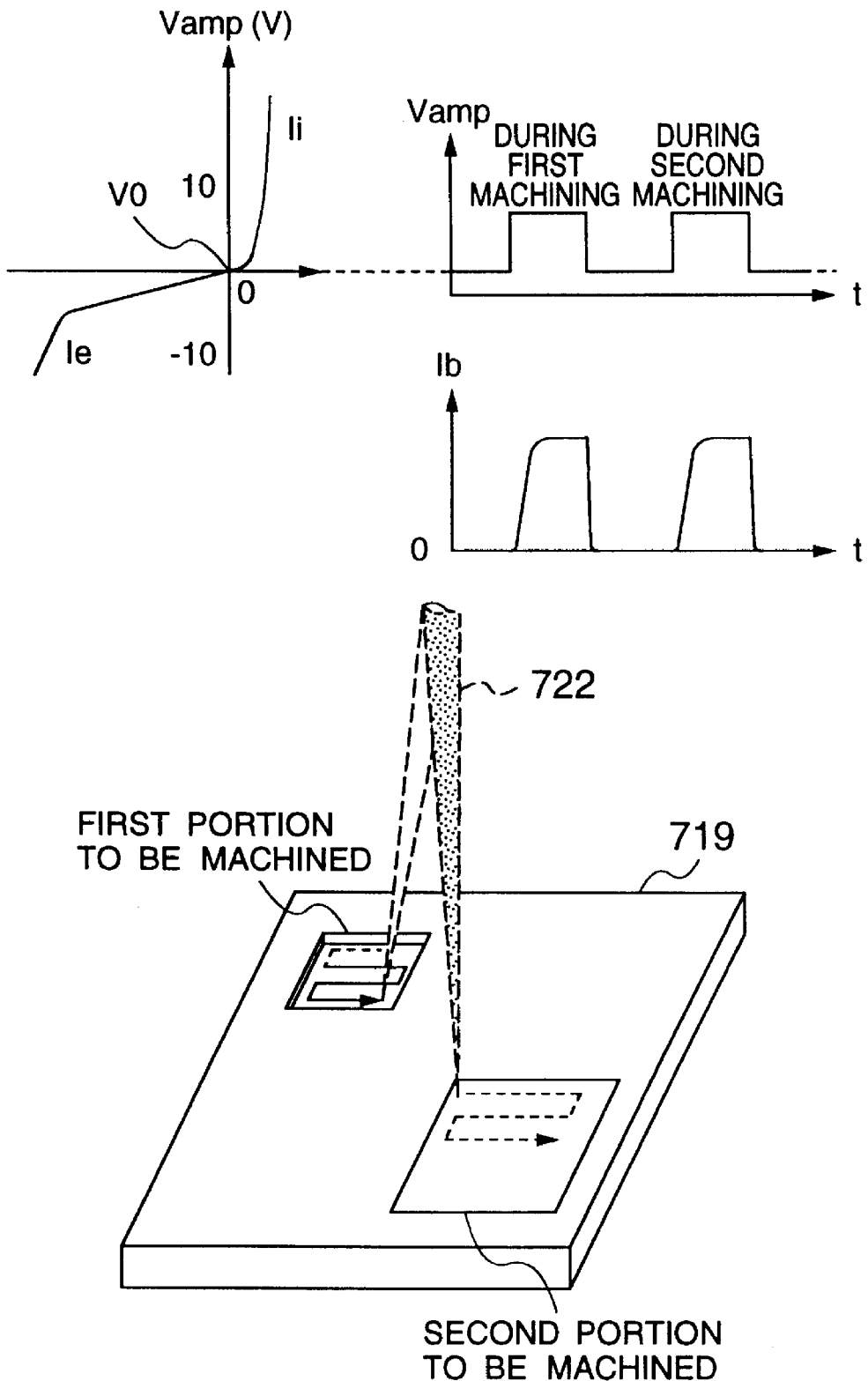
FIG. 44 is a diagram illustrating a method of continuously machining a plurality of portions in the focused ion beam machining work using the ion beam current control means of the present invention.

First, referring to FIGS. 43 and 44, description will be given of a method of continuously machining a plurality of portions of the workpiece 719. FIG. 43 shows a conventional method of continuously machining a plurality of portions of the workpiece 719 by a focused ion beam without the ion beam current control means of the present invention. In the case where the two portions shown in the figure are machined by the conventional method, the focused ion beam, after machining the first portion, is moved by blanking to the second portion for machining, as a result of which the moving locus of the focused ion beam remains as a working mark on the surface of the workpiece 719. On the other hand, in the case where the two portions of the workpiece 719 are machined using the ion beam current control means of the present invention (see FIG. 44), the ion beam, after machining the first portion, is moved by blanking to the second portion for machining with the focused ion beam current set at zero by control of the output voltage Vamp of the amplifier 712, as a result of which the moving locus of the focused ion beam does not remain on the surface of the workpiece 719. In this way, the use of the ion beam current control means of the present invention enable a plurality of portions of the workpiece 719 to be continuously machined without occurrence of any unnecessary moving locus of the ion beam on the surface of the workpiece 719.

Figure 45:
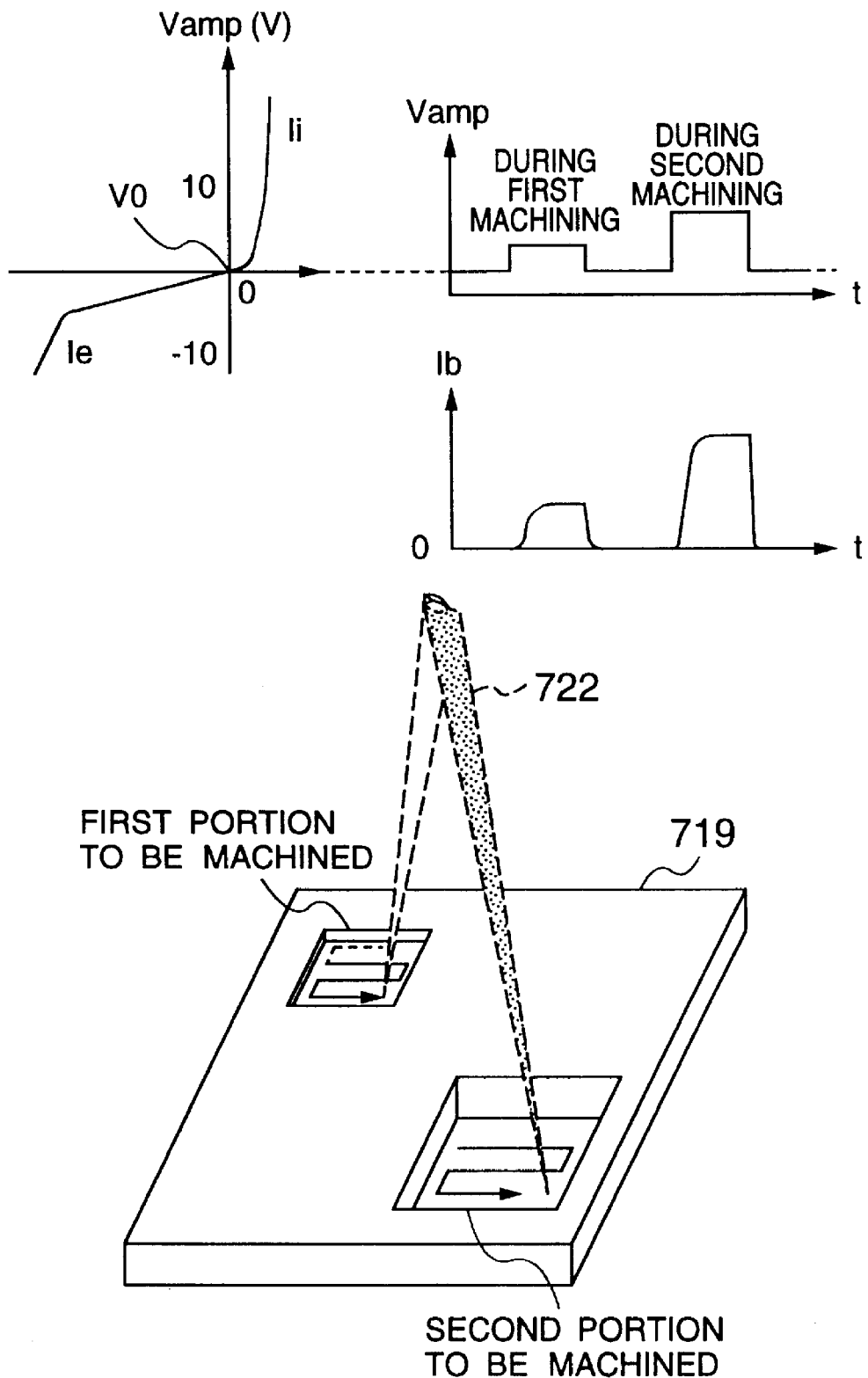
FIG. 45 is a diagram illustrating a method of machining a plurality of portions different in depth in the focused ion beam machining work using the ion beam current control means of the present invention.

The fine control of an ion beam current using the ion beam current control means of the present invention makes it possible to machine two portions of the workpiece 719 up to arbitrarily set depths respectively by making different an ion beam current value at the first portion from that at the second portion (see FIG. 45).

Figure 46:
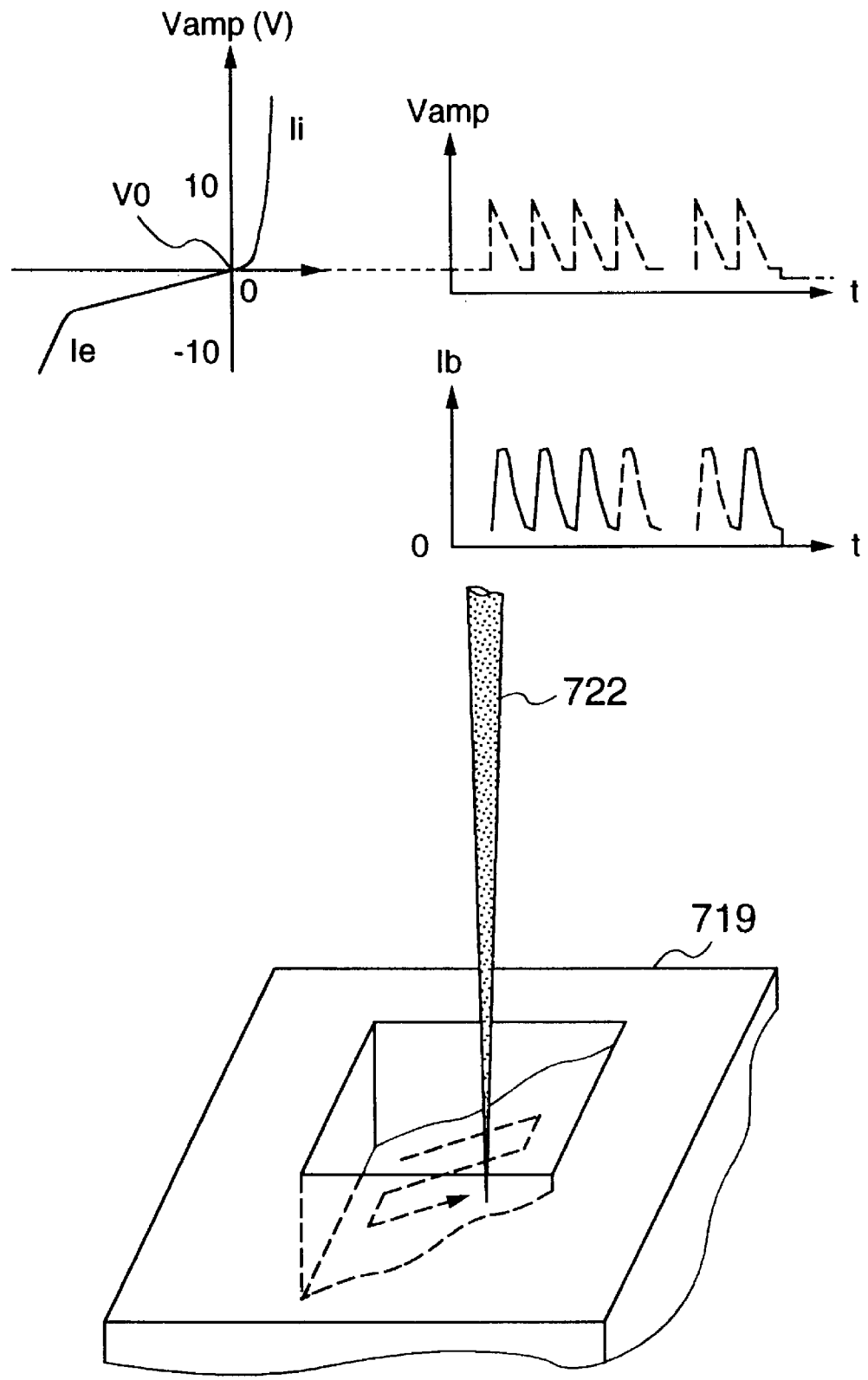
FIG. 46 is a diagram illustrating a method of machining a workpiece in three-dimensions in the focused ion beam machining work using the ion beam current control means of the present invention.
Figure 47:
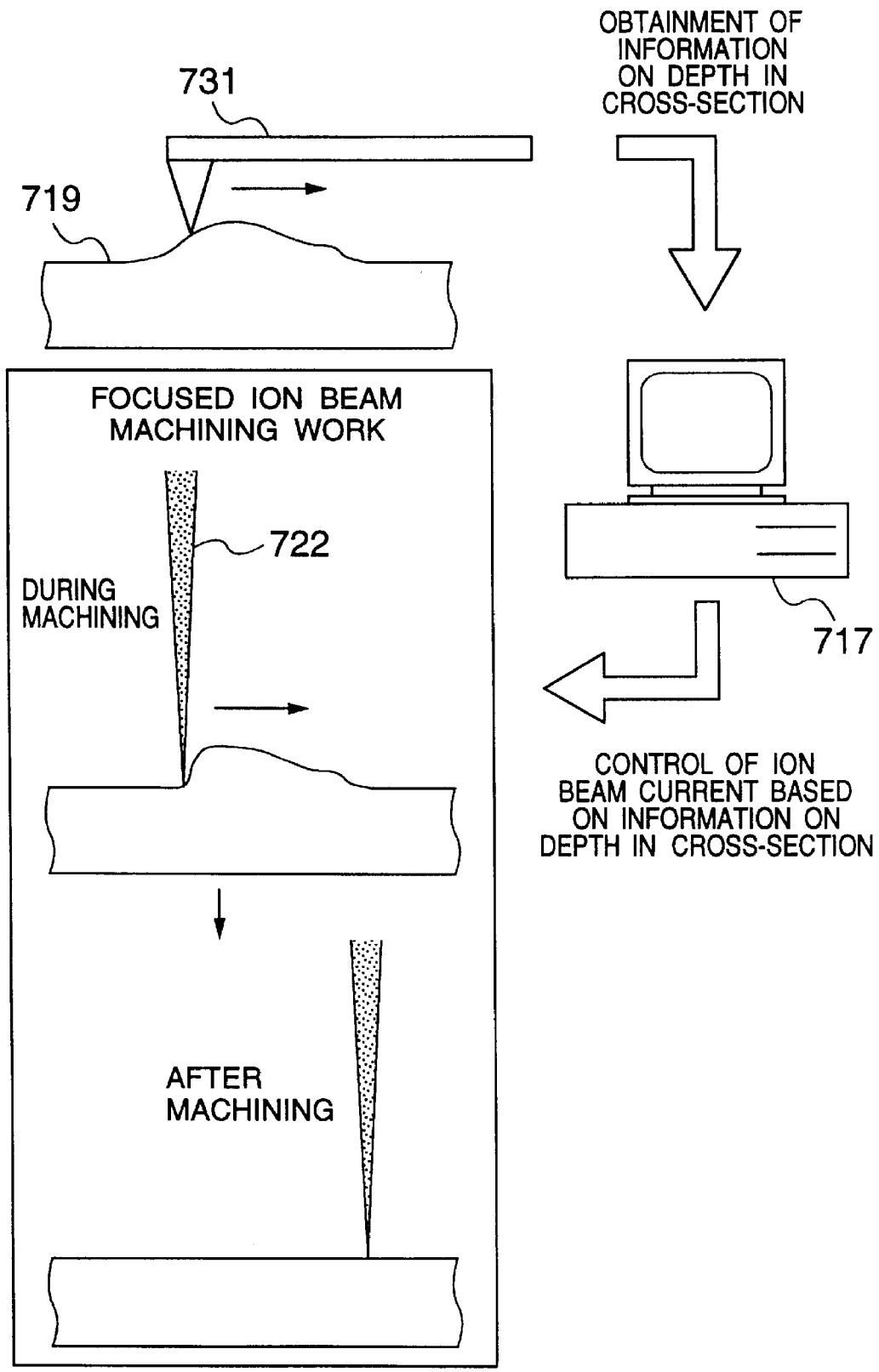
FIG. 47 is a diagram showing a method of planarizing a work plane having an irregular cross-section in the focused ion beam machining work using the ion beam current control means of the present invention.

The further finer control of an ion beam current using the ion beam current control means of the present invention makes it possible to machine a region of the workpiece in three-dimensions to have different depths by continuously changing the ion beam current value in the region (see FIG. 46). Such a technique also enables a work surface of the workpiece 719 having a cross-section shown in FIG. 47 to be easily planarized by controlling the ion beam current on the basis of information on the depths of the cross-section of the workpiece.

The ion beam current control means also enables copy-machining. Concretely, as shown in FIG. 48, data of secondary charged particle image for a first region of the workpiece 710, which are obtained by scanning of the focused ion beam 722 on the first region, are stored in the beam control computer 717, and a second region different from the first region is machined in the same plane shape as that of the first region by the same scanning signal of the ion beam through control of the ion beam current in accordance with the Vamp signal based on the stored data. In this case, by enlarging or reducing the scanning region, it is possible to form a plane having a shape enlarged or reduced from the original shape.

EMBODIMENT 8

The unstable supply of gallium from a reservoir to the apex of an ion emitter as in a liquid metal ion source directly exerts adverse effect on processing accuracy of a focused ion beam. Such a problem can be easily solved by the use of the ion beam current control means of the present invention. For example, a current meter 725 shown in FIG. 38 receives ions from the plasma 701 and monitors the amount of the ions as a current, and the beam control computer 717 controls the output voltage Vamp of the amplifier 712 so as to make constant the current value monitored by the current meter 725, to usually obtain a stable ion beam current.

Figure 49:
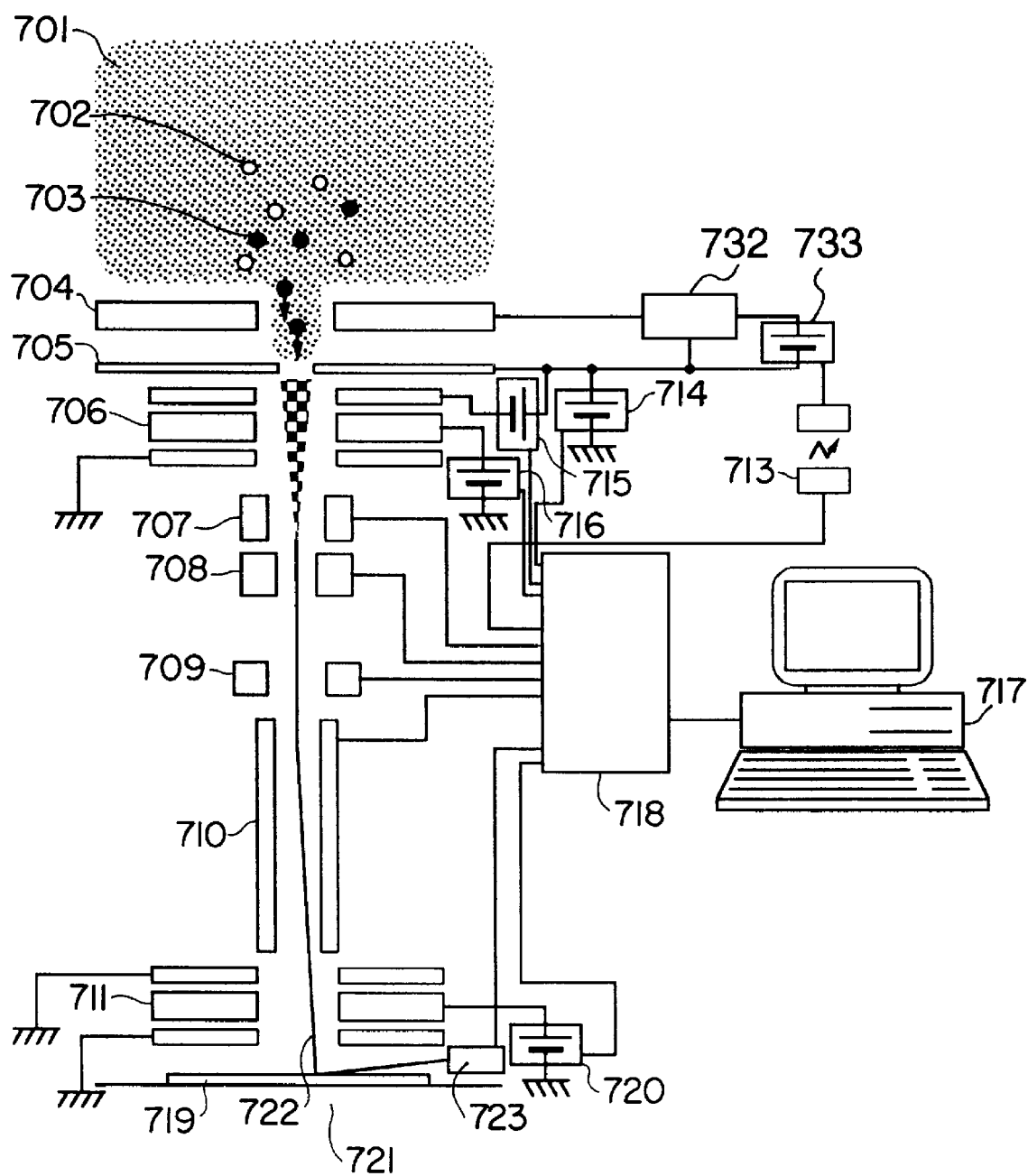
FIG. 49 is a diagram showing a feed-back stabilization circuit for stabilizing an ion beam current using the ion beam current control means of the present invention.

In addition, the stable ion beam current can be obtained without use of the beam control computer, by provision of such a simple feed-back stabilization circuit 732 as shown in FIG. 49.

According to the present invention having these configurations, the above-described objects of the present invention can be achieved. Namely, according to the present invention, there is provided a processing method using a plasma ion source for generating a focused ion beam, characterized by covering, with an insulator, an inner wall of a plasma holding vessel excluding a reference electrode for applying a voltage to a plasma and an ion extraction electrode for extracting ions from the plasma, and employing means of continuously controlling an ion beam current by changing an ion extraction voltage applied between the reference electrode and the ion extraction electrode. This makes it possible to prevent the ion beam from being made dim even when the ion beam current value is changed.

According to the present invention, since an ion beam current can be changed during scanning of a focused ion beam, a plurality of portions of a workpiece can be continuously machined without occurrence of any unnecessary beam locus, and also a certain region can be machined in three-dimensions to have different depths by continuously changing the ion beam current value in the region.

The present invention also enables stabilization of a focused ion beam current by monitoring of the ion beam current value or by provision of a feedback stabilization circuit.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A focused ion beam processing method of processing a sample using a focused ion beam, comprising the steps of:

generating a plasma by resonating a microwave in a magnetic field in a plasma ion source; and extracting an ion beam from the generated plasma through an ion extraction electrode into a sample chamber in which a sample is disposed;

wherein the output and stoppage of the ion beam extracted from the generated plasma into the sample chamber is conducted by control of a voltage applied between a reference electrode disposed in a discharge space of the generated plasma and the ion extraction electrode.

2. A focused ion beam processing method according to claim 1, wherein a current value of the ion beam to be extracted from the plasma ion source into the sample chamber is changed by control of a voltage applied between the reference electrode and the ion extraction electrode.

3. A focused ion beam processing method according to claim 2, wherein a voltage applied to the reference electrode and the ion extraction electrode is changed by feed-back control.

4. A focused ion beam processing method applied to fine machining using a focused ion beam, comprising the steps of:

previously storing machining data;

generating a plasma by resonating a microwave in a magnetic field in a plasma ion source;

extracting an ion beam from the generated plasma into a sample chamber in which a sample is disposed, the current value of the ion beam being controlled on the basis of the previously stored data; and irradiating the controlled ion beam to the sample, thereby processing the sample.

5. A focused ion beam processing method according to claim 4, wherein the previously stored data are obtained from a secondary charged particle image at a location different from a portion to be processed.

6. A focused ion beam processing method according to claim 4, wherein the previously stored data are obtained from a secondary charged particle image at a location different from a portion to be processed, and the sample is processed by controlling the current value of the ion beam on the basis of the data of the secondary charged particle image, thereby copying a surface shape of the location onto the sample.

7. A focused ion beam processing method of machining a sample using a focused ion beam, comprising the steps of:

generating a plasma by resonating a microwave in a magnetic field in a plasma ion source;

extracting an ion beam from the generated plasma into a sample chamber in which a sample is disposed; and irradiating the extracted ion beam to the sample, thereby conducting a desired processing work for the sample;

wherein the extraction and stoppage of the ion beam from the plasma are conducted by control of a current value of the extracted ion beam.

8. A focused ion beam processing method according to claim 7, wherein the control of the current value of the extracted ion beam is conducted by control of a voltage applied between a reference electrode disposed in a discharge space of the plasma generated in the plasma ion source and an ion extraction electrode for extracting ions from the plasma ion source.

9. A focused ion beam processing method of processing a sample using a focused ion beam, comprising the steps of:

generating a plasma by resonating a microwave in a magnetic field in a plasma ion source;

extracting an ion beam from the generated plasma into a sample chamber in which a sample is disposed, a current value of the ion beam being controlled; and irradiating the extracted ion beam controlled in its current value to the sample, thereby conducting a desired processing work for the sample.

10. A focused ion beam processing method according to claim 9, wherein the control of the current value of the extracted ion beam is conducted by control of a voltage applied between a reference electrode disposed in a discharge space of the plasma generated in the plasma ion source and an ion extraction electrode for extracting ions from the plasma ion source.

11. A focused ion beam processing apparatus comprising:

sample chamber means for installing therein a sample to be processed;

a plasma ion source for generating therein microwave discharge plasma by resonating a microwave in a magnetic field;

a reference electrode disposed in the plasma ion source;

an ion extraction electrode for extracting an ion beam from the microwave discharge plasma generated in the plasma ion source into the sample chamber means; and voltage applying means for applying a voltage between the reference electrode and the ion extraction electrode.

12. A focused ion beam processing apparatus according to claim 11, wherein the voltage applying means includes a feed-back control unit for feed-back controlling a voltage applied between the reference electrode and the ion extraction electrode.

13. A focused ion beam processing apparatus according to claim 11, wherein the plasma ion source is covered with an insulator at a portion being in contact with the plasma excluding the reference electrode and the ion extraction electrode.

14. A focused ion beam processing apparatus according to claim 11, further comprising storing means, wherein a voltage applied between the reference electrode and the ion extraction electrode is controlled by the voltage applying means on the basis of data stored in the storing means.

15. A focused ion beam processing apparatus comprising:

sample chamber means for installing therein a sample to be processed;

a plasma ion source for generating therein microwave discharge plasma by resonating a microwave in a magnetic field;

ion beam extracting means for extracting an ion beam from the microwave discharge plasma generated in the plasma ion source into the sample chamber means;

ion beam irradiating means for irradiating the extracted ion beam to a desired portion on the sample; and current value control means for controlling a current value of the ion beam extracted by the ion beam extracting means.

16. A focused ion beam processing apparatus according to claim 15, wherein the current value control means controls a current value of the ion beam extracted by the ion beam extracting means, thereby turning the ion beam extracted from the plasma on or off.

* * * * *